US008681056B2

(12) United States Patent
Hobson et al.

(10) Patent No.: US 8,681,056 B2
(45) Date of Patent: *Mar. 25, 2014

(54) HANDHELD ELECTRONIC DEVICE WITH CABLE GROUNDING

(75) Inventors: Philip M. Hobson, Menlo Park, CA (US); Erik L. Wang, Redwood City, CA (US); Kenneth A. Jenks, Cupertino, CA (US); Robert J. Hill, Salinas, CA (US); Robert W. Schlub, Campbell, CA (US); Richard Hung Minh Dinh, San Jose, CA (US); Tang Yew Tan, San Francisco, CA (US); Adam D. Mittleman, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 316 days.

This patent is subject to a terminal disclaimer.

(21) Appl. No.: 13/021,689

(22) Filed: Feb. 4, 2011

(65) Prior Publication Data
US 2011/0133998 A1  Jun. 9, 2011

Related U.S. Application Data

(63) Continuation of application No. 11/821,329, filed on Jun. 21, 2007, now Pat. No. 7,889,139.

(51) Int. Cl.
*H01Q 1/24* (2006.01)
*H01Q 1/44* (2006.01)
*H01Q 1/46* (2006.01)
*H01Q 1/48* (2006.01)

(52) U.S. Cl.
USPC ............ 343/702; 343/846; 343/905; 343/906

(58) Field of Classification Search
USPC .................. 343/741, 767, 846, 905, 906, 702
See application file for complete search history.

(56) References Cited

U.S. PATENT DOCUMENTS

| 3,453,377 | A | * | 7/1969 | Gillespie ...................... 174/75 C |
| 3,546,365 | A | * | 12/1970 | Collier ............................. 174/78 |
| 4,721,945 | A | * | 1/1988 | Maki et al. ..................... 340/515 |
| 4,894,663 | A | | 1/1990 | Urbish |
| 4,973,259 | A | | 11/1990 | Sachs |
| 4,980,694 | A | | 12/1990 | Hines |
| 5,021,010 | A | | 6/1991 | Wright |

(Continued)

OTHER PUBLICATIONS

Hobson et al. U.S. Appl. No. 60/883,537, filed Jan. 5, 2007.

(Continued)

*Primary Examiner* — Michael C Wimer
(74) *Attorney, Agent, or Firm* — Treyz Law Group; G. Victor Treyz; Jennifer Luh

(57) ABSTRACT

A handheld electronic device may be provided that contains a conductive housing and other conductive elements. The conductive elements may form an antenna ground plane. One or more antennas for the handheld electronic device may be formed from the ground plane and one or more associated antenna resonating elements. Transceiver circuitry may be connected to the resonating elements by transmission lines such as coaxial cables. Ferrules may be crimped to the coaxial cables. A bracket with extending members may be crimped over the ferrules to ground the coaxial cables to the housing and other conductive elements in the ground plane. The ground plane may contain an antenna slot. A dock connector and flex circuit may overlap the slot in a way that does not affect the resonant frequency of the slot. Electrical components may be isolated from the antenna using isolation elements such as inductors and resistors.

20 Claims, 38 Drawing Sheets

(56) References Cited

U.S. PATENT DOCUMENTS

| | | | |
|---|---|---|---|
| 5,041,838 A | 8/1991 | Liimatainen | |
| 5,048,118 A | 9/1991 | Brooks | |
| 5,051,543 A * | 9/1991 | McGuire | 174/78 |
| 5,061,827 A * | 10/1991 | Grabbe | 174/75 C |
| 5,217,392 A | 6/1993 | Hosler | |
| 5,393,244 A | 2/1995 | Szegda | |
| 5,473,117 A * | 12/1995 | Morgan et al. | 174/78 |
| 5,561,437 A | 10/1996 | Phillips | |
| 5,754,143 A | 5/1998 | Warnagiris | |
| 5,798,984 A | 8/1998 | Koch | |
| 6,011,699 A | 1/2000 | Murray | |
| 6,097,345 A | 8/2000 | Walton | |
| 6,190,202 B1 | 2/2001 | Lai | |
| 6,285,327 B1 | 9/2001 | See | |
| 6,337,662 B1 | 1/2002 | Cassel | |
| 6,469,668 B1 * | 10/2002 | Jones et al. | 343/702 |
| 6,542,128 B1 * | 4/2003 | Johnson et al. | 343/742 |
| 6,545,642 B1 * | 4/2003 | Doub et al. | 343/702 |
| 6,622,031 B1 | 9/2003 | McCleary | |
| 6,670,923 B1 | 12/2003 | Kadambi | |
| 6,741,214 B1 | 5/2004 | Kadambi | |
| 6,747,601 B2 | 6/2004 | Boyle | |
| 6,809,265 B1 | 10/2004 | Gladd | |
| 6,856,294 B2 | 2/2005 | Kadambi | |
| 6,915,120 B2 | 7/2005 | Ichihara | |
| 6,968,508 B2 | 11/2005 | Lucaci | |
| 6,980,154 B2 | 12/2005 | Vance | |
| 7,027,838 B2 | 4/2006 | Zhou | |
| 7,116,267 B2 | 10/2006 | Schuster et al. | |
| 7,119,747 B2 | 10/2006 | Lin | |
| 7,153,161 B2 | 12/2006 | Huang | |
| 7,339,528 B2 | 3/2008 | Wang | |
| 7,400,302 B2 * | 7/2008 | Winter | 343/702 |
| 7,438,610 B2 * | 10/2008 | Machado et al. | 439/881 |
| 2004/0145521 A1 | 7/2004 | Hebron | |
| 2006/0055606 A1 | 3/2006 | Boyle | |
| 2006/0244663 A1 * | 11/2006 | Fleck et al. | 343/700 MS |
| 2008/0074329 A1 | 3/2008 | Caballero | |
| 2008/0166004 A1 | 7/2008 | Sanford | |

OTHER PUBLICATIONS

Schulb et al. U.S. Appl. No. 11/650,071, filed Jan. 4, 2007.

* cited by examiner

HANDHELD ELECTRONIC DEVICE WITH CABLE GROUNDING

This application is a continuation of patent application Ser. No. 11/821,329, filed Jun. 21, 2007, now U.S. Pat. No. 7,889,139 which is hereby incorporated by reference herein in its entirety.

BACKGROUND

This invention relates generally to wireless communications, and more particularly, to wireless communications circuitry for handheld electronic devices.

Handheld electronic devices are becoming increasingly popular. Examples of handheld devices include handheld computers, cellular telephones, media players, and hybrid devices that include the functionality of multiple devices of this type.

Due in part to their mobile nature, handheld electronic devices are often provided with wireless communications capabilities. Handheld electronic devices may use wireless communications to communicate with wireless base stations. For example, cellular telephones may communicate using cellular telephone bands at 850 MHz, 900 MHz, 1800 MHz, and 1900 MHz (e.g., the main Global System for Mobile Communications or GSM cellular telephone bands). Handheld electronic devices may also use other types of communications links. For example, handheld electronic devices may communicate using the WiFi® (IEEE 802.11) band at 2.4 GHz and the Bluetooth® band at 2.4 GHz. Communications are also possible in data service bands such as the 3G data communications band at 2170 MHz band (commonly referred to as UMTS or Universal Mobile Telecommunications System).

To satisfy consumer demand for small form factor wireless devices, manufacturers are continually striving to reduce the size of components that are used in these devices. For example, manufacturers have made attempts to miniaturize the antennas used in handheld electronic devices.

A typical antenna may be fabricated by patterning a metal layer on a circuit board substrate or may be formed from a sheet of thin metal using a foil stamping process. Many devices use planar inverted-F antennas (PIFAs). Planar inverted-F antennas are formed by locating a planar resonating element above a ground plane. These techniques can be used to produce antennas that fit within the tight confines of a compact handheld device. With conventional handheld electronic devices, however, design compromises are made to accommodate compact antennas. These design compromises may include, for example, compromises related to antenna height above the ground plane, antenna efficiency, and antenna bandwidth. Moreover, constraints are often placed on the amount of metal that can be used in a handheld device and on the location of metal parts. These constraints can adversely affect device operation and device appearance.

It would therefore be desirable to be able to provide improved handheld electronic devices and antennas for handheld electronic devices.

SUMMARY

In accordance with an embodiment of the present invention, a handheld electronic device with wireless communications circuitry is provided. The handheld electronic device may have cellular telephone, music player, or handheld computer functionality. The wireless communications circuitry may have one or more antennas. The antennas may be used to support wireless communications over data communications bands and cellular telephone communications bands.

The handheld electronic device may have a housing. The front face of the housing may have a display. The display may be a liquid crystal diode (LCD) display or other suitable display. A touch sensor may be integrated into the display to make the display touch sensitive.

A bezel may be used to attach the display to the housing. The bezel may surround the periphery of the front face of the housing and may hold the display against the housing.

The bezel and at least a portion of the housing may be formed from metal or other conductive materials. Electrical components, such as the display, printed circuit boards, integrated circuits, and a housing frame may be grounded together to form an antenna ground plane.

An antenna slot may be formed in the ground plane between the bezel and the conductive portion of the housing. The slot may have a rectangular shape or other suitable shapes. Components such as a dock connector and a flex circuit can be configured so that they overlap somewhat with the rectangular slot shape, thereby altering the inner perimeter of the slot. With one suitable arrangement, the dock connector and flex circuit are configured so that slot perimeter length increases due to the presence of the overlapping dock connector are balanced and substantially canceled by perimeter length decreases due to the overlapping flex circuit. The flex circuit may be used to route signals from the dock connector to processing circuitry on the handheld electronic device.

The handheld electronic device may have transceiver circuitry for handling wireless communications signals. With one illustrative arrangement, the handheld electronic device may have first and second radio-frequency transceivers and first and second corresponding antenna resonating elements. The first antenna resonating element may be used with the antenna ground plane to form a cellular telephone antenna. The second antenna resonating element may be used with the antenna ground plane to form a data band antenna (e.g., at 2.4 GHz). The antenna resonating elements may be located over the slot in the ground plane.

The antenna slot may have an associated resonant frequency peak. The perimeter of the slot may be adjusted so that the resonant frequency peak for the slot coincides with at least one communications band associated with the cellular telephone antenna.

Electrical components such as a menu button or other user interface control, a speaker module, and a microphone module, may be placed in an overlapping relationship with the antenna slot and one or more of the antenna resonating elements. To prevent interference between the antennas and these overlapping electrical components, the overlapping electrical components may be isolated using isolation elements. Inductors or resistors may be used for the isolation elements.

Radio-frequency signals may be routed between the transceiver circuits and the antennas using transmission lines such as coaxial cables. For example, in a handheld electronic device arrangement having two transceivers and two antennas, two coaxial cables may be used to route radio-frequency signals to and from the antennas. To ensure proper grounding of the coaxial cables and to prevent reflected signals from radiating out of the coaxial cables instead of the antennas, the coaxial cables may be electrically shorted to the conductive housing of the handheld electronic device and other portions of the antenna ground plane.

With one suitable arrangement, at least some segments of the coaxial cables have exposed outer ground connectors.

Conductive fasteners may be attached to the exposed ground connector portions of the coaxial cables. For example, metal ferrules may be crimped to the coaxial cables at the exposed ground conductor locations along their lengths, thereby electrically shorting the metal ferrules to the coaxial cables. In turn, the metal ferrules or other conductive fasteners may be connected to the conductive housing and other portions of the antenna ground plane in the handheld electronic device.

A J-clip or other suitable conductive member may be used to structurally and electrically connect the metal ferrules to a metal frame in the device housing and other portions of the antenna ground plane. The conductive member may have bendable extensions and a base that is welded to the frame. The extensions on the conductive member may be crimped over the ferrules during assembly. In the event that the handheld electronic device needs to be reworked or recycled, the extensions may be bent open to release the coaxial cables. Releasably fastening the coaxial cable ground conductors to the antenna ground in this way may therefore facilitate both rework and recycling, while ensuring good antenna performance by properly grounding the coaxial cables.

Further features of the invention, its nature and various advantages will be more apparent from the accompanying drawings and the following detailed description of the preferred embodiments.

DETAILED DESCRIPTION

The present invention relates generally to wireless communications, and more particularly, to wireless electronic devices and antennas for wireless electronic devices.

The wireless electronic devices may be portable electronic devices such as laptop computers or small portable computers of the type that are sometimes referred to as ultraportables. Portable electronic devices may also be somewhat smaller devices. Examples of smaller portable electronic devices include wrist-watch devices, pendant devices, headphone and earpiece devices, and other wearable and miniature devices. With one suitable arrangement, which is sometimes described herein as an example, the portable electronic devices are handheld electronic devices.

The handheld devices may be, for example, cellular telephones, media players with wireless communications capabilities, handheld computers (also sometimes called personal digital assistants), remote controllers, global positioning system (GPS) devices, and handheld gaming devices. The handheld devices may also be hybrid devices that combine the functionality of multiple conventional devices. Examples of hybrid handheld devices include a cellular telephone that includes media player functionality, a gaming device that includes a wireless communications capability, a cellular telephone that includes game and email functions, and a handheld device that receives email, supports mobile telephone calls, and supports web browsing. These are merely illustrative examples.

Figure 1:
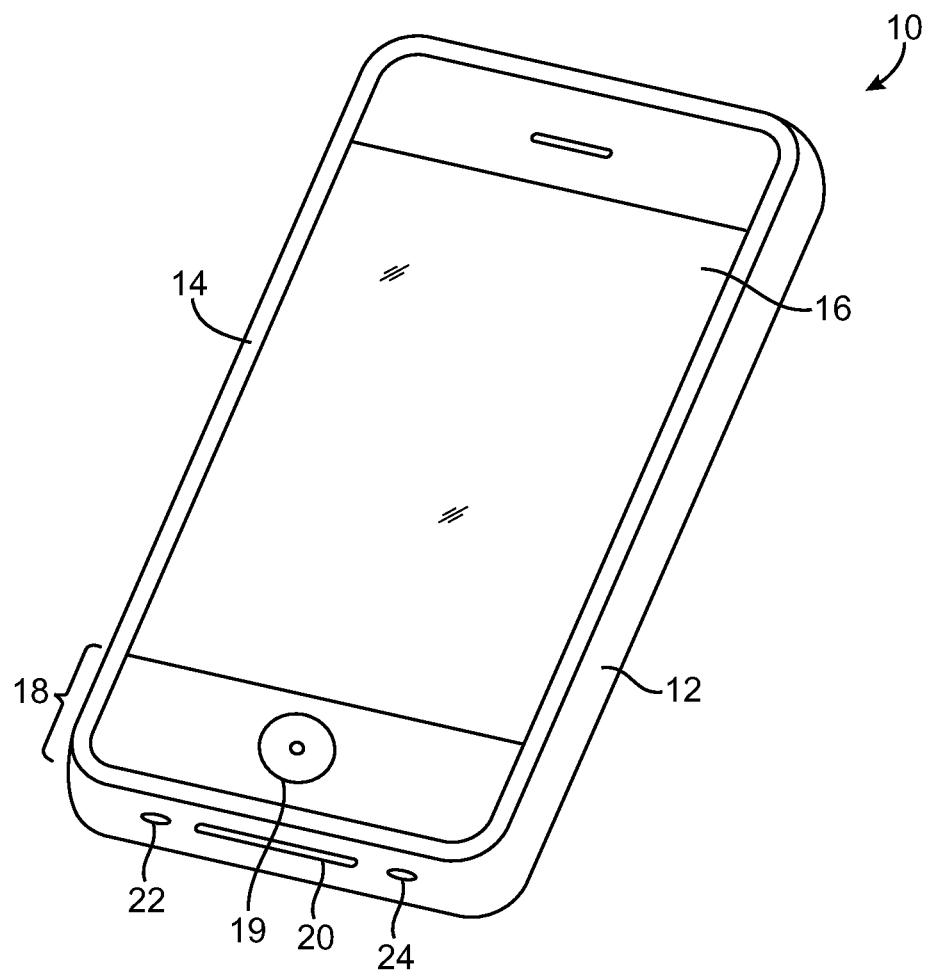
FIG. 1 is a perspective view of an illustrative handheld electronic device in accordance with an embodiment of the present invention.

An illustrative handheld electronic device in accordance with an embodiment of the present invention is shown in FIG. 1. Device 10 may be any suitable portable or handheld electronic device.

Device 10 may have housing 12. Device 10 may include one or more antennas for handling wireless communications. Embodiments of device 10 that contain one antenna and embodiments of device 10 that contain two antennas are sometimes described herein as examples.

Device 10 may handle communications over one or more communications bands. For example, in a device 10 with two antennas, a first of the two antennas may be used to handle cellular telephone communications in one or more frequency bands, whereas a second of the two antennas may be used to handle data communications in a separate communications band. With one suitable arrangement, which is sometimes described herein as an example, the second antenna is configured to handle data communications in a communications band centered at 2.4 GHz (e.g., WiFi and/or Bluetooth frequencies). In configurations with multiple antennas, the antennas may be designed to reduce interference so as to allow the two antennas to operate in relatively close proximity to each other.

Housing 12, which is sometimes referred to as a case, may be formed of any suitable materials including, plastic, glass, ceramics, metal, or other suitable materials, or a combination of these materials. In some situations, housing 12 or portions of housing 12 may be formed from a dielectric or other low-conductivity material, so that the operation of conductive antenna elements that are located in proximity to housing 12 is not disrupted. Housing 12 or portions of housing 12 may also be formed from conductive materials such as metal. An illustrative housing material that may be used is anodized aluminum. Aluminum is relatively light in weight and, when anodized, has an attractive insulating and scratch-resistant surface. If desired, other metals can be used for the housing of device 10, such as stainless steel, magnesium, titanium, alloys of these metals and other metals, etc. In scenarios in which housing 12 is formed from metal elements, one or more of the metal elements may be used as part of the antennas in device 10. For example, metal portions of housing 12 may be shorted to an internal ground plane in device 10 to create a larger ground plane element for that device 10. To facilitate electrical contact between an anodized aluminum housing and other metal components in device 10, portions of the anodized surface layer of the anodized aluminum housing may be selectively removed during the manufacturing process (e.g., by laser etching).

Housing 12 may have a bezel 14. The bezel 14 may be formed from a conductive material. The conductive material may be a metal (e.g., an elemental metal or an alloy) or other suitable conductive materials. With one suitable arrangement, which is sometimes described herein as an example, bezel 14 may be formed from stainless steel. Stainless steel can be manufactured so that it has an attractive shiny appearance, is structurally strong, and does not corrode easily. If desired, other structures may be used to form bezel 14. For example, bezel 14 may be formed from plastic that is coated with a shiny coating of metal or other suitable substances. Arrangements in which bezel 14 is formed from a conductive metal such as stainless steel are often described herein as an example.

Bezel 14 may serve to hold a display or other device with a planar surface in place on device 10. As shown in FIG. 1, for example, bezel 14 may be used to hold display 16 in place by attaching display 16 to housing 12. Device 10 may have front and rear planar surfaces. In the example of FIG. 1, display 16 is shown as being formed as part of the planar front surface of device 10. The periphery of the front surface may be surrounded by a bezel, such as bezel 14. If desired, the periphery of the rear surface may be surrounded by a bezel (e.g., in a device with both front and rear displays).

Display 16 may be a liquid crystal diode (LCD) display, an organic light emitting diode (OLED) display, or any other suitable display. The outermost surface of display 16 may be formed from one or more plastic or glass layers. If desired, touch screen functionality may be integrated into display 16 or may be provided using a separate touch pad device. An advantage of integrating a touch screen into display 16 to make display 16 touch sensitive is that this type of arrangement can save space and reduce visual clutter.

In a typical arrangement, bezel 14 may have prongs that are used to secure bezel 14 to housing 12 and that are used to electrically connect bezel 14 to housing 12 and other conductive elements in device 10. The housing and other conductive elements form a ground plane for the antenna(s) in the handheld electronic device. A gasket (e.g., an o-ring formed from silicone or other compliant material, a polyester film gasket, etc.) may be placed between the underside of bezel 14 and the outermost surface of display 16. The gasket may help to relieve pressure from localized pressure points that might otherwise place stress on the glass or plastic cover of display 16. The gasket may also help to visually hide portions of the interior of device 10 and may help to prevent debris from entering device 10.

In addition to serving as a retaining structure for display 16, bezel 14 may serve as a rigid frame for device 10. In this capacity, bezel 14 may enhance the structural integrity of device 10. For example, bezel 14 may make device 10 more rigid along its length than would be possible if no bezel were used. Bezel 14 may also be used to improve the appearance of device 10. In configurations such as the one shown in FIG. 1 in which bezel 14 is formed around the periphery of a surface of device 10 (e.g., the periphery of the front face of device 10), bezel 14 may help to prevent damage to display 16 (e.g., by shielding display 16 from impact in the event that device 10 is dropped, etc.).

Display screen 16 (e.g., a touch screen) is merely one example of an input-output device that may be used with handheld electronic device 10. If desired, handheld electronic device 10 may have other input-output devices. For example, handheld electronic device 10 may have user input control devices such as button 19, and input-output components such as port 20 and one or more input-output jacks (e.g., for audio and/or video). Button 19 may be, for example, a menu button. Port 20 may contain a 30-pin data connector (as an example). Openings 24 and 22 may, if desired, form microphone and speaker ports. Display screen 16 may be, for example, a liquid crystal display (LCD), an organic light-emitting diode (OLED) display, a plasma display, or multiple displays that use one or more different display technologies. In the example of FIG. 1, display screen 16 is shown as being mounted on the front face of handheld electronic device 10, but display screen 16 may, if desired, be mounted on the rear face of handheld electronic device 10, on a side of device 10, on a flip-up portion of device 10 that is attached to a main body portion of device 10 by a hinge (for example), or using any other suitable mounting arrangement. Bezels such as bezel 14 of FIG. 1 may be used to mount display 16 or any other device with a planar surface to housing 12 in any of these locations.

A user of handheld device 10 may supply input commands using user input interface devices such as button 19 and touch screen 16. Suitable user input interface devices for handheld electronic device 10 include buttons (e.g., alphanumeric keys, power on-off, power-on, power-off, and other specialized buttons, etc.), a touch pad, pointing stick, or other cursor control device, a microphone for supplying voice commands, or any other suitable interface for controlling device 10. Although shown schematically as being formed on the top face of handheld electronic device 10 in the example of FIG. 1, buttons such as button 19 and other user input interface devices may generally be formed on any suitable portion of handheld electronic device 10. For example, a button such as button 19 or other user interface control may be formed on the side of handheld electronic device 10. Buttons and other user interface controls can also be located on the top face, rear face, or other portion of device 10. If desired, device 10 can be controlled remotely (e.g., using an infrared remote control, a radio-frequency remote control such as a Bluetooth remote control, etc.).

Handheld device 10 may have ports such as port 20. Port 20, which may sometimes be referred to as a dock connector, 30-pin data port connector, input-output port, or bus connector, may be used as an input-output port (e.g., when connecting device 10 to a mating dock connected to a computer or other electronic device. Device 10 may also have audio and video jacks that allow device 10 to interface with external components. Typical ports include power jacks to recharge a battery within device 10 or to operate device 10 from a direct current (DC) power supply, data ports to exchange data with external components such as a personal computer or peripheral, audio-visual jacks to drive headphones, a monitor, or other external audio-video equipment, a subscriber identity module (SIM) card port to authorize cellular telephone service, a memory card slot, etc. The functions of some or all of these devices and the internal circuitry of handheld electronic device 10 can be controlled using input interface devices such as touch screen display 16.

Components such as display 16 and other user input interface devices may cover most of the available surface area on the front face of device 10 (as shown in the example of FIG. 1) or may occupy only a small portion of the front face of device 10. Because electronic components such as display 16 often contain large amounts of metal (e.g., as radio-frequency shielding), the location of these components relative to the antenna elements in device 10 should generally be taken into consideration. Suitably chosen locations for the antenna elements and electronic components of the device will allow the antennas of handheld electronic device 10 to function properly without being disrupted by the electronic components.

With one suitable arrangement, the antennas of device 10 are located in the lower end 18 of device 10, in the proximity of port 20. An advantage of locating antennas in the lower portion of housing 12 and device 10 is that this places the antennas away from the user's head when the device 10 is held to the head (e.g., when talking into a microphone and listening to a speaker in the handheld device as with a cellular telephone). This reduces the amount of radio-frequency radiation that is emitted in the vicinity of the user and minimizes proximity effects.

Figure 2:
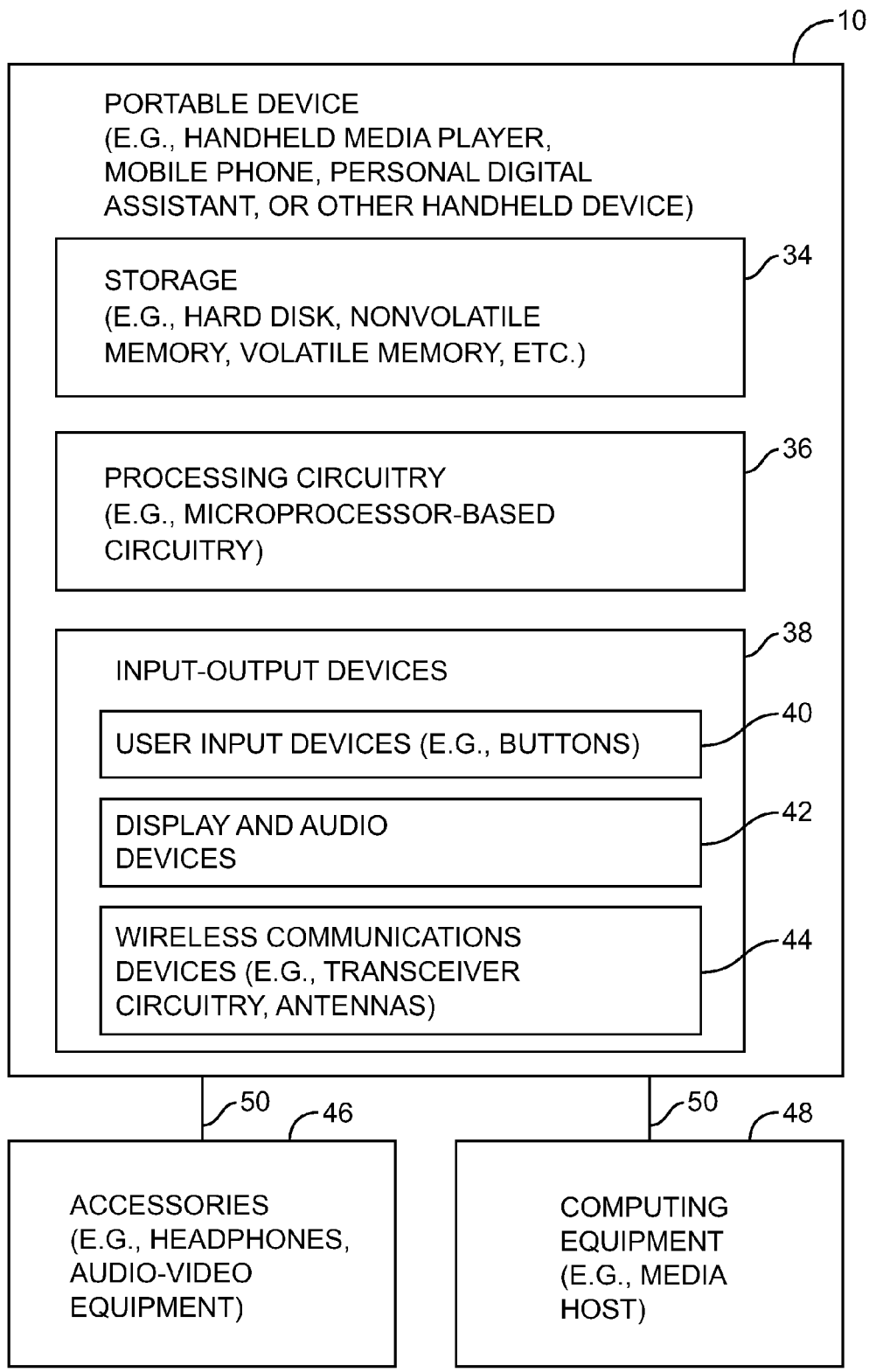
FIG. 2 is a schematic diagram of an illustrative handheld electronic device in accordance with an embodiment of the present invention.

A schematic diagram of an embodiment of an illustrative handheld electronic device is shown in FIG. 2. Handheld device 10 may be a mobile telephone, a mobile telephone with media player capabilities, a handheld computer, a remote control, a game player, a global positioning system (GPS) device, a combination of such devices, or any other suitable portable electronic device.

As shown in FIG. 2, handheld device 10 may include storage 34. Storage 34 may include one or more different types of storage such as hard disk drive storage, nonvolatile memory (e.g., flash memory or other electrically-programmable-read-only memory), volatile memory (e.g., battery-based static or dynamic random-access-memory), etc.

Processing circuitry 36 may be used to control the operation of device 10. Processing circuitry 36 may be based on a processor such as a microprocessor and other suitable integrated circuits. With one suitable arrangement, processing circuitry 36 and storage 34 are used to run software on device 10, such as internet browsing applications, voice-over-internet-protocol (VOIP) telephone call applications, email applications, media playback applications, operating system functions, etc. Processing circuitry 36 and storage 34 may be used in implementing suitable communications protocols. Communications protocols that may be implemented using processing circuitry 36 and storage 34 include internet protocols, wireless local area network protocols (e.g., IEEE 802.11 protocols—sometimes referred to as WiFi®, protocols for other short-range wireless communications links such as the Bluetooth® protocol, etc.).

Input-output devices 38 may be used to allow data to be supplied to device 10 and to allow data to be provided from device 10 to external devices. Display screen 16, button 19, microphone port 24, speaker port 22, and dock connector port 20 are examples of input-output devices 38.

Input-output devices 38 can include user input-output devices 40 such as buttons, touch screens, joysticks, click wheels, scrolling wheels, touch pads, key pads, keyboards, microphones, cameras, etc. A user can control the operation of device 10 by supplying commands through user input devices 40. Display and audio devices 42 may include liquid-crystal display (LCD) screens or other screens, light-emitting diodes (LEDs), and other components that present visual information and status data. Display and audio devices 42 may also include audio equipment such as speakers and other devices for creating sound. Display and audio devices 42 may contain audio-video interface equipment such as jacks and other connectors for external headphones and monitors.

Wireless communications devices 44 may include communications circuitry such as radio-frequency (RF) transceiver circuitry formed from one or more integrated circuits, power amplifier circuitry, passive RF components, one or more antennas, and other circuitry for handling RF wireless signals. Wireless signals can also be sent using light (e.g., using infrared communications).

Device 10 can communicate with external devices such as accessories 46 and computing equipment 48, as shown by paths 50. Paths 50 may include wired and wireless paths. Accessories 46 may include headphones (e.g., a wireless cellular headset or audio headphones) and audio-video equipment (e.g., wireless speakers, a game controller, or other equipment that receives and plays audio and video content).

Computing equipment 48 may be any suitable computer. With one suitable arrangement, computing equipment 48 is a computer that has an associated wireless access point (router) or an internal or external wireless card that establishes a wireless connection with device 10. The computer may be a server (e.g., an internet server), a local area network computer with or without internet access, a user's own personal computer, a peer device (e.g., another handheld electronic device 10), or any other suitable computing equipment.

The antennas and wireless communications devices of device 10 may support communications over any suitable wireless communications bands. For example, wireless communications devices 44 may be used to cover communications frequency bands such as the cellular telephone bands at 850 MHz, 900 MHz, 1800 MHz, and 1900 MHz, data service bands such as the 3G data communications band at 2170 MHz band (commonly referred to as UMTS or Universal Mobile Telecommunications System), the WiFi® (IEEE 802.11) bands at 2.4 GHz and 5.0 GHz, the Bluetooth® band at 2.4 GHz, and the global positioning system (GPS) band at 1550 MHz. These are merely illustrative communications bands over which devices 44 may operate. Additional local and remote communications bands are expected to be deployed in the future as new wireless services are made available. Wireless devices 44 may be configured to operate over any suitable band or bands to cover any existing or new services of interest. Device 10 may use one antenna, two antennas, or more than two antennas to provide wireless coverage over all communications bands of interest.

Figure 3:
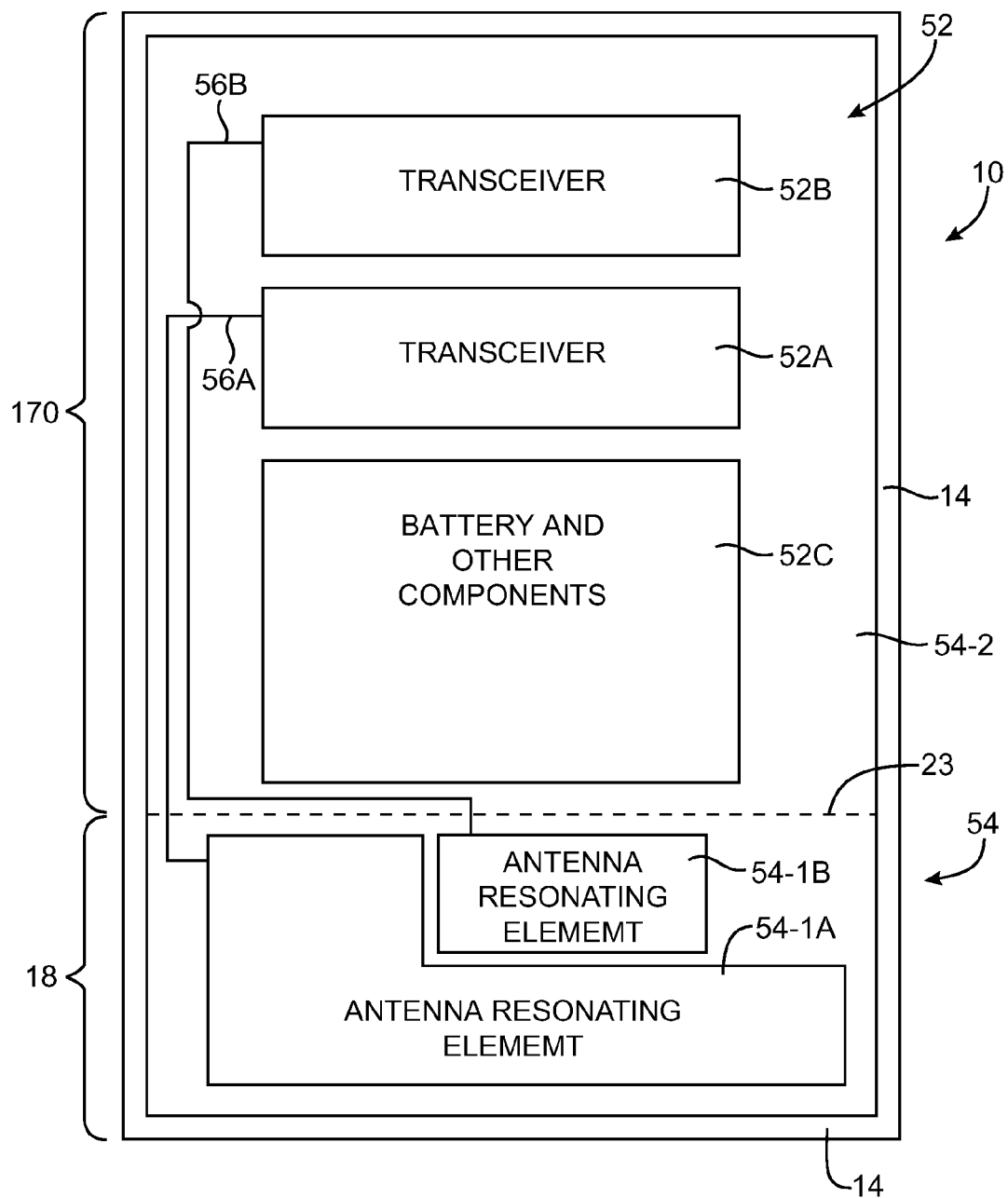
FIG. 3 is a partly schematic top view of an illustrative handheld electronic device containing two radio-frequency transceivers that are coupled to two associated antenna resonating elements by respective transmission lines in accordance with an embodiment of the present invention.

A top view of an illustrative device 10 in accordance with an embodiment of the present invention is shown in FIG. 3. As shown in FIG. 3, transceiver circuitry such as transceiver 52A and transceiver 52B may be interconnected with antenna resonating elements 54-1A and 54-1B over respective transmission lines 56A and 56B. In the example of FIG. 3, there are two transceivers, two corresponding transmission lines, and two corresponding antenna resonating elements. This is merely illustrative. For example, device 10 may have one transceiver, one corresponding transmission line, and one corresponding antenna resonating element or device 10 may have more than two transceivers, transmission lines, and antenna resonating elements.

Portions of device 10 may form a ground for the antennas formed by resonating elements 54-1A and 54-1B. The antenna ground, which is sometimes referred to as the antenna ground plane or antenna ground plane element, may be formed of conductive device structures such as printed circuit boards, transceiver shielding cans, integrated circuits, batteries, displays, buttons, screws, clamps, brackets, flex circuits, and portions of housing 12. Components 52 of this type are shown schematically in FIG. 3 as transceivers 52A and 52B and as battery and other components 52C. With one suitable arrangement, which is sometimes described herein as an example, such grounded conductive structures are located in region 170, above dotted line 23 in FIG. 3.

Bezel 14 may surround device 10 and may be electrically connected to antenna ground (e.g., by shorting bezel 14 to the conductive structures in region 170 of device 10). When bezel 14 is connected to the ground structures, bezel 14 forms part of the ground for the antenna(s) of device 10 (i.e., bezel 14 becomes part of antenna ground plane 54-2).

Ground plane 54-2 may have a substantially rectangular shape (i.e., the lateral dimensions of ground plane 54-2 may match those of device 10 and the periphery of ground plane 54-2 may be substantially rectangular) and may contain an opening beneath resonating elements 54-1A and 54-1B. The opening in ground plane 54-2 is sometimes referred to as a hole or slot and is generally filed with air and other dielectrics and components that do not significantly affect radio-frequency antenna signals. The opening may be of any suitable shape. For example, the opening may be rectangular in shape. In this type of scenario, bezel 14 may define right, left, and lower sides of the opening (in the orientation of FIG. 3), whereas the conductive device structures above line 23 (e.g., printed circuit board, conductive housing surfaces, conductive display components, and other conductive electrical components) may form a top side of the opening (in the orientation of FIG. 3). In some embodiments of device 10, one or more conductive structures such as dock connector 20 (FIG. 1) may overlap at least partly with the otherwise rectangular opening defined by the ground structures above line 23 and bezel 14. In this type of arrangement, the opening in ground plane 54-2 may have a non-rectangular shape. Non-rectangular shapes for the opening may include, for example, polygons, squares, ovals, shapes with both flat and curved sides, etc.

When operated in conjunction with antenna ground 54-2, antenna resonating elements such as resonating elements 54-1A and 54-1B form antennas 54 for device 10. In the example of FIG. 3, there are two antennas in device 10, one of which is associated with antenna resonating element 54-1A and one of which is associated with antenna resonating element 54-1B. This is, however, merely illustrative. There may, in general, be one antenna, two antennas, or three or more antennas in device 10.

Antenna resonating elements in device 10 may be formed in any suitable shape. With one illustrative arrangement, one of antennas 54 (i.e., the antenna formed from resonating element 54-1A) is based at least partly on a planar inverted-F antenna (PIFA) structure and the other antenna (i.e., the antenna formed from resonating element 54-1B) is based on a planar strip configuration. Although this embodiment may be described herein as an example, any other suitable shapes may be used for resonating elements 54-1A and 54-1B if desired.

To permit antennas 54 to function properly, part of the housing of device 10 (i.e., portions in region 18) may be formed from plastic or another suitable dielectric material. With one suitable arrangement, which is described herein as an example, antenna resonating elements 54-1A and 54-1B may be formed from conductive copper traces on a flex circuit. The flex circuit may be mounted to a plastic supporting piece that is sometimes referred to as an antenna cap or antenna support. A plastic cover, which is sometimes referred to as a cosmetic cap or housing cap, may be used to enclose the antennas. The cosmetic cap may form a portion of the housing of device 10 in region 18. The cosmetic cap may be formed from a plastic based on acrylonitrile-butadiene-styrene copolymers (sometimes referred to as ABS plastic). If desired, plastic portions of the housing of device 10 may be formed from low dielectric constant materials. An example of this type of plastic is the low dielectric constant plastic that is sold under the trade name IXEF® by Solvay Advanced Polymers, L.L.C. of Alpharetta, Ga. This plastic, which is a polyarylamide, has a satisfactory structural strength for forming parts of the housing of device 10.

Components such as components 52 may be mounted on one or more circuit boards in device 10. Typical components 52 include integrated circuits, LCD screens, and user input interface buttons. Device 10 also typically includes a battery such as a lithium-ion battery, which may be mounted along the rear face of housing 12 (as an example). One or more transceiver circuits such as transceiver circuits 52A and 52B may be mounted to one or more circuit boards in device 10. With one suitable arrangement, two printed circuit boards may be stacked on top of each other in the housing of device 10. In a configuration for device 10 in which there are two antenna resonating elements and two transceivers, each transceiver may be used to transmit radio-frequency signals through a respective one of two respective antenna resonating elements and may be used to receive radio-frequency signals through a respective one of two antenna resonating elements. A common ground 54-2 may be used with each of the two antenna resonating elements.

With one illustrative arrangement, transceiver 52A may be used to transmit and receive cellular telephone radio-frequency signals and transceiver 52B may be used to transmit signals in a communications band such as the 3G data communications band at 2170 MHz band (commonly referred to as UMTS or Universal Mobile Telecommunications System), the WiFi® (IEEE 802.11) bands at 2.4 GHz and 5.0 GHz, the Bluetooth® band at 2.4 GHz, or the global positioning system (GPS) band at 1550 MHz.

The circuit board(s) in device 10 may be formed from any suitable materials. With one illustrative arrangement, the circuit board or boards of device 10 may be provided using multilayer printed circuit board material. At least one of the layers may have large planar regions of conductor that form part of ground plane 54-2. In a typical scenario, ground plane 54-2 is a rectangle that conforms to the generally rectangular shape of housing 12 and device 10 and matches the rectangular lateral dimensions of housing 12. Circuit boards in ground plane 54-2 may, if desired, be electrically connected to conductive housing portions using shorting brackets, springs, screws, and other conductive structures.

Suitable circuit board materials for a multilayer printed circuit board in device 10 include paper impregnated with phonolic resin, resins reinforced with glass fibers such as fiberglass mat impregnated with epoxy resin (sometimes referred to as FR-4), plastics, polytetrafluoroethylene, polystyrene, polyimide, and ceramics. Circuit boards fabricated from materials such as FR-4 are commonly available, are not cost-prohibitive, and can be fabricated with multiple layers of metal (e.g., four layers). So-called flex circuits, which are formed using flexible circuit board materials such as polyimide, may also be used in device 10. For example, flex circuits may be used to form the antenna resonating elements for antenna(s) 54. In a typical flex circuit, antenna resonating elements may be formed from copper traces (e.g., on one side of the flex circuit substrate).

In the illustrative configuration of FIG. 3, ground plane element 54-2 and antenna resonating element 54-1A may form a first antenna for device 10. Ground plane element 54-2 and antenna resonating element 54-1B may form a second antenna for device 10. These two antennas form a multiband antenna having multiple resonating elements. If desired, other antenna structures can be provided. For example, additional resonating elements may be used to provide additional gain for an overlapping frequency band of interest (i.e., a band at which one of these antennas 54 is operating) or may be used to provide coverage in a different frequency band of interest (i.e., a band outside of the range of antennas 54). Bezel 14 is typically connected to antenna ground to form part of the ground 54-2 and thereby serve as a portion of antenna 54.

Any suitable conductive materials may be used to form ground plane element 54-2 and resonating elements such as resonating element 54-1A and 54-1B. Examples of suitable conductive antenna materials include metals, such as copper, brass, silver, gold, and stainless steel (e.g., for bezel 14). Conductors other than metals may also be used, if desired. The planar conductive elements in antennas 54 are typically thin (e.g., about 0.2 mm).

Transceiver circuits 52A and 52B (i.e., transceiver circuitry 44 of FIG. 2) may be provided in the form of one or more integrated circuits and associated discrete components (e.g., filtering components). These transceiver circuits may include one or more transmitter integrated circuits, one or more receiver integrated circuits, switching circuitry, amplifiers, etc. Transceiver circuits 52A and 52B may operate simultaneously (e.g., one can transmit while the other receives, both can transmit at the same time, or both can receive simultaneously).

Each transceiver may have an associated coaxial cable or other transmission line over which transmitted and received radio frequency signals are conveyed. As shown in the example of FIG. 3, transmission line 56A (e.g., a coaxial cable) may be used to interconnect transceiver 52A and antenna resonating element 54-1A and transmission line 56B (e.g., a coaxial cable) may be used to interconnect transceiver 52B and antenna resonating element 54-1B. With this type of configuration, transceiver 52B may handle WiFi transmissions over an antenna formed from resonating element 54-1B and ground plane 54-2, while transceiver 52A may handle cellular telephone transmission over an antenna formed from resonating element 54-1A and ground plane 54-2.

Figure 4:
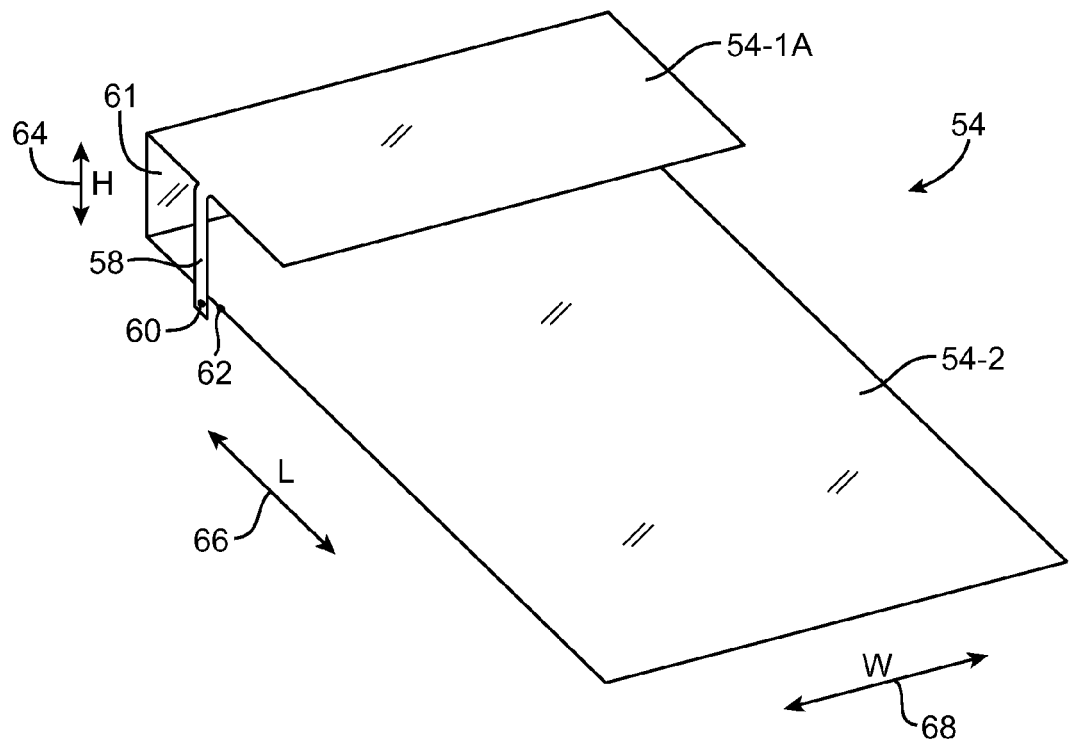
FIG. 4 is a perspective view of an illustrative planar inverted-F antenna (PIFA) in accordance with an embodiment of the present invention.

An illustrative planar inverted-F antenna (PIFA) structure is shown in FIG. 4. As shown in FIG. 4, PIFA structure 54 may have a ground plane portion 54-2 and a planar resonating element portion 54-1A. Antennas are fed using positive signals and ground signals. The portion of an antenna to which the positive signal is provided is sometimes referred to as the antenna's positive terminal or feed terminal. This terminal is also sometimes referred to as the signal terminal or the center-conductor terminal of the antenna. The portion of an antenna to which the ground signal is provided may be referred to as the antenna's ground, the antenna's ground terminal, the antenna's ground plane, etc. In antenna 54 of FIG. 4, feed conductor 58 is used to route positive antenna signals from signal terminal 60 into antenna resonating element 54-1A. Ground terminal 62 is shorted to ground plane 54-2, which forms the antenna's ground.

The dimensions of the ground plane in a PIFA antenna such as antenna 54 of FIG. 4 are generally sized to conform to the maximum size allowed by housing 12 of device 10. Antenna ground plane 54-2 may be rectangular in shape having width W in lateral dimension 68 and length L in lateral dimension 66. The length of antenna 54 in dimension 66 affects its frequency of operation. Dimensions 68 and 66 are sometimes referred to as horizontal dimensions. Resonating element 54-1A is typically spaced several millimeters above ground plane 54-2 along vertical dimension 64. The size of antenna 54 in dimension 64 is sometimes referred to as height H of antenna 54.

Figure 5:
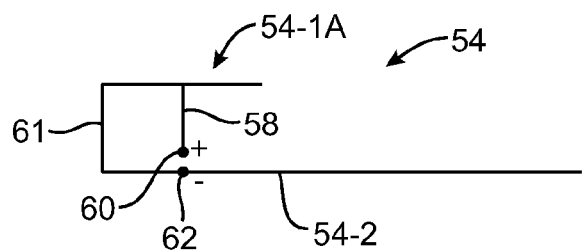
FIG. 5 is a cross-sectional side view of an illustrative planar inverted-F antenna of the type shown in FIG. 4 in accordance with an embodiment of the present invention.

A cross-sectional view of PIFA antenna 54 of FIG. 4 is shown in FIG. 5. As shown in FIG. 5, radio-frequency signals may be fed to antenna 54 (when transmitting) and may be received from antenna 54 (when receiving) using signal terminal 60 and ground terminal 62. In a typical arrangement, a coaxial cable or other transmission line has its center conductor electrically connected to point 60 and its ground conductor electrically connected to point 62.

Figure 6:
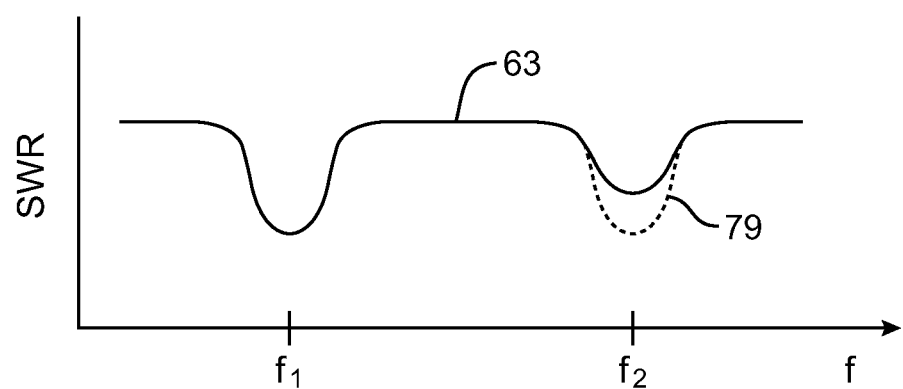
FIG. 6 is an illustrative antenna performance graph for an antenna of the type shown in FIGS. 4 and 5 in which standing-wave-ratio (SWR) values are plotted as a function of operating frequency in accordance with an embodiment of the present invention.

A graph of the expected performance of an antenna of the type represented by illustrative antenna 54 of FIGS. 4 and 5 is shown in FIG. 6. Expected standing wave ratio (SWR) values are plotted as a function of frequency. The performance of antenna 54 of FIGS. 4 and 5 is given by solid line 63. As shown, there is a reduced SWR value at frequency $f_1$, indicating that the antenna performs well in the frequency band centered at frequency $f_1$. PIFA antenna 54 also operates at harmonic frequencies such as frequency $f_2$. Frequency $f_2$ represents the second harmonic of PIFA antenna 54 (i.e., $f_2=2f_1$). The dimensions of antenna 54 may be selected so that frequencies $f_1$ and $f_2$ are aligned with communication bands of interest. The frequency $f_1$ (and harmonic frequency $2f_1$) are related to the length L of antenna 54 in dimension 66 (L is approximately equal to one quarter of a wavelength at frequency $f_1$).

In some configurations, the height H of antenna 54 of FIGS. 4 and 5 in dimension 64 may be limited by the amount of near-field coupling between resonating element 54-1A and ground plane 54-2. For a specified antenna bandwidth and gain, it may not be possible to reduce the height H without adversely affecting performance. All other variables being equal, reducing height H will generally cause the bandwidth and gain of antenna 54 to be reduced.

Figure 7:
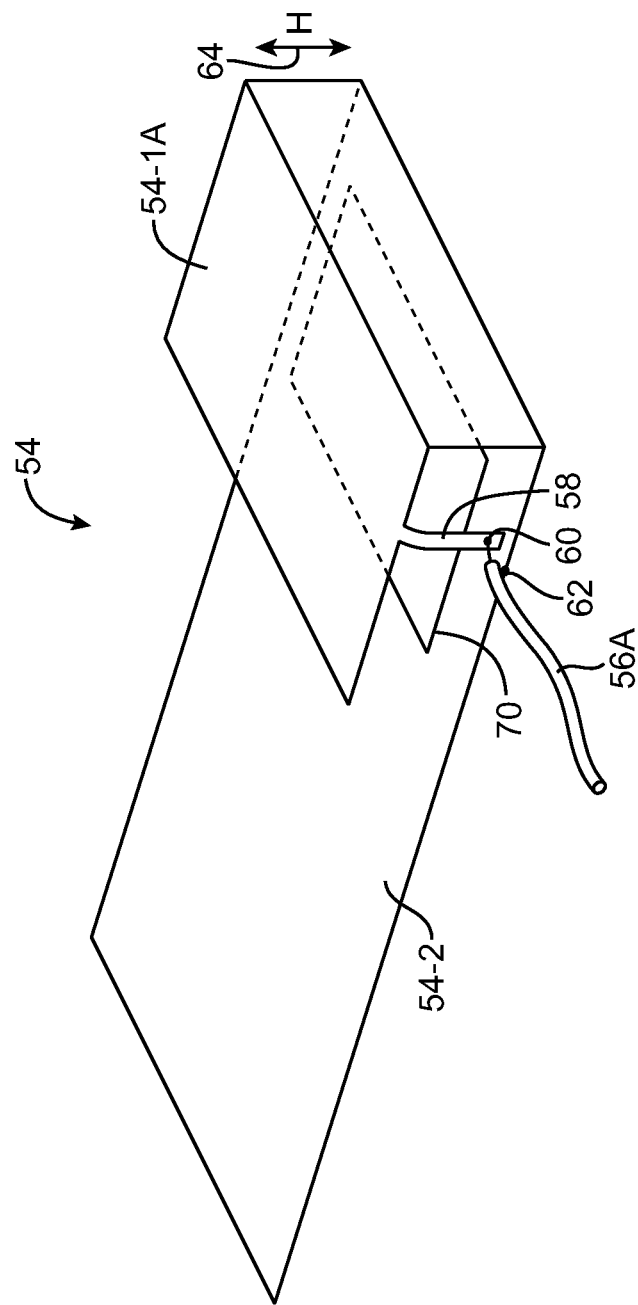
FIG. 7 is a perspective view of an illustrative planar inverted-F antenna in which a portion of the antenna's ground plane underneath the antenna's resonating element has been removed to form a slot in accordance with an embodiment of the present invention.

As shown in FIG. 7, the minimum vertical dimension of the PIFA antenna can be reduced while still satisfying minimum bandwidth and gain constraints by introducing a dielectric region 70 in the form of an opening (slot) under antenna resonating element 54-1A. Slot 70 may be filled with electrical parts with radio-frequency isolation, air, plastic, or other suitable dielectric and represents a cut-away or removed portion of ground plane 54-2. With one suitable arrangement, which is shown in FIG. 7, the removed region 70 forms a rectangular slot. Slots of other shapes (oval, meandering, curved sides, straight sides, etc.) may also be formed.

The slot in ground plane 54-2 may be any suitable size. For example, the slot may be slightly smaller than the outermost rectangular outline of resonating elements 54-1A and 54-2 as viewed from the top view orientation of FIG. 3. Typical resonating element lateral dimensions are on the order of 0.5 cm to 10 cm.

The presence of slot 70 reduces near-field electromagnetic coupling between resonating element 54-1A and ground plane 54-2 and allows height H in vertical dimension 64 to be made smaller than would otherwise be possible while satisfying a given set of bandwidth and gain constraints. For example, height H may be in the range of 1-5 mm, may be in the range of 2-5 mm, may be in the range of 2-4 mm, may be in the range of 1-3 mm, may be in the range of 1-4 mm, may be in the range of 1-10 mm, may be lower than 10 mm, may be lower than 4 mm, may be lower than 3 mm, may be lower than 2 mm, or may be in any other suitable range of vertical displacements above ground plane element 54-2.

If desired, the portion of ground plane 54-2 that contains slot 70 may be used to form a slot antenna. The slot antenna structure may be used alone to form an antenna for device 10 or the slot antenna structure may be used in conjunction with one or more resonating elements to form a hybrid antenna 54. For example, one or more PIFA resonating elements may be used with the slot antenna structure to form a hybrid antenna. By operating antenna 54 so that it exhibits both PIFA operating characteristics and slot antenna operating characteristics, antenna performance can be improved.

Figure 8:
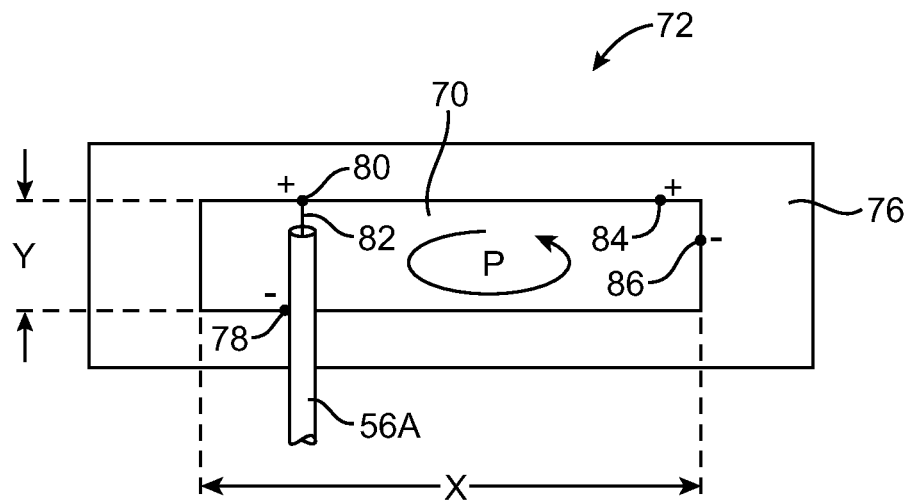
FIG. 8 is a top view of an illustrative slot antenna in accordance with an embodiment of the present invention.

A top view of an illustrative slot antenna is shown in FIG. 8. Antenna 72 of FIG. 8 is typically thin in the dimension into the page (i.e., antenna 72 is planar with its plane lying in the page). Slot 70 may be formed in the center of antenna conductor 76. A coaxial cable such as cable 56A or other transmission line path may be used to feed antenna 72. In the example of FIG. 8, antenna 72 is fed so that center conductor 82 of coaxial cable 56A is connected to signal terminal 80 (i.e., the positive or feed terminal of antenna 72) and the outer braid of coaxial cable 56A, which forms the ground conductor for cable 56A, is connected to ground terminal 78.

Figure 9:
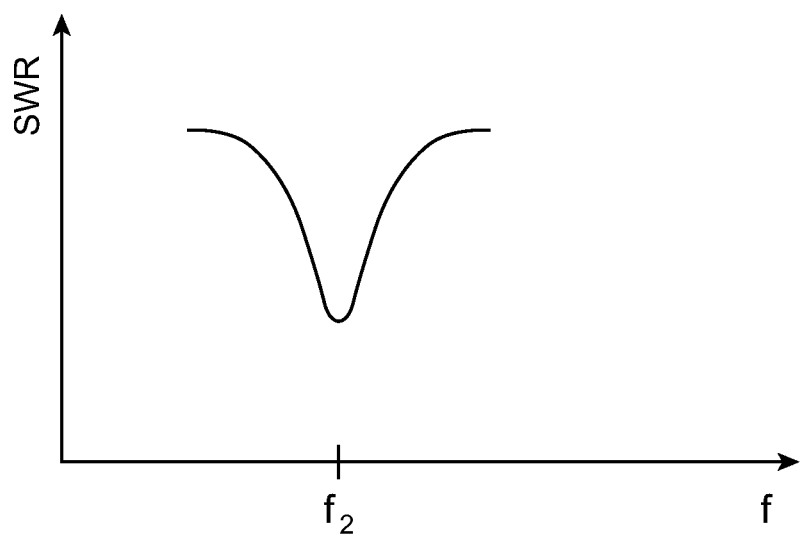
FIG. 9 is an illustrative antenna performance graph for an antenna of the type shown in FIG. 8 in which standing-wave-ratio (SWR) values are plotted as a function of operating frequency in accordance with an embodiment of the present invention.

When antenna 72 is fed using the arrangement of FIG. 8, the antenna's performance is given by the graph of FIG. 9. As shown in FIG. 9, antenna 72 operates in a frequency band that is centered about center frequency $f_2$. The center frequency $f_2$ is determined by the dimensions of slot 70. Slot 70 has an inner perimeter P that is equal to two times dimension X plus two times dimension Y (i.e., P=2X+2Y). At center frequency $f_2$, perimeter P is equal to one wavelength.

Because the center frequency $f_2$ can be tuned by proper selection of perimeter P, the slot antenna of FIG. 8 can be configured so that frequency $f_2$ of the graph in FIG. 9 coincides with frequency $f_2$ of the graph in FIG. 6. In an antenna design of this type in which slot 70 is combined with a PIFA structure, the presence of slot 70 increases the gain of the antenna at frequency $f_2$. In the vicinity of frequency $f_2$, the increase in performance from using slot 70 results in the antenna performance plot given by dotted line 79 in FIG. 6.

If desired, the value of perimeter P may be selected to resonate at a frequency that is different from frequency $f_2$ (i.e., out-of-band). In this scenario, the presence of slot 70 does not increase the performance of the antenna at resonant frequency $f_2$. Nevertheless, the removal of the conductive material from the region of slot 70 reduces near-field electromagnetic coupling between resonating elements such as resonating element 54-1A and ground plane 54-2 and allows height H in vertical dimension 64 to be made smaller than would otherwise be possible while satisfying a given set of bandwidth and gain constraints.

The position of terminals 80 and 78 may be selected for impedance matching. If desired, terminals such as terminals 84 and 86, which extend around one of the corners of slot 70 may be used to feed antenna 72. In this situation, the distance between terminals 84 and 86 may be chosen to properly adjust the impedance of antenna 72. In the illustrative arrangement of FIG. 8, terminals 84 and 86 are shown as being respectively configured as a slot antenna ground terminal and a slot antenna signal terminal, as an example. If desired, terminal 84 could be used as a ground terminal and terminal 86 could be used as a signal terminal. Slot 70 is typically air-filled, but may, in general, be filled with any suitable dielectric.

By using slot 70 in combination with a PIFA-type resonating element such as resonating element 54-1A, a hybrid PIFA/slot antenna is formed (sometimes referred to herein as a hybrid antenna). Handheld electronic device 10 may, if desired, have a PIFA/slot hybrid antenna of this type (e.g., for cellular telephone communications) and a strip antenna (e.g., for WiFi/Bluetooth communications).

Figure 10:
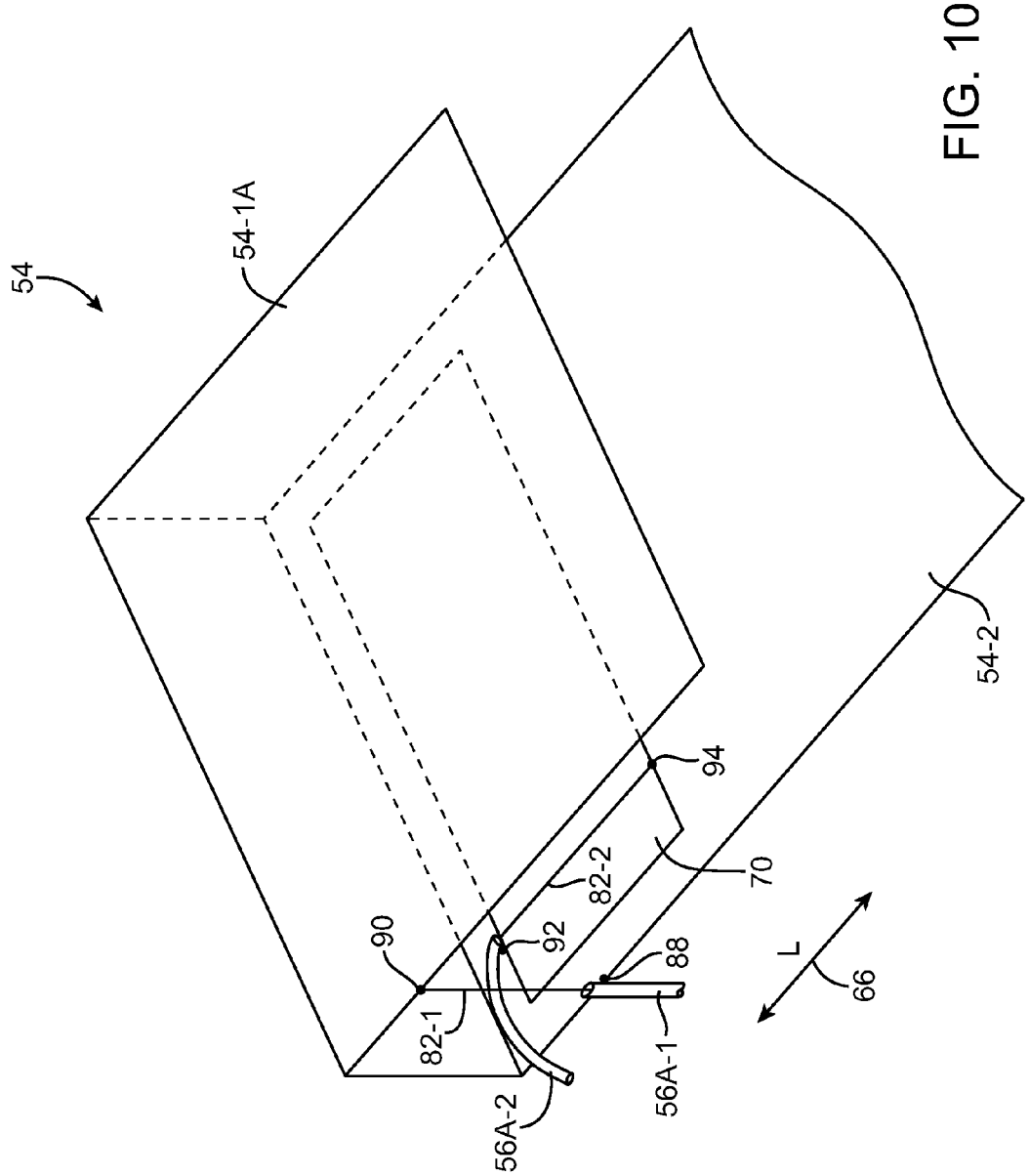
FIG. 10 is a perspective view of an illustrative hybrid PIFA/slot antenna formed by combining a planar inverted-F antenna with a slot antenna in which the antenna is being fed by two coaxial cable feeds in accordance with an embodiment of the present invention.

An illustrative configuration in which the hybrid PIFA/slot antenna formed by resonating element 54-1A, slot 70, and ground plane 54-2 is fed using two coaxial cables (or other transmission lines) is shown in FIG. 10. When the antenna is fed as shown in FIG. 10, both the PIFA and slot antenna portions of the antenna are active. As a result, antenna 54 of FIG. 10 operates in a hybrid PIFA/slot mode. Coaxial cables 56A-1 and 56A-2 have inner conductors 82-1 and 82-2, respectively. Coaxial cables 56A-1 and 56A-2 also each have a conductive outer braid ground conductor. The outer braid conductor of coaxial cable 56A-1 is electrically shorted to ground plane 54-2 at ground terminal 88. The ground portion of cable 56A-2 is shorted to ground plane 54-2 at ground terminal 92. The signal connections from coaxial cables 56A-1 and 56A-2 are made at signal terminals 90 and 94, respectively.

With the arrangement of FIG. 10, two separate sets of antenna terminals are used. Coaxial cable 56A-1 feeds the PIFA portion of the hybrid PIFA/slot antenna using ground terminal 88 and signal terminal 90 and coaxial cable 56A-2 feeds the slot antenna portion of the hybrid PIFA/slot antenna using ground terminal 92 and signal terminal 94. Each set of antenna terminals therefore operates as a separate feed for the hybrid PIFA/slot antenna. Signal terminal 90 and ground terminal 88 serve as antenna terminals for the PIFA portion of the antenna, whereas signal terminal 94 and ground terminal 92 serve as antenna feed points for the slot portion of antenna 54. These two separate antenna feeds allow the antenna to function simultaneously using both its PIFA and its slot characteristics. If desired, the orientation of the feeds can be changed. For example, coaxial cable 56A-2 may be connected to slot 70 using point 94 as a ground terminal and point 92 as a signal terminal or using ground and signal terminals located at other points along the periphery of slot 70.

When multiple transmission lines such as transmission lines 56A-1 and 56A-2 are used for the hybrid PIFA/slot antenna, each transmission line may be associated with a respective transceiver circuit (e.g., two corresponding transceiver circuits such as transceiver circuit 52A of FIG. 3).

In operation in handheld device 10, a hybrid PIFA/slot antenna formed from resonating element 54-1A of FIG. 3 and a corresponding slot that is located beneath element 54-1A in ground plane 54-2 can be used to cover the GSM cellular telephone bands at 850 and 900 MHz and at 1800 and 1900 MHz (or other suitable frequency bands), whereas a strip antenna (or other suitable antenna structure) can be used to cover an additional band centered at frequency $f_n$ (or another suitable frequency band or bands). By adjusting the size of the strip antenna or other antenna structure formed from resonating element 54-1B, the frequency $f_n$ may be controlled so that it coincides with any suitable frequency band of interest (e.g., 2.4 GHz for Bluetooth/WiFi, 2170 MHz for UMTS, or 1550 MHz for GPS).

Figure 11:
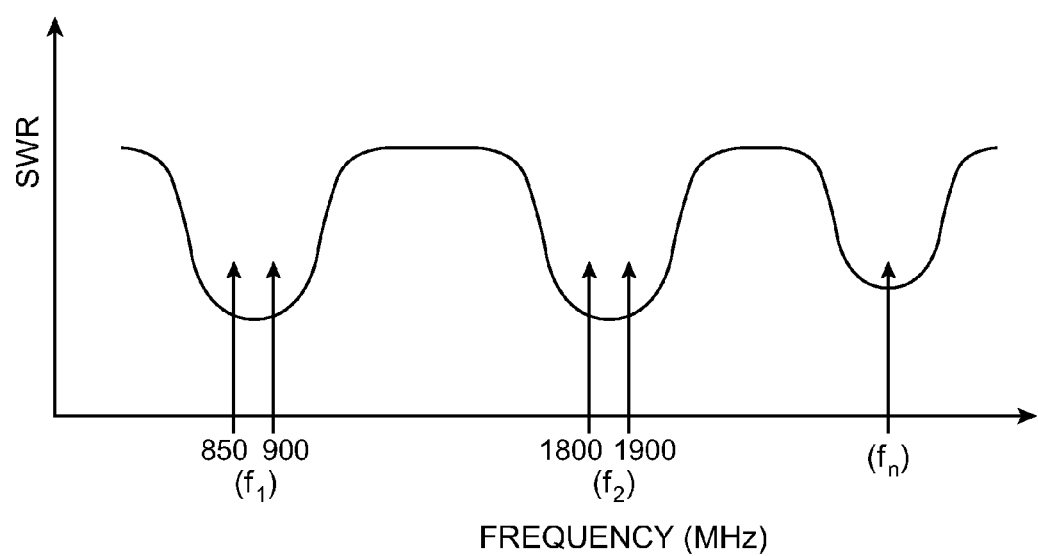
FIG. 11 is an illustrative wireless coverage graph in which antenna standing-wave-ratio (SWR) values are plotted as a function of operating frequency for a handheld device that contains a hybrid PIFA/slot antenna and a strip antenna in accordance with an embodiment of the present invention.

A graph showing the wireless performance of device 10 when using two antennas (e.g., a hybrid PIFA/slot antenna formed from resonating element 54-1A and a corresponding slot and an antenna formed from resonating element 54-2) is shown in FIG. 11. In the example of FIG. 11, the PIFA operating characteristics of the hybrid PIFA/slot antenna are used to cover the 850/900 MHz and the 1800/1900 MHz GSM cellular telephone bands, the slot antenna operating characteristics of the hybrid PIFA/slot antenna are used to provide additional gain and bandwidth in the 1800/1900 MHz range, and the antenna formed from resonating element 54-1B is used to cover the frequency band centered at $f_n$ (e.g., 2.4 GHz for Bluetooth/WiFi, 2170 MHz for UMTS, or 1550 MHz for GPS). This arrangement provides coverage for four cellular telephone bands and a data band.

Figure 12:
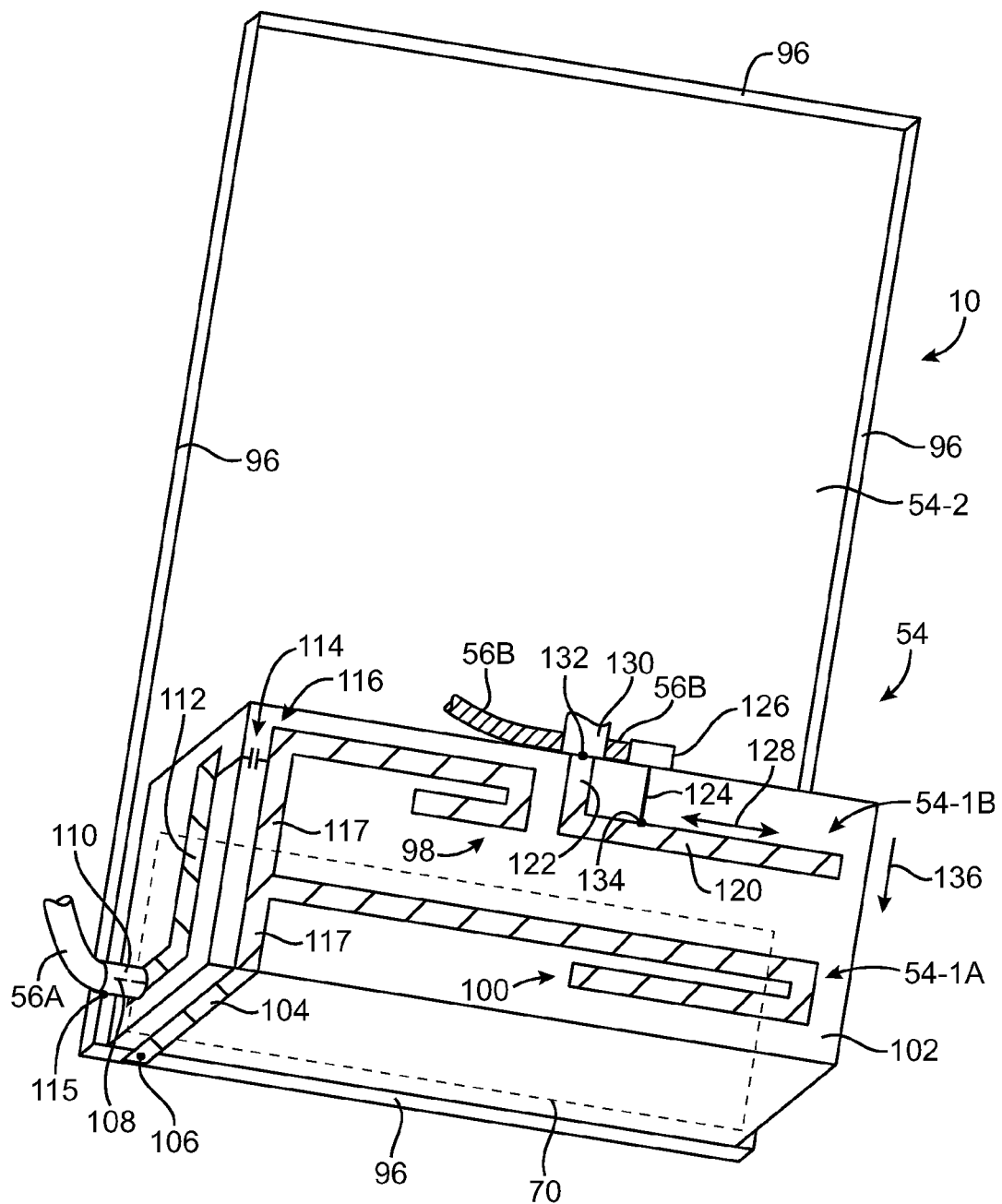
FIG. 12 is a perspective view of an illustrative handheld electronic device antenna arrangement in which a first of two handheld electronic device antennas has an associated isolation element that serves to reduce interference with from a second of the two handheld electronic device antennas in accordance with an embodiment of the present invention.

If desired, the hybrid PIFA/slot antenna formed from resonating element 54-1A and slot 70 may be fed using a single coaxial cable or other such transmission line. An illustrative configuration in which a single transmission line is used to simultaneously feed both the PIFA portion and the slot portion of the hybrid PIFA/slot antenna and in which a strip antenna formed from resonating element 54-1B is used to provide additional frequency coverage for device 10 is shown in FIG. 12. Ground plane 54-2 may be formed from metal components in housing 10 including a metal frame coated with plastic (as an example) that has conductive edges 96 that are electrically connected to bezel 14 (FIG. 1).

As shown in the somewhat schematic representation of FIG. 12, resonating element 54-1B may have an L-shaped conductive strip formed from conductive branch 122 and conductive branch 120. Branches 120 and 122 may be formed from metal that is supported by dielectric support structure 102. With one suitable arrangement, the resonating element structures of FIG. 12 are formed as part of a patterned flex circuit that is attached to antenna cap support structure 102 (e.g., by adhesive).

Coaxial cable 56B or other suitable transmission line has a ground conductor connected to ground terminal 132 and a signal conductor connected to signal terminal 124. Any suitable mechanism may be used for attaching the transmission line to the antenna. In the example of FIG. 12, the outer braid ground conductor of coaxial cable 56B is connected to ground terminal 132 using metal tab 130. Metal tab 130 may be shorted to housing 12. Transmission line connection structure 126 may be, for example, a mini UFL coaxial cable connector. The ground of connector 126 may be shorted to terminal 132 and the center conductor of connector 126 may be shorted to conductive path 124. Conductive path 124 may include circuit components (e.g., a capacitor) for impedance matching.

When feeding antenna 54-1B, terminal 132 may be considered to form the antenna's ground terminal and the center conductor of connector 126 and/or conductive path 124 may be considered to form the antenna's signal terminal. The location along dimension 128 at which conductive path 124 meets conductive strip 120 can be adjusted for impedance matching.

Planar antenna resonating element 54-1A of the illustrative hybrid PIFA/slot antenna of FIG. 12 may have an F-shaped structure with shorter arm 98 and longer arm 100. The lengths of arms 98 and 100 and the dimensions of other structures such as slot 70 in ground plane 54-2 may be adjusted to tune the frequency coverage and antenna isolation properties of device 10. For example, length L of ground plane 54-2 may be configured so that the PIFA portion of the hybrid PIFA/slot antenna formed with resonating element 54-1A resonates at the 850/900 MHz GSM bands, thereby providing coverage at frequency $f_1$ of FIG. 11. The length of arm 100 may be selected to resonate at the 1800/1900 MHz bands, thereby helping the PIFA/slot antenna to provide coverage at frequency $f_2$ of FIG. 11. The perimeter of slot 70 may be configured to resonate at the 1800/1900 MHz bands, thereby reinforcing the resonance of arm 100 and further helping the PIFA/slot antenna to provide coverage at frequency $f_2$ of FIG. 11 (i.e., by improving performance from the solid line 63 to the dotted line 79 in the vicinity of frequency $f_2$, as shown in FIG. 6). If desired, the perimeter of slot 70 may be configured to resonate away from the 1800/1900 MHz bands (i.e., out-of-band). Slot 70 may also be used without the PIFA structures of FIG. 12 (i.e., as a pure slot antenna).

In a PIFA/slot configuration, arm 98 can serve as an isolation element that reduces interference between the hybrid PIFA/slot antenna formed from resonating element 54-1A and the L-shaped strip antenna formed from resonating element 54-1B. The dimensions of arm 98 can be configured to introduce an isolation maximum at a desired frequency, which is not present without the arm. It is believed that configuring the dimensions of arm 98 allows manipulation of the currents induced on the ground plane 54-2 from resonating element 54-1A. This manipulation can minimize induced currents around the signal and ground areas of resonating element 54-1B. Minimizing these currents in turn may reduce the signal coupling between the two antenna feeds. With this arrangement, arm 98 can be configured to resonate at a frequency that minimizes currents induced by arm 100 at the feed of the antenna formed from resonating element 54-1B (i.e., in the vicinity of paths 122 and 124).

Additionally, arm 98 can act as a radiating arm for element 54-1A. Its resonance can add to the bandwidth of element 54-1A and can improve in-band efficiency, even though its resonance may be different than that defined by slot 70 and arm 100. Typically an increase in bandwidth of radiating element 51-1A that reduces its frequency separation from element 51-1B would be detrimental to isolation. However, extra isolation afforded by arm 98 removes this negative effect and, moreover, provides significant improvement with respect to the isolation between elements 54-1A and 54-1B without arm 98.

As shown in FIG. 12, arms 98 and 100 of resonating element 54-1A and resonating element 54-1B may be mounted on support structure 102 (sometimes referred to as an antenna cap). Support structure 102 may be formed from plastic (e.g., ABS plastic) or other suitable dielectric. The surfaces of structure 102 may be flat or curved. The resonating elements 54-1A and 54-1B may be formed directly on support structure 102 or may be formed on a separate structure such as a flex circuit substrate that is attached to support structure 102 (as examples).

Resonating elements 54-1A and 54-B may be formed by any suitable antenna fabrication technique such as metal stamping, cutting, etching, or milling of conductive tape or other flexible structures, etching metal that has been sputter-deposited on plastic or other suitable substrates, printing from a conducive slurry (e.g., by screen printing techniques), patterning metal such as copper that makes up part of a flex circuit substrate that is attached to support 102 by adhesive, screws, or other suitable fastening mechanisms, etc.

A conductive path such as conductive strip 104 may be used to electrically connect the resonating element 54-1A to ground plane 54-2 at terminal 106. A screw or other fastener at terminal 106 may be used to electrically and mechanically connect strip 104 (and therefore resonating element 54-1A) to edge 96 of ground plane 54-2 (bezel 14). Conductive structures such as strip 104 and other such structures in the antennas may also be electrically connected to each other using conductive adhesive.

A coaxial cable such as cable 56A or other transmission line may be connected to the hybrid PIFA/slot antenna to transmit and receive radio-frequency signals. The coaxial cable or other transmission line may be connected to the structures of the hybrid PIFA/slot antenna using any suitable electrical and mechanical attachment mechanism. As shown in the illustrative arrangement of FIG. 12, mini UFL coaxial cable connector 110 may be used to connect coaxial cable 56A or other transmission lines to antenna conductor 112. A center conductor of the coaxial cable or other transmission line is connected to center connector 108 of connector 110. An outer braid ground conductor of the coaxial cable is electrically connected to ground plane 54-2 via connector 110 at point 115 (and, if desired, may be shorted to ground plane 54-2 at other attachment points upstream of connector 110). A bracket may be used to ground connector 110 to bezel 14 at this portion of the ground plane.

Conductor 108 may be electrically connected to antenna conductor 112. Conductor 112 may be formed from a conductive element such as a strip of metal (e.g., a copper trace) formed on a sidewall surface of support structure 102 (e.g., as part of the flex circuit that contains resonating elements 54-1A and 54-1B). Conductor 112 may be directly electrically connected to resonating element 54-1A (e.g., at portion 116) or may be electrically connected to resonating element 54-1A through tuning capacitor 114 or other suitable electrical components. The size of tuning capacitor 114 can be selected to tune antenna 54 and ensure that antenna 54 covers the frequency bands of interest for device 10.

Slot 70 may lie beneath resonating element 54-1A of FIG. 12. The signal from center conductor 108 may be routed to point 106 on ground plane 54-2 in the vicinity of slot 70 using a conductive path formed from antenna conductor 112, optional capacitor 114 or other such tuning components, antenna conductor 117, and antenna conductor 104.

The configuration of FIG. 12 allows a single coaxial cable or other transmission line path to simultaneously feed both the PIFA portion and the slot portion of the hybrid PIFA/slot antenna.

Grounding point 115 functions as the ground terminal for the slot antenna portion of the hybrid PIFA/slot antenna that is formed by slot 70 in ground plane 54-2. Point 106 serves as the signal terminal for the slot antenna portion of the hybrid PIFA/slot antenna. Signals are fed to point 106 via the path formed by conductive path 112, tuning element 114, path 117, and path 104.

For the PIFA portion of the hybrid PIFA/slot antenna, point 115 serves as antenna ground. Center conductor 108 and its attachment point to conductor 112 serve as the signal terminal for the PIFA. Conductor 112 serves as a feed conductor and feeds signals from signal terminal 108 to PIFA resonating element 54-1A.

In operation, both the PIFA portion and slot antenna portion of the hybrid PIFA/slot antenna contribute to the performance of the hybrid PIFA/slot antenna.

The PIFA functions of the hybrid PIFA/slot antenna are obtained by using point 115 as the PIFA ground terminal (as with terminal 62 of FIG. 7), using point 108 at which the coaxial center conductor connects to conductive structure 112 as the PIFA signal terminal (as with terminal 60 of FIG. 7), and using conductive structure 112 as the PIFA feed conductor (as with feed conductor 58 of FIG. 7). During operation, antenna conductor 112 serves to route radio-frequency signals from terminal 108 to resonating element 54-1A in the same way that conductor 58 routes radio-frequency signal from terminal 60 to resonating element 54-1A in FIGS. 4 and 5, whereas conductive line 104 serves to terminate the resonating element 54-1A to ground plane 54-2, as with grounding portion 61 of FIGS. 4 and 5.

The slot antenna functions of the hybrid PIFA/slot antenna are obtained by using grounding point 115 as the slot antenna ground terminal (as with terminal 86 of FIG. 8), using the conductive path formed of antenna conductor 112, tuning element 114, antenna conductor 117, and antenna conductor 104 as conductor 82 of FIG. 8 or conductor 82-2 of FIG. 10, and by using terminal 106 as the slot antenna signal terminal (as with terminal 84 of FIG. 8).

The illustrative configuration of FIG. 10 demonstrates how slot antenna ground terminal 92 and PIFA antenna ground terminal 88 may be formed at separate locations on ground plane 54-2. In the configuration of FIG. 12, a single coaxial cable may be used to feed both the PIFA portion of the antenna and the slot portion of the hybrid PIFA/slot antenna. This is because terminal 115 serves as both a PIFA ground terminal for the PIFA portion of the hybrid antenna and a slot antenna ground terminal for the slot antenna portion of the hybrid antenna. Because the ground terminals of the PIFA and slot antenna portions of the hybrid antenna are provided by a common ground terminal structure and because conductive paths 112, 117, and 104 serve to distribute radio-frequency signals to and from the resonating element 54-1A and ground plane 54-2 as needed for PIFA and slot antenna operations, a single transmission line (e.g., coaxial cable 56A) may be used to send and receive radio-frequency signals that are transmitted and received using both the PIFA and slot portions of the hybrid PIFA/slot antenna.

If desired, other antenna configurations may be used that support hybrid PIFA/slot operation. For example, the radio-frequency tuning capabilities of tuning capacitor 114 may be provided by a network of other suitable tuning components, such as one or more inductors, one or more resistors, direct shorting metal strip(s), capacitors, or combinations of such components. One or more tuning networks may also be connected to the hybrid antenna at different locations in the antenna structure. These configurations may be used with single-feed and multiple-feed transmission line arrangements.

Moreover, the location of the signal terminal and ground terminal in the hybrid PIFA/slot antenna may be different from that shown in FIG. 12. For example, terminals 115/108 and terminal 106 can be moved relative to the locations shown in FIG. 12, provided that the connecting conductors 112, 117, and 104 are suitably modified.

The PIFA portion of the hybrid PIFA/slot antenna can be provided using a substantially F-shaped conductive element having one or more arms such as arms 98 and 100 of FIG. 12 or using other arrangements (e.g., arms that are straight, serpentine, curved, have 90° bends, have 180° bends, etc.). The strip antenna formed with resonating element 54-1B can also be formed from conductors of other shapes. Use of different shapes for the arms or other portions of resonating elements 54-1A and 54-1B helps antenna designers to tailor the frequency response of antenna 54 to its desired frequencies of operation and maximize isolation. The sizes of the structures in resonating elements 54-1A and 54-1B can be adjusted as needed (e.g., to increase or decrease gain and/or bandwidth for a particular operating band, to improve isolation at a particular frequency, etc.).

Figure 13:
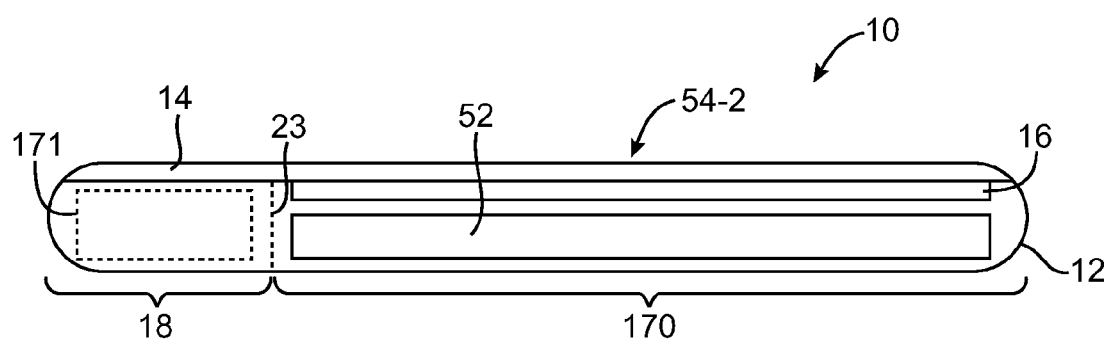
FIG. 13 is a cross-sectional view of an illustrative handheld electronic device in accordance with an embodiment of the present invention.

A somewhat schematic cross-sectional view of an illustrative handheld electronic device 10 in accordance with an embodiment of the present invention is shown in FIG. 13. As shown in FIG. 13, ground plane 54-2 may include bezel 14, display 16, housing 12, and other conductive components 52 in region 170 of device 10. Housing 12 in region 18 may be made up of a plastic cosmetic cap, which allows antenna resonating elements (e.g., elements 54-1A and 54-1B of FIG. 12) to be placed in region 171. Bezel 14 may be used to mount display 16 to housing 12. Electrical components 52 such as printed circuit boards, flex circuits, integrated circuits, batteries, and other devices may be mounted within portion 170 of device 10. The conductive structures within portion 170 can be electrically connected to one another so that they serve as ground for the antenna(s) in device 10. Bezel 14 can also be electrically connected to portion 170 (e.g., through welds, metal screws, metal clips, press-fit contact between adjacent metal parts, wires, etc.).

Figure 14:
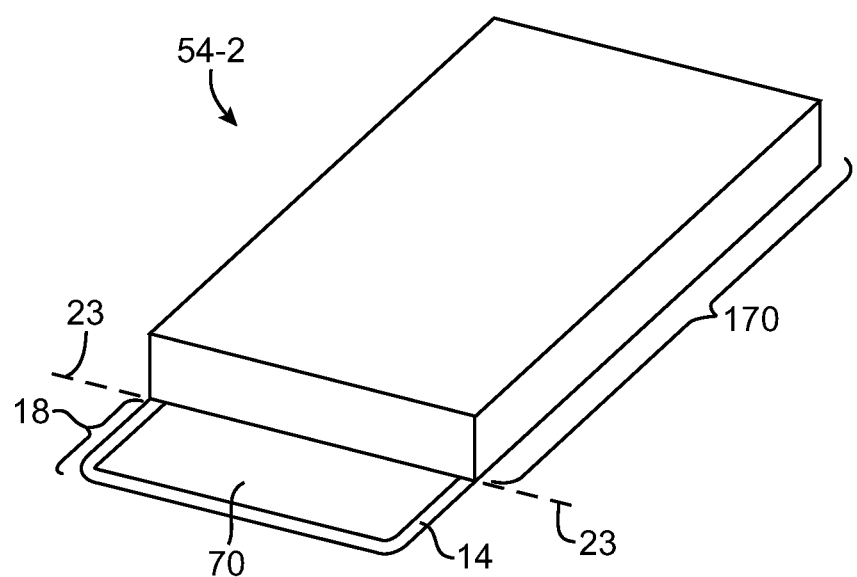
FIG. 14 is a somewhat simplified interior perspective view of an illustrative handheld electronic device with a conductive bezel in accordance with an embodiment of the present invention.

As a result of these electrical connections, bezel 14 and conductive portions of device 10 in region 170 form conductive ground plane 54-2, as shown in FIG. 14. The conductive portions of device 10 in region 170 may lie on one side of dotted line 23, whereas at least some of the conductive portions of bezel 14 may extend outwards from portions 170 and may lie on the other side of dotted line 23, thereby defining slot 70.

With one suitable configuration, slot 70 may have an area equal to the opening between bezel 14 and the conductive portions of device 10 that lie on the opposite side of dotted line 23. With other suitable configurations, one or more electrical components may overlap with the otherwise rectangular opening formed between bezel 14 and region 170 to form slot with smaller dimensions (rectangular or non-rectangular).

Figure 15:
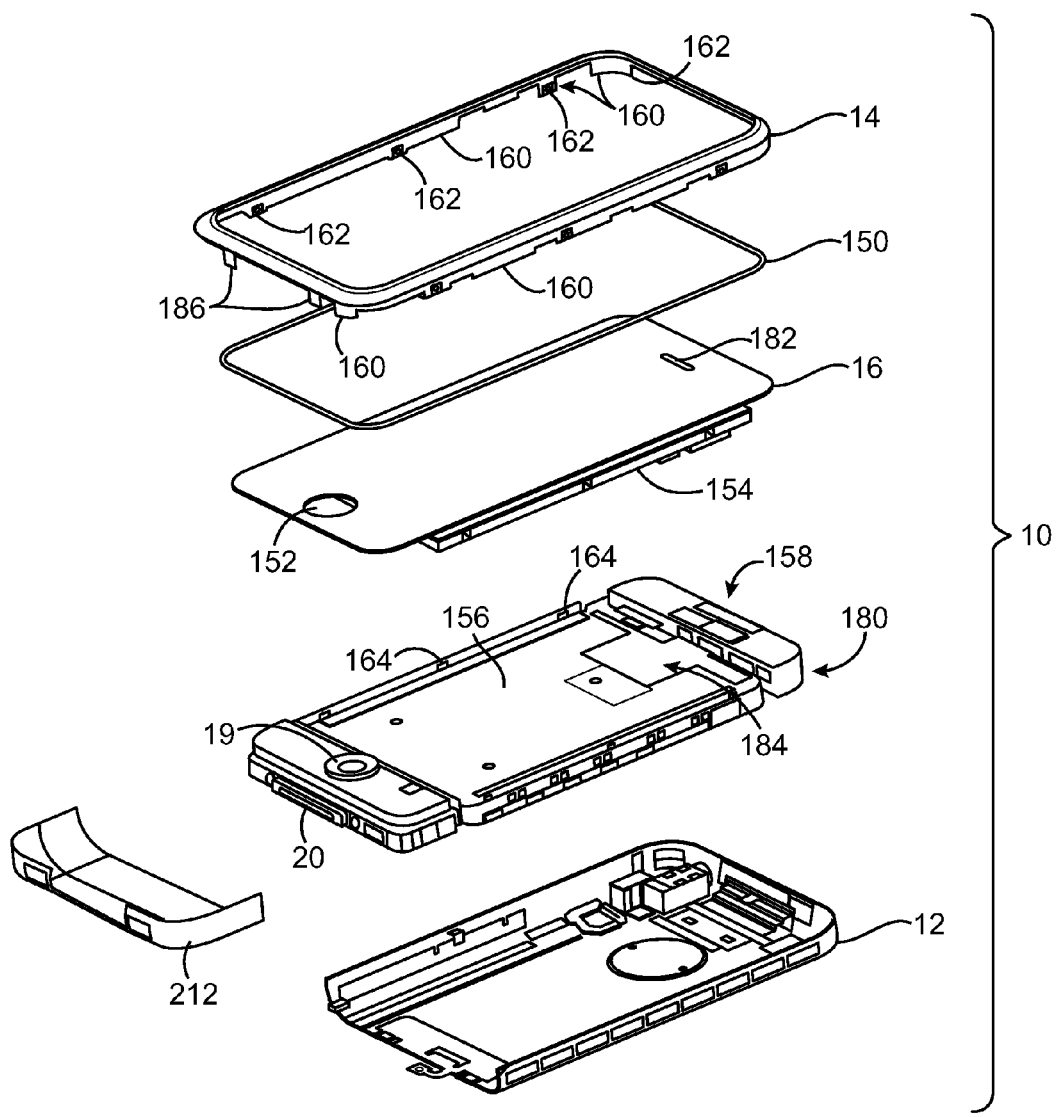
FIG. 15 is an exploded top perspective view of an illustrative handheld electronic device in accordance with an embodiment of the present invention.

An exploded perspective view of an illustrative handheld electronic device 10 in accordance with an embodiment of the present invention is shown in FIG. 15. As shown in FIG. 15, handheld electronic device 10 may have a conductive bezel such as conductive bezel 14 for securing display 16 or other such planar components to lower housing portion 12. A gasket such as gasket 150 may be interposed between bezel 14 and the exposed surface of display 16. Gasket 150 may be formed of silicone, polyester film, or other soft plastic (as an example). Gasket 150 may have any suitable cross-sectional shape. For example, gasket 150 may have a circular cross section (i.e., gasket 150 may be an o-ring having, for example, a 0.6 mm diameter), gasket 150 may have a rectangular cross-section, etc. Gasket 150 may help to seal the surface of display 16 to prevent debris from entering device 10, may help to center the display within bezel 14, and may help to hide potentially unsightly portions of display 16 from view. Display 16 may have one or more holes or cut-away portions. For example, display 16 may have hole 152 to accommodate button 19 and hole 182 to accommodate sound from a speaker.

If desired, display 16 may be touch sensitive. In touch sensitive arrangements, display 16 may have a touch sensor such as touch sensor 154 that is mounted below the uppermost surface of display screen 16 just above the liquid crystal display (LCD) element. Frame subassembly 180 may receive the display and touch sensor components associated with display 16. Antenna structures may be housed behind cosmetic plastic cap 212. Cosmetic plastic cap 212 may also cover components such as a microphone and speaker. Additional components (e.g., an additional speaker, audio jacks, a SIM card tray, buttons such as a hold button, volume button, ringer select button, and camera module, etc.) may be housed in region 158 at the opposite end of device 10.

Bezel 14 may be secured using any suitable technique (e.g., with prongs that mate with holes in a spring fastened to housing 12, with fasteners, with snaps, with adhesive, using welding techniques, using a combination of these approaches, etc.). As shown in FIG. 15, bezel 14 may have portions 160 that extend downwards. Portions 160 may take the form of prongs, rails, and other protruding features. Portions 160 may be configured so that the outer perimeter of portions 160 mates with structures along the inner perimeter of housing 12 when frame subassembly 180 is mounted in housing 12 and when bezel 14 is used to attach display 16 to device 10.

Portions 160 may have screw holes 162 through which screws may mate with corresponding threaded standoffs when attaching bezel 14 to housing subassembly 180. The screws and other conductive structures (e.g., welds, wires, springs, brackets, etc.) may be used to electrically connect bezel 14 to grounded elements within device 10. For ease of assembly, frame subassembly 180 may have tabs, snaps, or other attachment structures. For example, frame subassembly 180 may have holes 164 that receive mating fingers on display 16. Prongs (ears) 186 may receive screws that are used in securing and grounding bezel 14 to dock connector 20.

Frame subassembly 180 may include a frame that is based on a thin (e.g., 0.3 mm) stainless steel layer onto which plastic features have been overmolded and attached (e.g., with a heat staking process) or other suitable structural components. Frame top 156 may be recessed within frame subassembly 180 to accommodate the touch sensor and other portions 154 of display 16. Sensors such as an ambient light sensor and a proximity sensor may be mounted in region 184.

Figure 16:
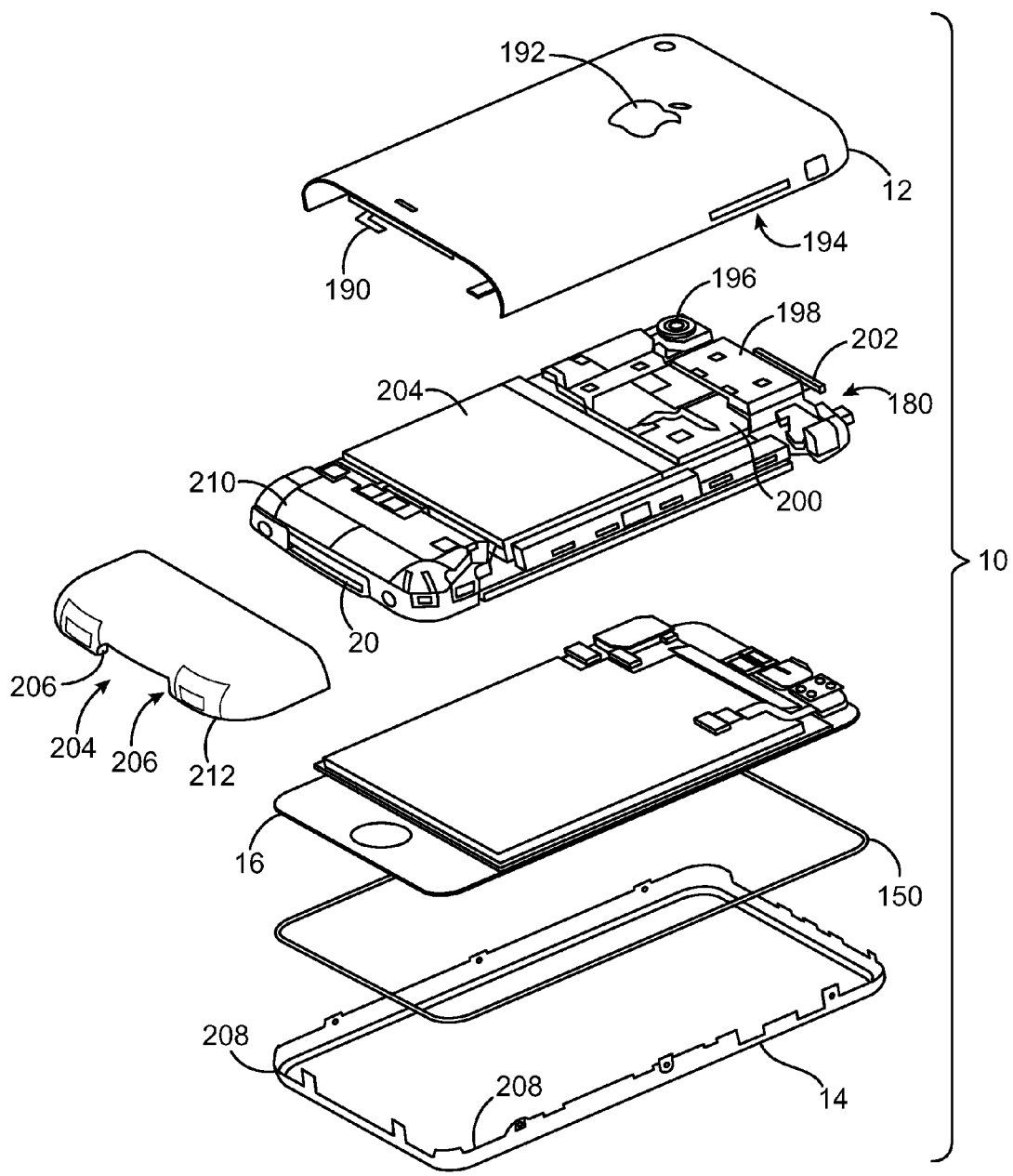
FIG. 16 is an exploded bottom perspective view of an illustrative handheld electronic device in accordance with an embodiment of the present invention.

An exploded perspective rear view of the illustrative device of FIG. 15 is shown in FIG. 16. As shown in FIG. 16, housing 12 may have ground tab 190. Tab 190 may be used to help ground antenna resonating element 54-1A to conductive housing 12. To ensure that tab 190 makes good electrical contact to housing 12, anodized portions of housing 12 may be removed using laser etching.

Logo 192 may be formed of a metal such as stainless steel (as an example). Logo 192 may be attached to housing 12 using adhesive or other suitable attachment mechanisms. Buttons such as a volume button, hold button, and ringer mode select button may be located in region 194.

Camera module 196 may be attached to frame subassembly 180. Transceivers, such as transceiver 52A and 52B of FIG. 3 may also be attached to frame subassembly 180. As shown in FIG. 16, transceiver 52B may be housed in conductive can 198 and transceiver 52A may be housed in conductive can 200. Cans such as cans 198 and 200 serve as radio-frequency shielding enclosures that reduce electromagnetic interference (EMI). SIM tray 202 on frame subassembly 180 may be used to receive SIM cards.

Cosmetic cap 212 may have a recess such as recess 204 that accommodates dock connector 20 when cap 212 is attached to device 10. Cap 212 may have inwardly protruding snap keys (plastic beams) that are guided through holes in the frame during assembly and that snap into bezel 14, thereby preventing cap 212 from becoming detached from device 10 during use. Bezel 14 may have rails 208 that guide cosmetic cap 212 during assembly and that help to retain cap 212 on device 10.

Antenna resonating elements such as antenna resonating elements 54-1A and 54-1B may be formed from conductive traces on flex circuit 210. Flex circuit 210 may be mounted on a plastic antenna cap (as an example).

Figure 17:
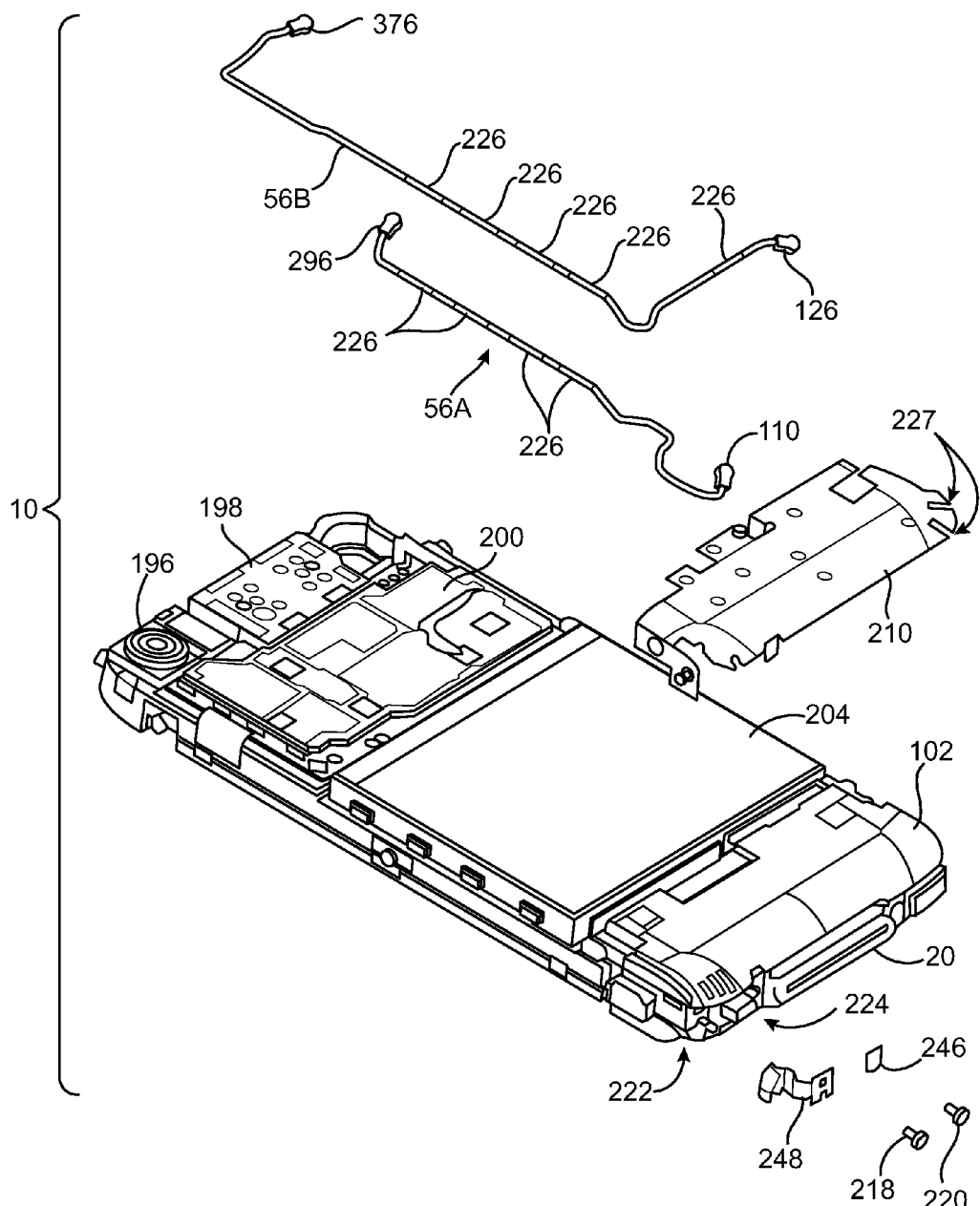
FIG. 17 is an exploded perspective bottom interior view of an illustrative handheld electronic device showing how a handheld electronic device may have coaxial cable transmission lines and flex circuit antenna resonating elements in accordance with an embodiment of the present invention.

The exploded view of device 10 in FIG. 17 shows an illustrative arrangement for coaxial cables 56A and 56B and shows an illustrative shape for flex circuit 210. Flex circuit 210 may have slots 227 and other features to help flex circuit 210 conform to the curved surface of antenna cap 102. Screw 218 and clip 248 (also sometimes referred to as a bracket or spring) may be used to ground coaxial cable connector 110 to bezel 14 at location 222. Screw 220 and clip 246 (also sometimes referred to as a bracket or spring) may be used to ground bezel 14 to dock connector 20 at location 224. Clip 246 may also be electrically connected to conductive strip 104 (FIG. 12).

Cables 56A and 56B may have exposed portions at which their outer ground conductors (e.g., braid conductors or other outer conductors) are exposed (i.e., not covered by plastic or other insulating materials). These exposed portions allow cables 56A and 56B to be grounded to bezel 14 and the rest of ground plane 52-4 along their length. This provides good grounding for cables 56A and 56B and prevents cables 56A and 56B from acting as antenna elements. Without grounding along their lengths, cables 56A and 56B might radiate radio-frequency signals reflected back from antenna resonating elements 52-1A and 52-1B.

The exposed conductive portions of cables 56A and 56B form electrical connections between the ground conductors of the cables and ground plane 54-2. Cables 56A and 56B may be bare of insulator along their entire lengths or along only certain isolated segments. For example, cables 56A and 56B may have no insulator directly under ferrules 226. Ferrules 226 (or other suitable conductive fasteners) may be connected to the conductive braid in the exposed segments of cables 56A and 56B by crimping. One or more brackets or other suitable conductive fastening members (sometimes referred to as J-brackets) may be used to structurally and electrically connect ferrules 226 to ground plane 54-2 (i.e., by shorting ferrules 226 to conductive portions of device 10 such as the metal portions of frame subassembly 180 and bezel 14).

Figure 18:
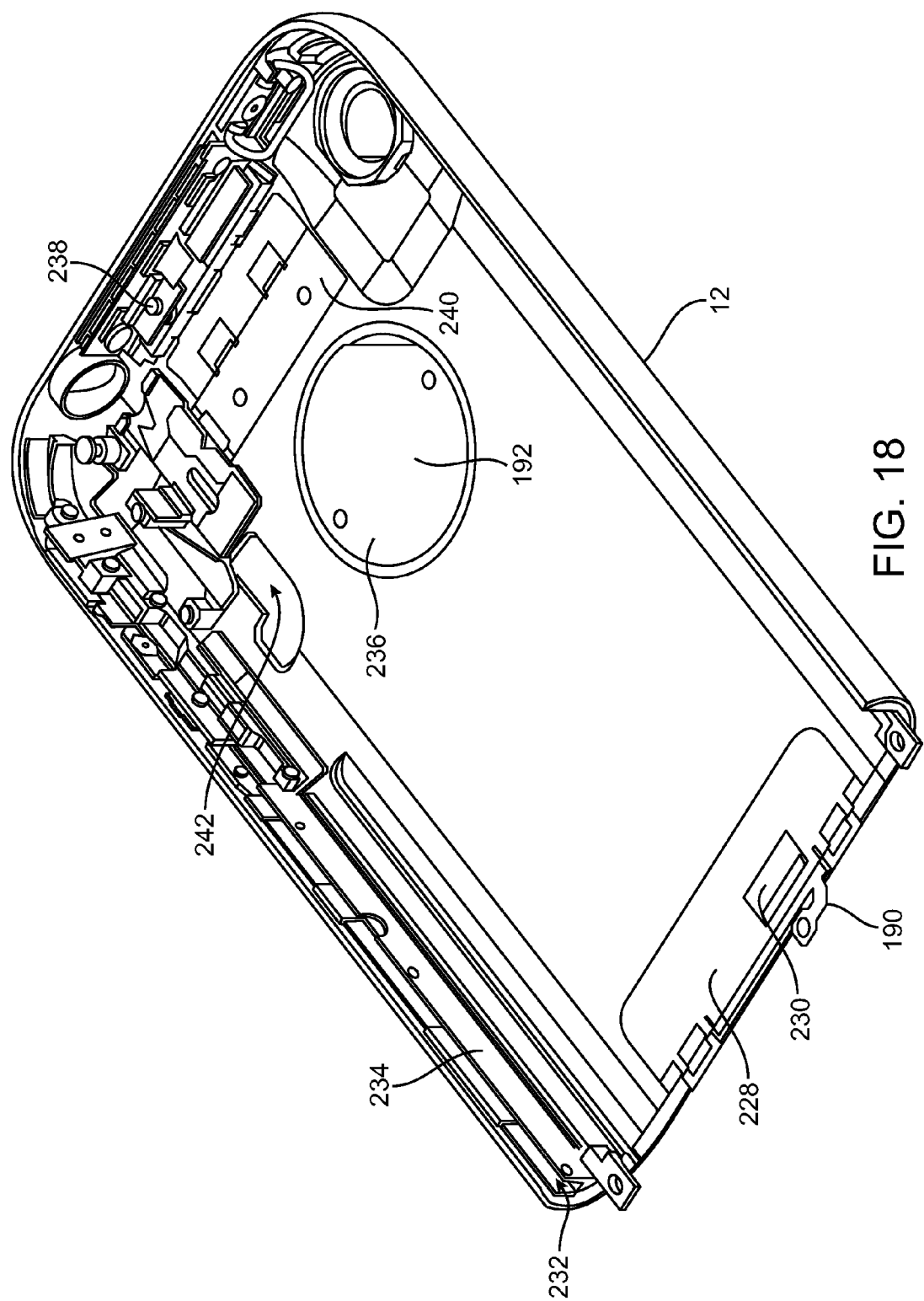
FIG. 18 is a perspective interior view of an illustrative rear housing portion in accordance with an embodiment of the present invention.

An interior perspective view of a conductive housing portion 12 is shown in FIG. 18. As shown in FIG. 18 ground tab 190 may be part of a ground bracket 228. Ground bracket 228 may have a tab under region 230 that slides into a mating channel in housing 12. The anodized surface of housing 12 in this region may be stripped using laser etching, thereby allowing the tab in region 230 to make good electrical contact between bracket 228 (and its tab 190) and housing 12.

Metal strips such as strip 234, which are sometimes referred to as brackets or rails, may be formed of cast magnesium and may be attached to housing 12 using adhesive (as an example). For example, a rubbery glue may be used to attached strips such as strip 234 to housing 12. Metal strips such as strip 234 may be spaced apart from the sidewalls of housing 12 to form channels such as channel 232. A spring in each channel may have holes that engage mating hooks on bezel 14.

Bracket 242 may be used to hold an audio jack, vibrator, and a button wire flex circuit. Bracket 242 may be formed from a metal such as cast magnesium.

Top ground bracket 240 may have fingers that engage housing 12. The anodized surface of housing 12 may be removed by laser etching in the finger contact region to ensure that ground bracket 240 makes good electrical contact to housing 12. Ground plane components in device 10 that are placed on top of ground bracket 240 may make contact to housing 12 through ground bracket 240.

Logo 192 may be shorted to housing 12 to ensure that logo 192 does not electrically float relative to housing 12. Laser etching may be used to remove a portion of the anodized surface of housing 12 under region 236 to ensure a good electrical contact between logo 192 and housing 12. Logo 192 may be adhesively bonded to housing 12. In one embodiment, logo 192 may be bonded to housing 12 using a thermal bonding agent and an epoxy resin bonding agent.

Pin 238 may serve as a pivot for a SIM card ejection tray arm.

Figure 19:
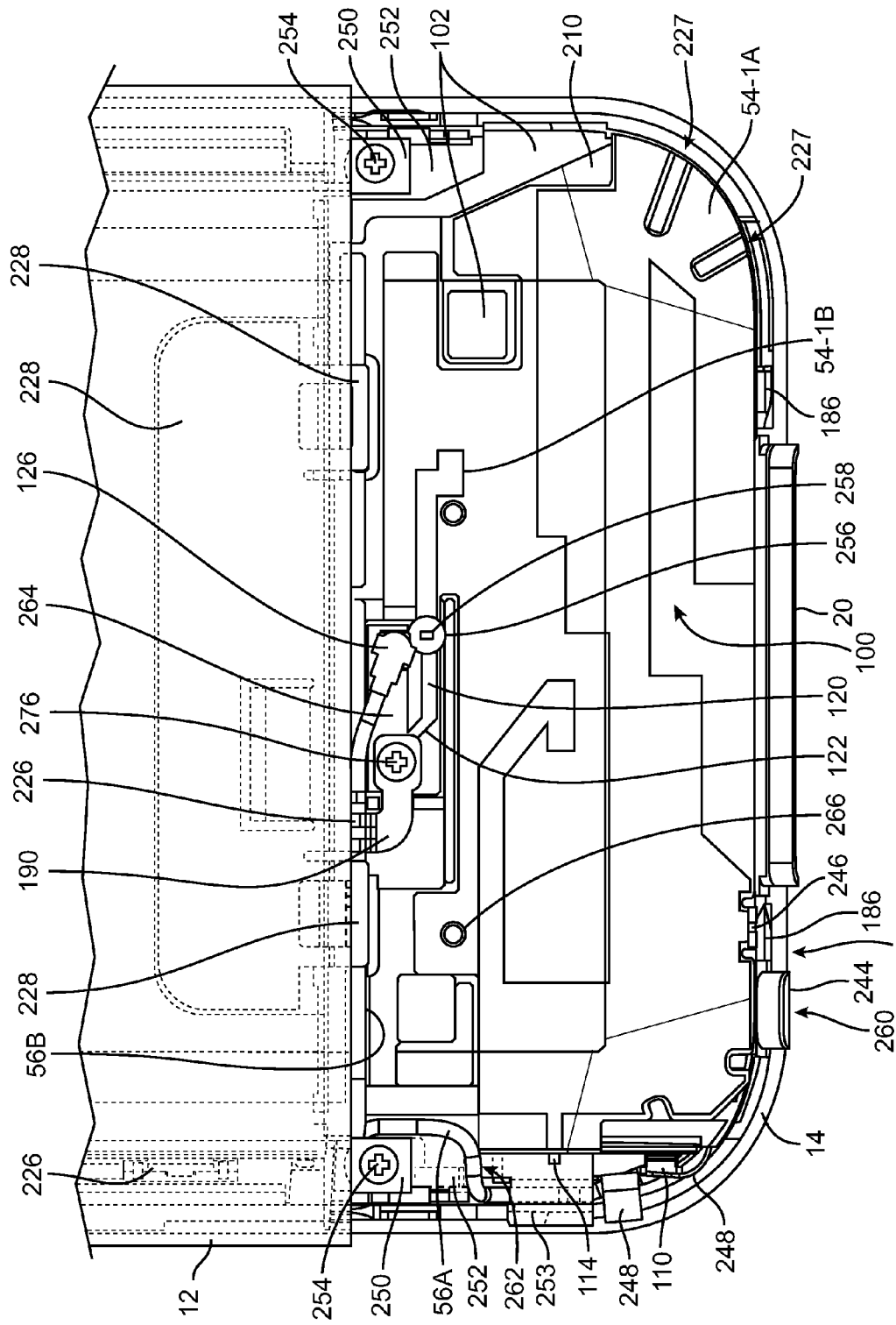
FIG. 19 is a top view of an illustrative handheld electronic device in which a cosmetic plastic cap has been removed to expose antenna resonating elements in accordance with an embodiment of the present invention.

A top view of the end of an illustrative device 10 with its cosmetic end cap removed is shown in FIG. 19. Microphone rubber boot 244 may form a seal between the cosmetic cap and microphone inlet port 260. Microphone inlet port 260 may be used to channel sound to a microphone in device 10. Electrical connections may be made at locations 254. A screw may be used at each location 254. The screws may engage threaded portions of a dock flange associated with dock connector 20. The screws pass through bezel tabs 186 on bezel 14. On the left size of dock connector 20 (in the orientation of FIG. 19), the screw also passes through spring 246 and flex circuit 210. Spring 246 may be formed from a metal such as stainless steel. A conductive trace (conductive strip 104 of FIG. 12) is located adjacent to spring 246. When the screw is screwed into the frame, the spring 246 presses outwards between the flex circuit trace and bezel tab 186, thereby making good electrical contact at point 106 (FIG. 12) between bezel 14 and conductive strip 104 (FIG. 12).

Coaxial cable connector 110 may be snapped into a mating connector on flex circuit 210. Ground clip or bracket 248 (which is shown in a partially uncompressed state in FIG. 19) may be used to help hold connector 110 in place and may be used to form an electrical contact to bezel (see point 115 of FIG. 12).

Frame portion 253 may be used to support cosmetic cap 212 in the event that external pressure is placed on cosmetic cap 212 (i.e., in the event that device 10 is inadvertently dropped).

Brackets 250 may be connected to or formed as part of brackets 234 of FIG. 18 and may be screwed into the frame of device 10 (e.g., frame portions 252) using screws 254.

Capacitor 258 may form part of path 124 (FIG. 12). Epoxy 256 may be used to provide capacitor 258 with structural support (i.e., to protect capacitor 258 from cracking during assembly). Capacitor 114 may also be protected using epoxy.

Flex circuit 210 may be mounted to antenna cap 102 using pressure sensitive adhesive. Slots 227 allow the conductive traces of resonating element such as resonating element 54-1A to conform to the curved surface of cap 102. The conductive traces may be formed of copper or other suitable conductive material.

At location 262, coaxial cable 56A may be routed away from the antenna traces, so that cable 56A may be maintained closer to ground plane 54-2 (e.g., bezel 14) and further away from resonating element 54-1B.

Grounding clip 190 may engage ferrule 226 to ensure that ferrule 226 and coaxial cable 56B are grounded to housing 12. Screw 276 may be used to hold down grounding clip 190 on antenna cap 102. Trace 264 may form part of the ground for antenna resonating element 54-1B in conjunction with ground tab 190. Conductive branches 120 and 122 may form part of antenna resonating element 54-1B.

Alignment posts 266 may mate with corresponding holes in flex circuit 212. This helps to align flex circuit 210 to antenna cap 102 during assembly.

Figure 20:
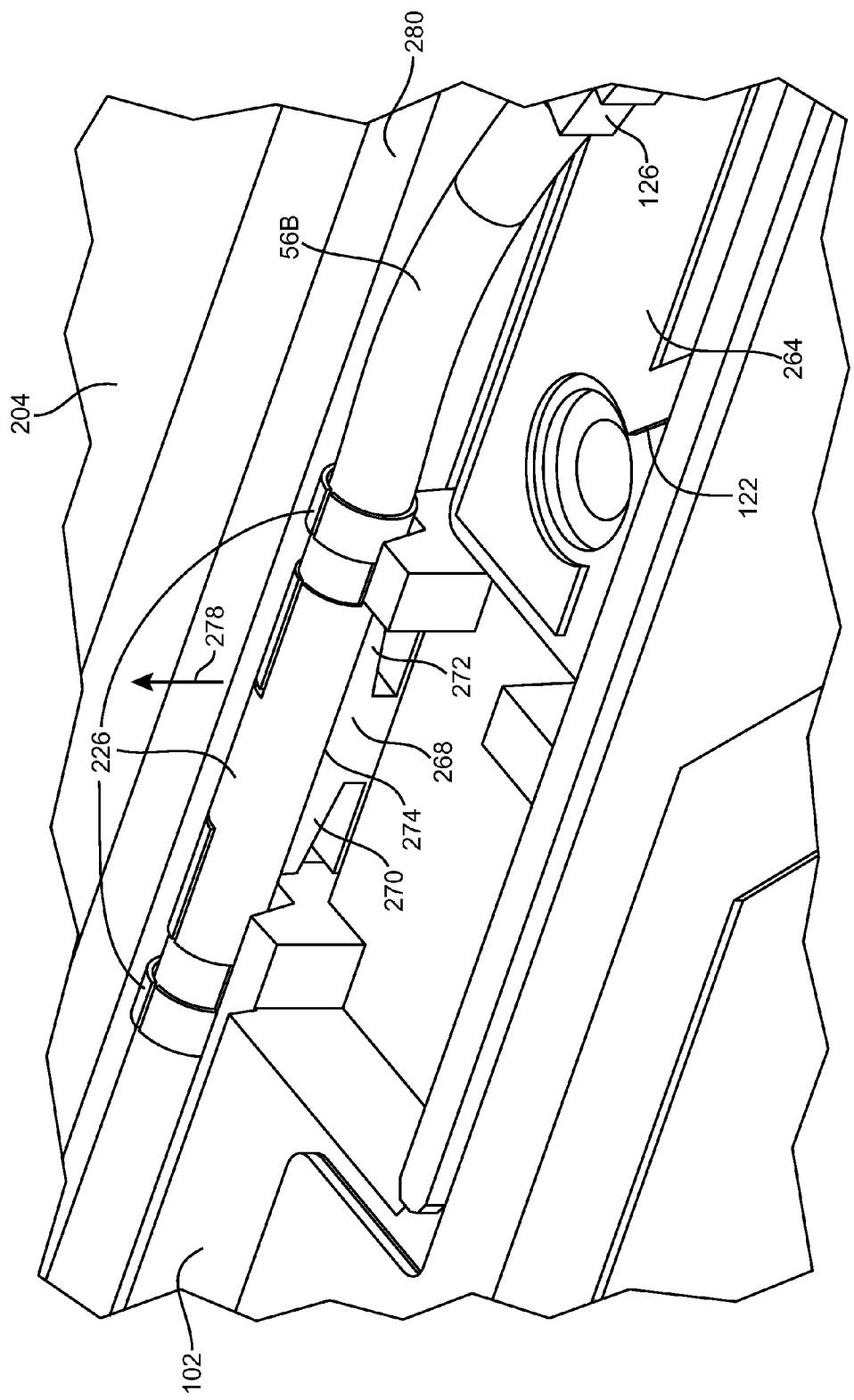
FIG. 20 is a perspective view of a portion of an illustrative antenna coaxial cable to which a conductive fastener such as a ferule has been attached in accordance with an embodiment of the present invention.

Ferrule 226 of FIG. 19 is shown in more detail in FIG. 20. As shown in FIG. 20, a biasing member such as spring 268 may be located between part of antenna cap 102 and underside 274 of ferrule 226 adjacent to frame cross member 280. Spring 268 may be formed of urethane or other suitable resilient material. During assembly, ferrule 226 may be pushed downwards against spring 268, causing arms 270 and 272 to splay outwards away from each other. When under tension in this way, spring 268 biases ferrule 226 upwards in direction 278 against tab 190 of bracket 228 (FIG. 19), so that ferrule 226 (i.e., the ground conductor of coaxial cable 56B) is shorted to ground plane 54-2 (e.g., housing 12).

Figure 21:
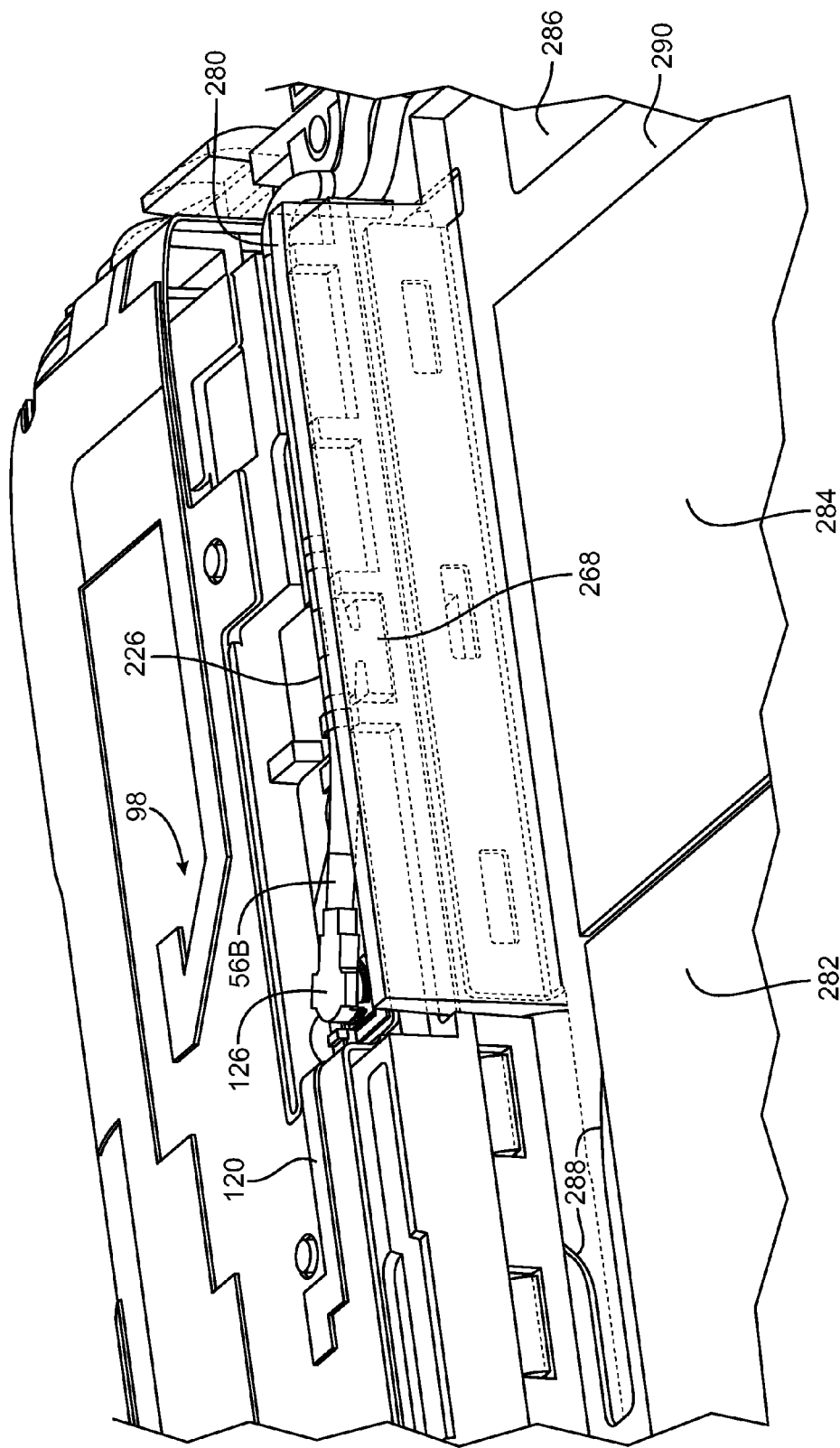
FIG. 21 is a perspective interior view of a portion of an illustrative handheld electronic device showing how a data channel antenna may be connected to a coaxial cable transmission line in accordance with an embodiment of the present invention.

Spring 268 is also shown (behind frame cross member 280) in the perspective view of FIG. 21. Polyester film 282 may be used to protect flex circuit 288 from damage. Adhesive 284 may be used to mount battery 204 to frame 290. Polyester film 286 may be used to protect battery 204 (e.g., by preventing puncture damage to the relatively thin battery case).

Figure 22:
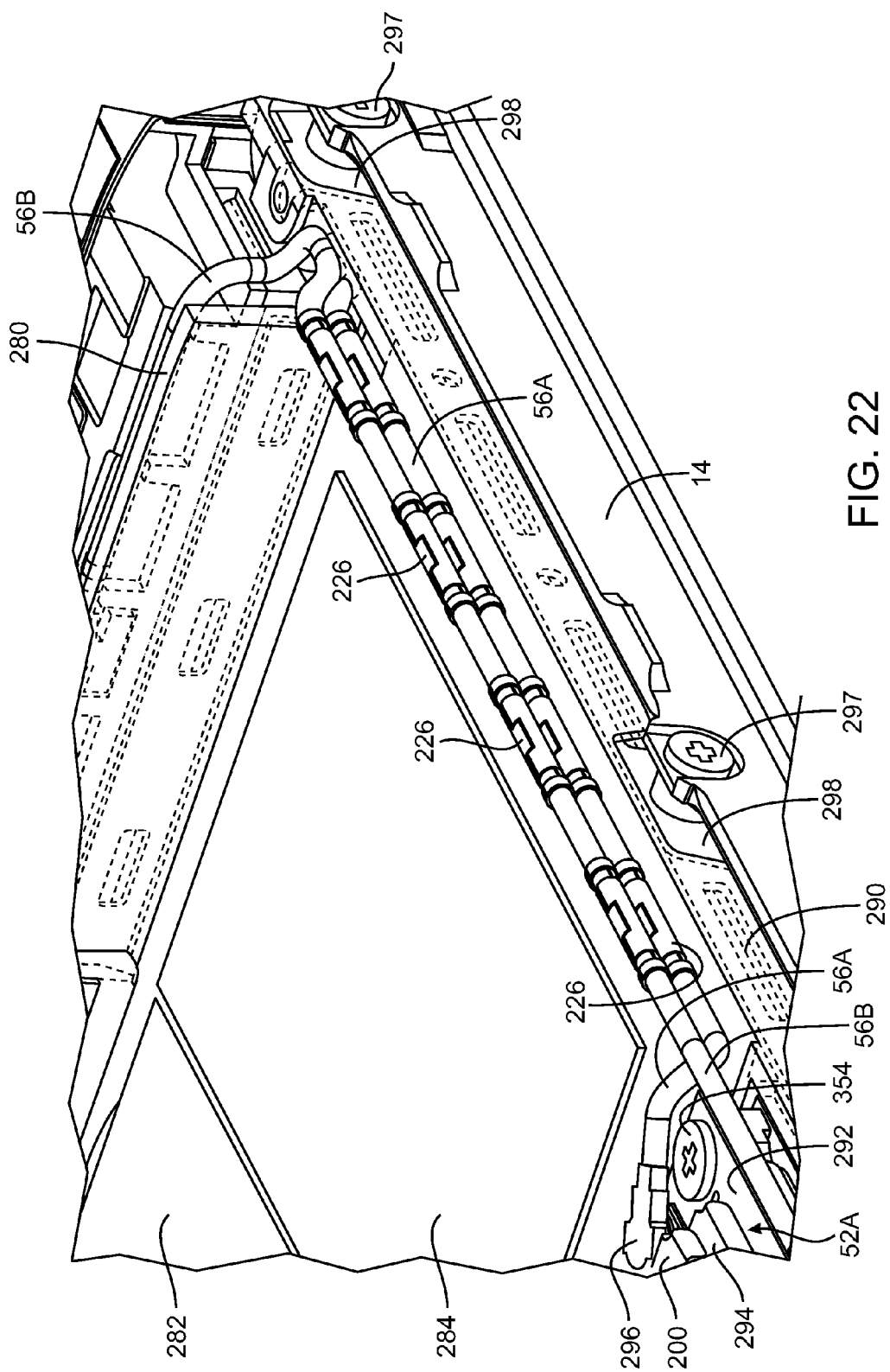
FIG. 22 is a perspective view of a portion of an illustrative handheld electronic device in which two antenna coaxial cables have been routed together along the edge of the device in accordance with an embodiment of the present invention.

As shown in FIG. 22, coaxial cable 56A may be connected to printed circuit board 292 of transceiver 52A using coaxial cable connector 296. Electromagnetic shielding cases 200 and 294 may be used to provide radio-frequency EMI shielding for the circuitry of transceiver 52A. For example, shield 294 may be a metal shield that is soldered to printed circuit board 292 to shield one or more transceiver integrated circuits, whereas shield 200 may be a metal shield that is attached by snaps to shield discrete components associated with transceiver 52A.

Frame 290 may have a sheet metal core (e.g., a stainless steel sheet of 0.3 mm thickness) that is surrounded by a plastic overmold. The overmolded plastic parts that make up frame 290 may provide detailed structures that would be difficult to fabricate from stainless steel. Metal screws 297 may be used to secure conductive bezel 14 to exposed sheet metal portions 298 of frame 290, thereby shorting bezel 14 to frame 290 and ensuring that both bezel 14 and frame 290 form part of ground plane 54-2.

Ferrules 226 or other suitable conductive fasteners may be electrically connected to frame 290 and bezel 14 using a bracket (e.g., a J-bracket) or other suitable conductive member. The bracket may be connected to ferrules 226 by soldering, welding, or by physical contact (i.e., by crimping the bracket to ferrules 226 with or without soldering or welding). With one suitable arrangement, the conductive member is formed of metal (e.g., magnesium or aluminum) and has bendable extensions (i.e., fingers). The bendable extensions may be crimped over the ferrules or other conductive fasteners during assembly to attach the conductive member to the ferrules and the coaxial cables. If device 10 needs to be reworked or recycled, the coaxial cables may be released from the conductive member and device 10 by bending the extensions away from the conductive fasteners on the cables.

Figure 23:
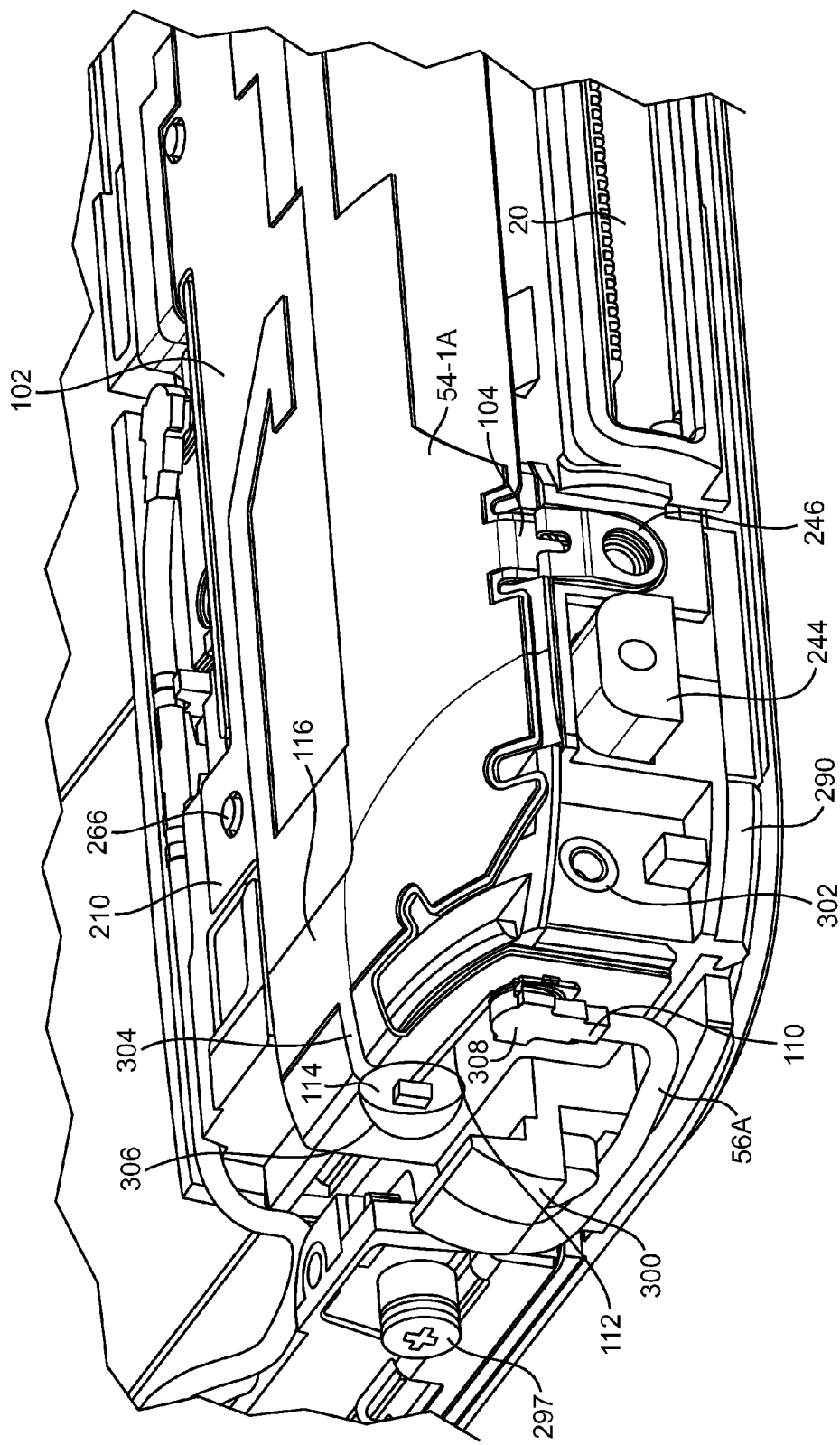
FIG. 23 is a perspective view of an interior end portion of an illustrative handheld electronic device showing how a coaxial cable antenna transmission line may be connected to an antenna in accordance with an embodiment of the present invention.

A detailed view of an illustrative arrangement for forming a connection between coaxial cable 56A and the antenna structures of device 10 is shown in FIG. 23. As shown in FIG. 23, coaxial cable 56A may be connected to flex circuit 210 using a coaxial cable connector 110. The center conductor 108 (FIG. 12) of cable 56A and connector 110 may be connected to antenna conductor 112. Capacitor 114 or other tuning components may be used to connect conductor 112 to conductor 304. Conductor 304 may be connected to portion 116 of antenna resonating element 54-1A. As with the traces that make up antenna resonating element 54-1A on the top surface of flex circuit 210, conductors 112 and 114 may be formed as traces on flex circuit 210. If desired, flex circuit 210 may have traces on two sides. Use of a single-sided flex circuit arrangement, in which traces 112, 114, and the other antenna traces are formed on a single side of flex circuit 210 may help to reduce the cost and complexity of the antenna. Flex circuit traces may be formed of any suitable conductor such as copper.

Epoxy 306 may be used to provide structural support for capacitor 114 (e.g., to prevent capacitor 114 from being damaged during assembly). Adhesive 308 may be used to attach flex circuit 210 to the end face of antenna cap 102. Frame 290 may have screw hole 302. Bracket 248 (FIGS. 17 and 19) may be attached to frame 290 by screwing a screw (i.e., screw 218 of FIG. 17) into hole 302. Spring 246 can be attached to dock connector 20 using screw 220 of FIG. 17. When screw 220 has been screwed into place (through one of bezel prongs 186 of FIG. 15, bezel 14, clip 246, conductive strip 104 of antenna resonating element 54-1A, and dock connector 20 are shorted together as described in connection with forming the connections at point 106 of ground plane 54-2 in FIG. 12.

Figure 24:
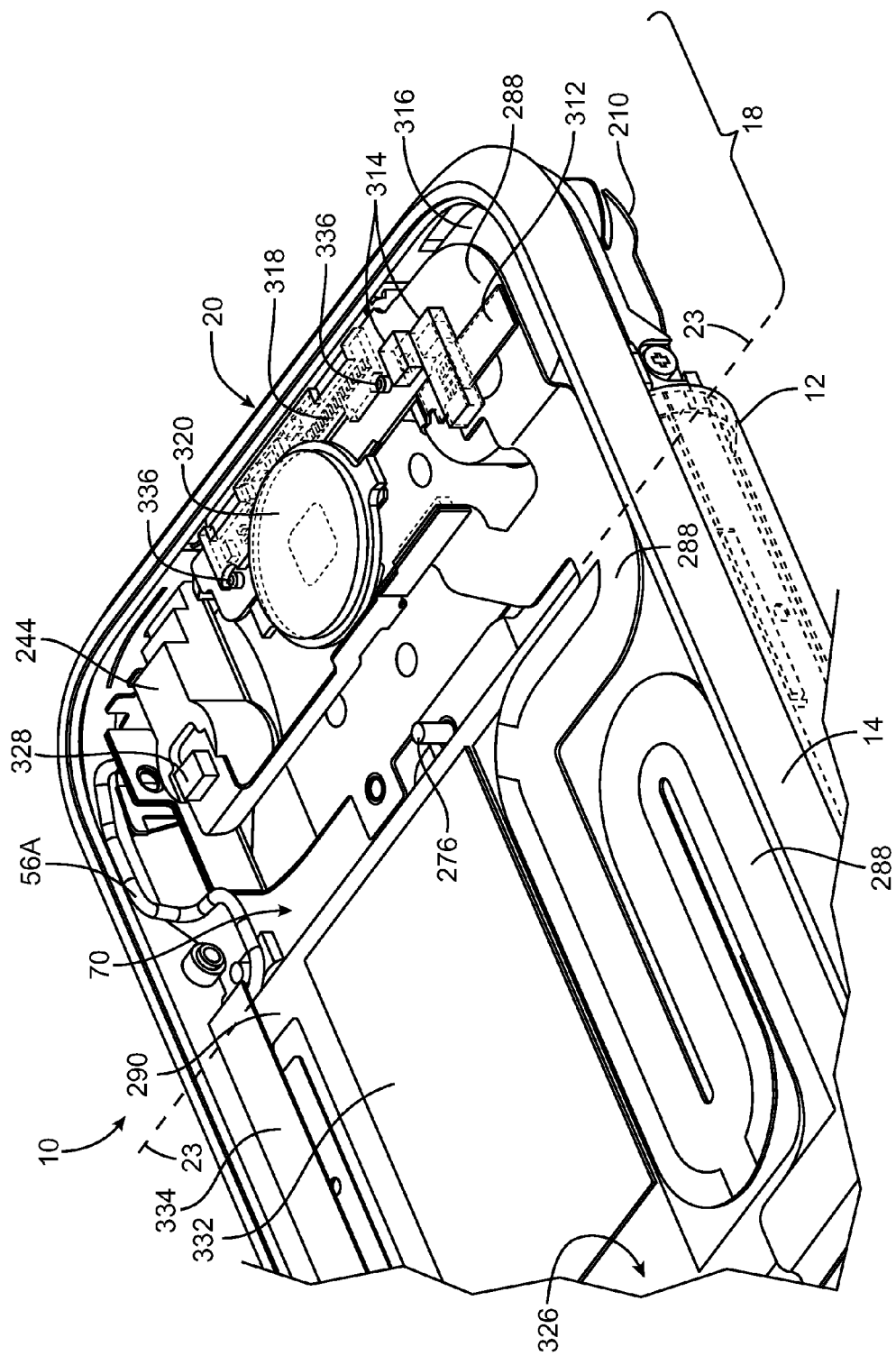
FIG. 24 is a perspective view of a portion of the interior of an illustrative handheld electronic device showing how a flex circuit may be used to route connector signals around the edge of the handheld electronic device and showing the location of components such as a microphone, menu button, and speaker module in accordance with an embodiment of the present invention.

A perspective top view of device 10 with internal structures (such as display 16) removed is shown in FIG. 24. As shown in FIG. 24, flex circuit 288 may be used to form a bus that conveys signals from dock connector 20 to processing circuitry located towards end 326 of device 10. The overall shape of antenna slot 70 is formed by the boundaries of bezel 14 and frame 290 (which lies along dotted line 23). This overall shape can be influenced by electrical components that lie within its boundaries. Certain components, such as microphone 244 and speaker 316 may be isolated from the antenna using inductors (as an example). Other components (e.g., button 320) may be isolated from the antenna using inductors or resistors (as an example). Isolating components in this way can eliminate or substantially reduce any impact these components might have on the effective area of slot 70.

Dock connector 20 may contain metal that overlaps the otherwise rectangular shape of slot 70. Moreover, flex circuit 288 contains signal traces and ground traces. The conductive material in these traces acts as a portion of the ground plane of device 10 and therefore can alter the effective shape of slot 70. As shown in the illustrative arrangement of FIG. 24, flex circuit 288 may be routed around the edge of slot 70 immediately adjacent to bezel 14.

Speaker flex circuit 312 may be used to route signals from flex circuit 288 to speaker module 316. Speaker flex circuit 312 may be connected to flex circuit bus 288 by soldering (as an example). Components 314 may include isolation inductors and other electrical components for supporting the operation of speaker module 316. Electrical components 318 may be used to support the operation of dock connector 20.

Stiffener 322 may be used to support flex circuit 288 as flex circuit 288 passes towards microphone 244 and button 320. A flex circuit extension (i.e., a tail of flex circuit 288) in the vicinity of region 324 may be used to connect the leads of menu button 320 to flex circuit 288. Menu button 320 may be a dome switch or any other suitable user interface control. Components 330 may be formed using inductors (e.g., traditional wire-wrapped inductors or ferrite chip inductors) or resistors. Components 330 may be used to help isolate button 320 from the antennas of device 10 (e.g., to prevent button 320 from significantly influencing the shape of slot 70). Electrical components 328 may include inductors for isolating microphone 244 from the antennas of device 10.

Pressure sensitive adhesive 332 may be used to mount battery 204. Foam 334 may help to prevent damage to display 16. Alignment posts 336 on dock connector 20 may be used to help align flex circuit 288.

Figure 25:
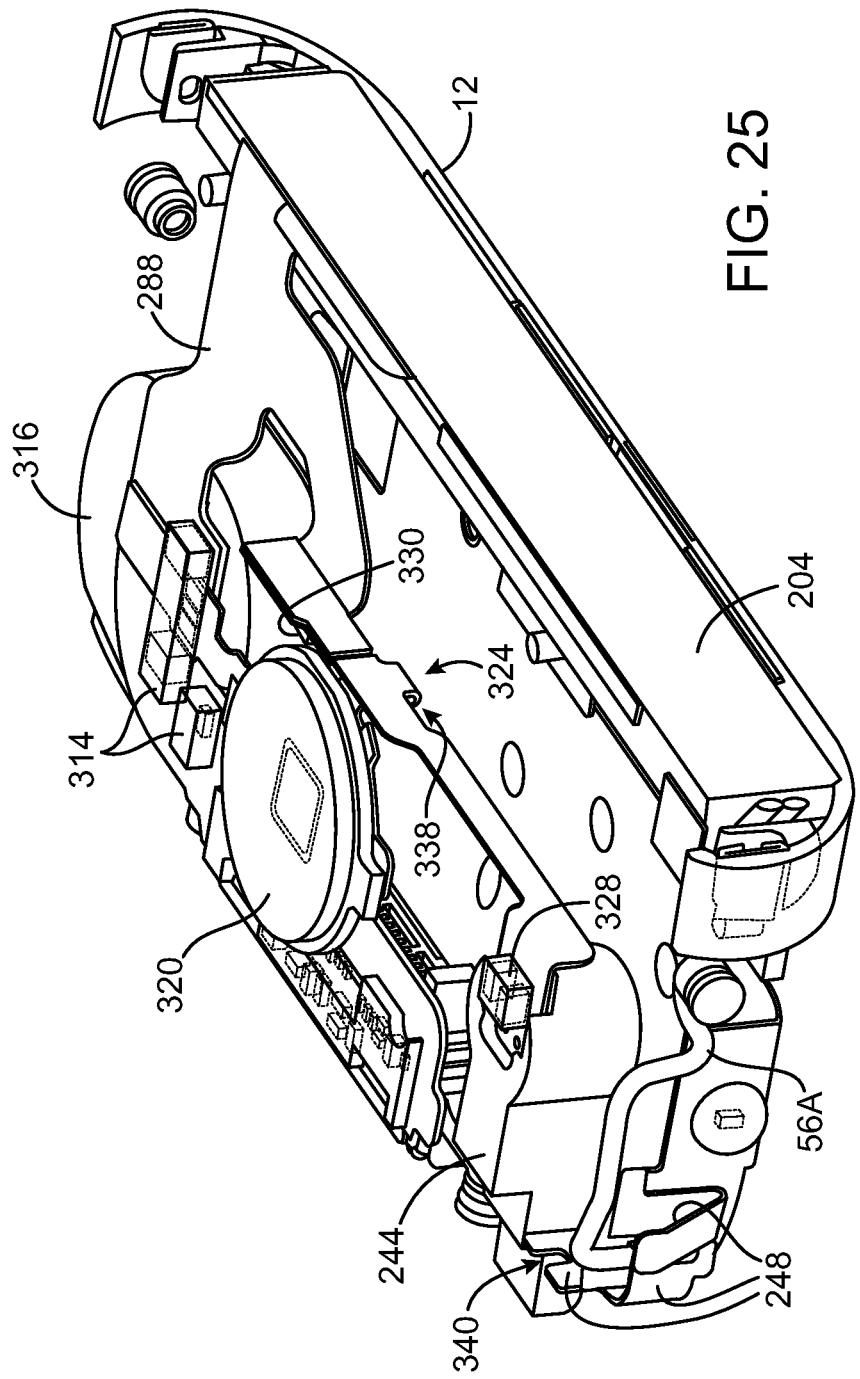
FIG. 25 is a partially sectional perspective view of a portion of the interior of an illustrative handheld electronic device showing the location of an antenna grounding bracket that may be used to make contact between antenna flex circuit traces and a bezel on the handheld electronic device in accordance with an embodiment of the present invention.

As shown in FIG. 25, extension 338 of flex circuit 288 may be used to make electrical connections between flex circuit 288 and button 320. Ground bracket 248 may have an indentation such as indentation 340 that mates with a rib on frame 290.

Figure 26:
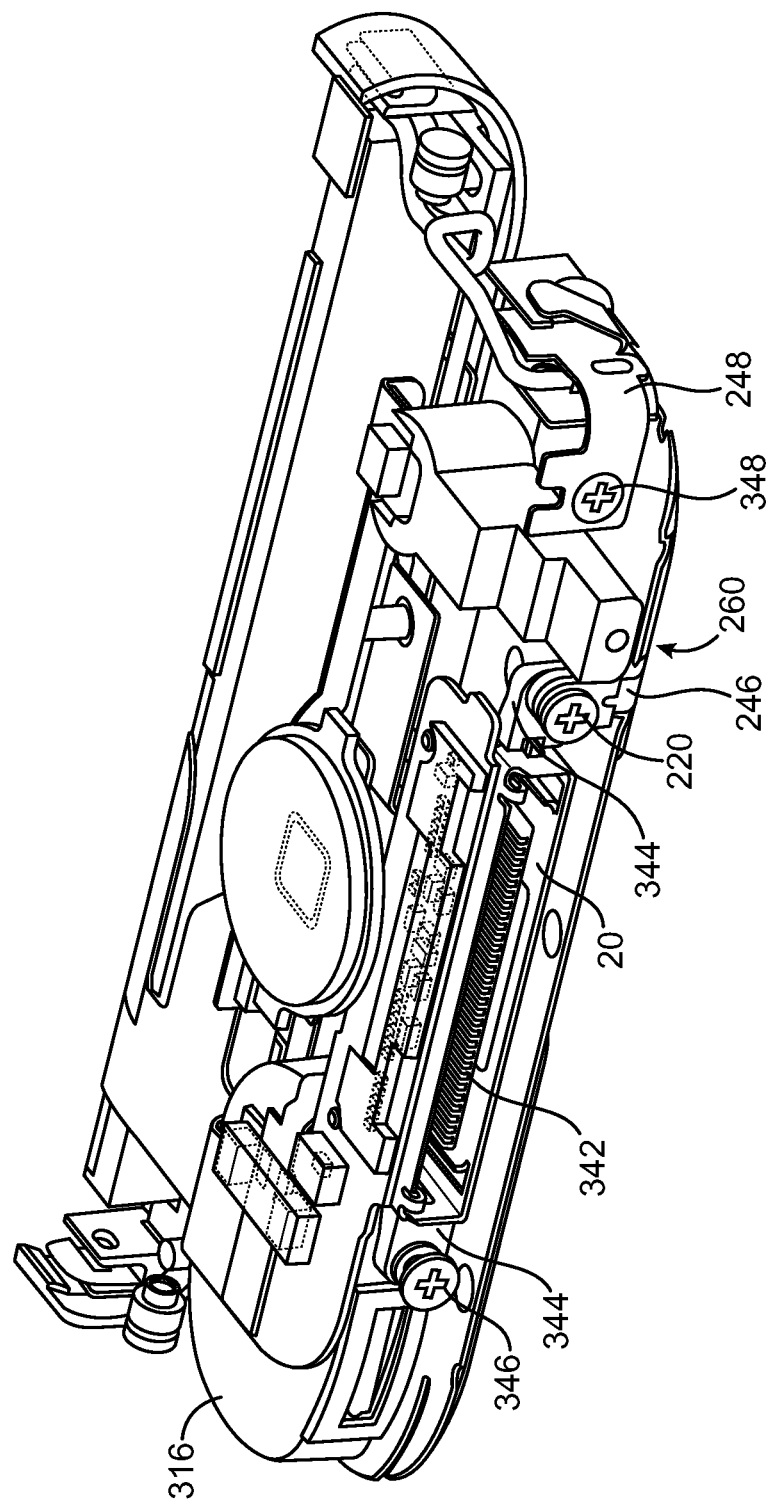
FIG. 26 is a perspective view of an end portion of an illustrative handheld electronic device showing the location of components such as a dock connector and menu button in the handheld electronic device in accordance with an embodiment of the present invention.

FIG. 26 shows how dock connector 20 may have 30 pins 342 (as an example). A flange formed from metal mounting tabs 344 may be welded to the main body of dock connector 20. Screws 220 and 346 may be screwed into threads on metal mounting tabs 344 through holes in tabs 186 (FIG. 15) of bezel 14. Screw 348 may be screwed into frame 290 to secure grounding bracket 248 to the frame. Screws such as screw 348 may be screwed into portions of frame 290 that are added to frame 290 after the plastic overmolded portion of frame 290 has been formed. These added portions of frame 290 may, for example, be added using a heat staking process.

The presence of spring 246, which forms part of an antenna terminal for the hybrid PIFA/slot antenna, helps to reduce the tolerance required in connecting bezel 14 to the antenna.

Figure 27:
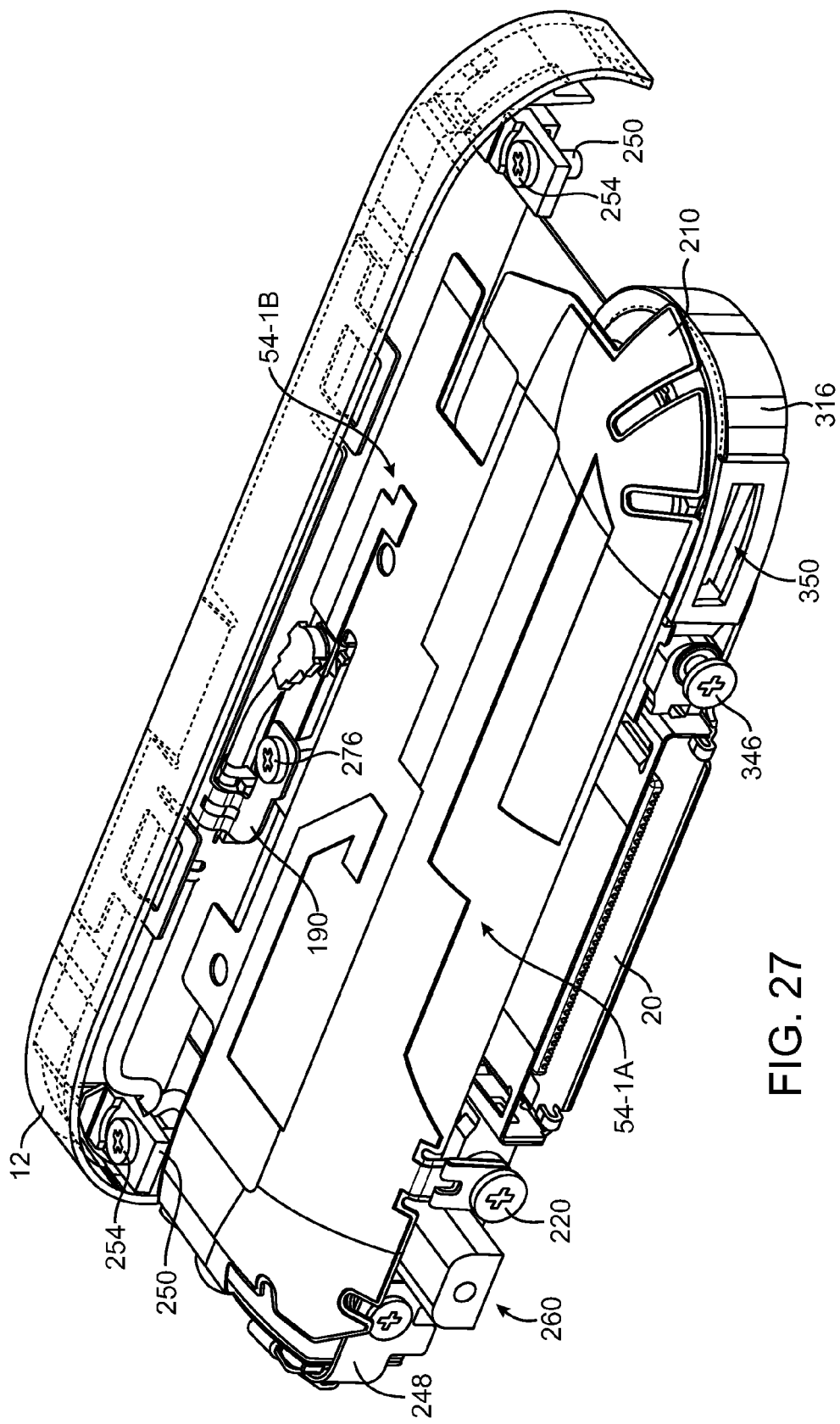
FIG. 27 is a perspective view of a portion of the interior of an illustrative handheld electronic device showing an illustrative flex circuit antenna configuration in accordance with an embodiment of the present invention.

As shown in FIG. 27, speaker 316 may have an associated port 350, through which sound may emanate during device operation. In the rear view of FIG. 27, speaker port 350 is located on the right side of housing 12 and microphone port 260 is located on the left size of housing 12. This is merely illustrative. Speaker port 350 and microphone port 260 may be located on any suitable portion of housing 12 (e.g., front face, rear face, top side, bottom side, left side, or right side). As shown in FIG. 27, screws 254 may hold housing brackets 250 to the frame. The view of FIG. 27 does not include antenna cap 102, so components such as speaker module 316 are visible beneath flex circuit 210.

Figure 28:
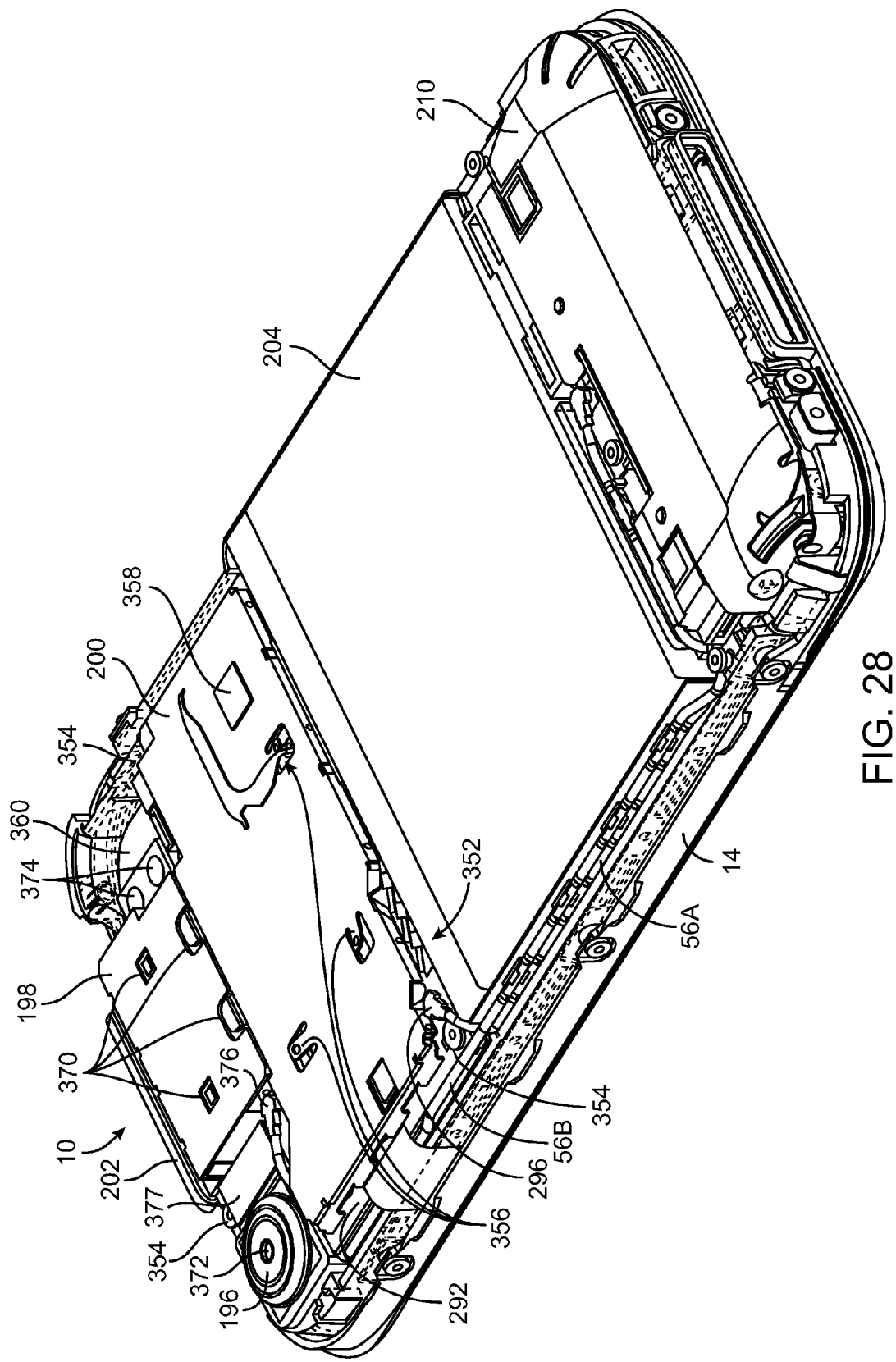
FIGS. 28 and 29 are perspective bottom views of the interior of an illustrative handheld electronic device in accordance with an embodiment of the present invention.

A perspective view of the interior of device 10 is shown in FIG. 28. Battery leads 352 may be used to convey power from battery 204 to the electronics of device 10. Leads 352 may be soldered to printed circuit boards such as printed circuit board 292. There may be any suitable number of leads 352 (e.g., ground, positive, and negative). Screws 354 may be used to screw circuit boards such as circuit board 292 to the frame of device 10.

Radio-frequency shielding (sometimes called EMI shielding) may be provided in the form of conductive cans 200 and 198. Shielding cans 200 and 198 (which are sometimes referred to as EMI enclosures, radio-frequency enclosures, or shielding housings) may be constructed from metal or other suitable conductive materials. Can 200 may be used to shield transceiver 52A (FIG. 3), whereas can 198 may be used to shield transceiver 52B (FIG. 3).

Coaxial cable 56B may be connected to the transceiver in can 198 using coaxial cable connector 376. Coaxial cable 56A may be connected to the transceiver in can 200 using coaxial cable connector 296.

A conductive foam pad such as pad 358 may be affixed to the top of can 200 to help ground can 200. When the cover of the housing of device 10 is installed, conductive foam 358 may rub against an exposed portion of the interior of the housing, thereby electrically shorting can 200 to the housing. Can 200 may also have bent up fingers 356 that rub against the housing to short can 200 to the housing. Bent up fingers 370 on can 198 may be used to short can 198 to the housing.

To ensure that fingers such as fingers 370 and 356 make good electrical contact with the housing, the portions of the housing that contact the fingers may be processed to remove any nonconductive coatings. For example, if the housing is an anodized aluminum housing that has a nonconductive anodized coating, the anodized layer may be removed by laser etching in the regions of the housing that contact fingers 370 and 356 and the regions of the housing that contact other shorting structures such as conductive foam 358. Cans 198 and 200 may be used to shield one or more layers of printed circuit board (e.g., multiple stacked printed circuit boards). These circuit boards may be used to mount integrated circuits and/or discrete components.

Camera module 196 may have a lens 372. Lens 372 may be a fixed focal length lens (as an example). Camera module 196 may be used to acquire still images and video images (e.g., video containing audio). Camera flex circuit 377 may be used to electrically connect camera module 196 to the printed circuit boards of device 10.

Recess 360 may be configured to receive components such as an audio jack and other input-output components. Holes 374 may be formed in the touch screen module of display 16 to reduce weight.

Figure 29:
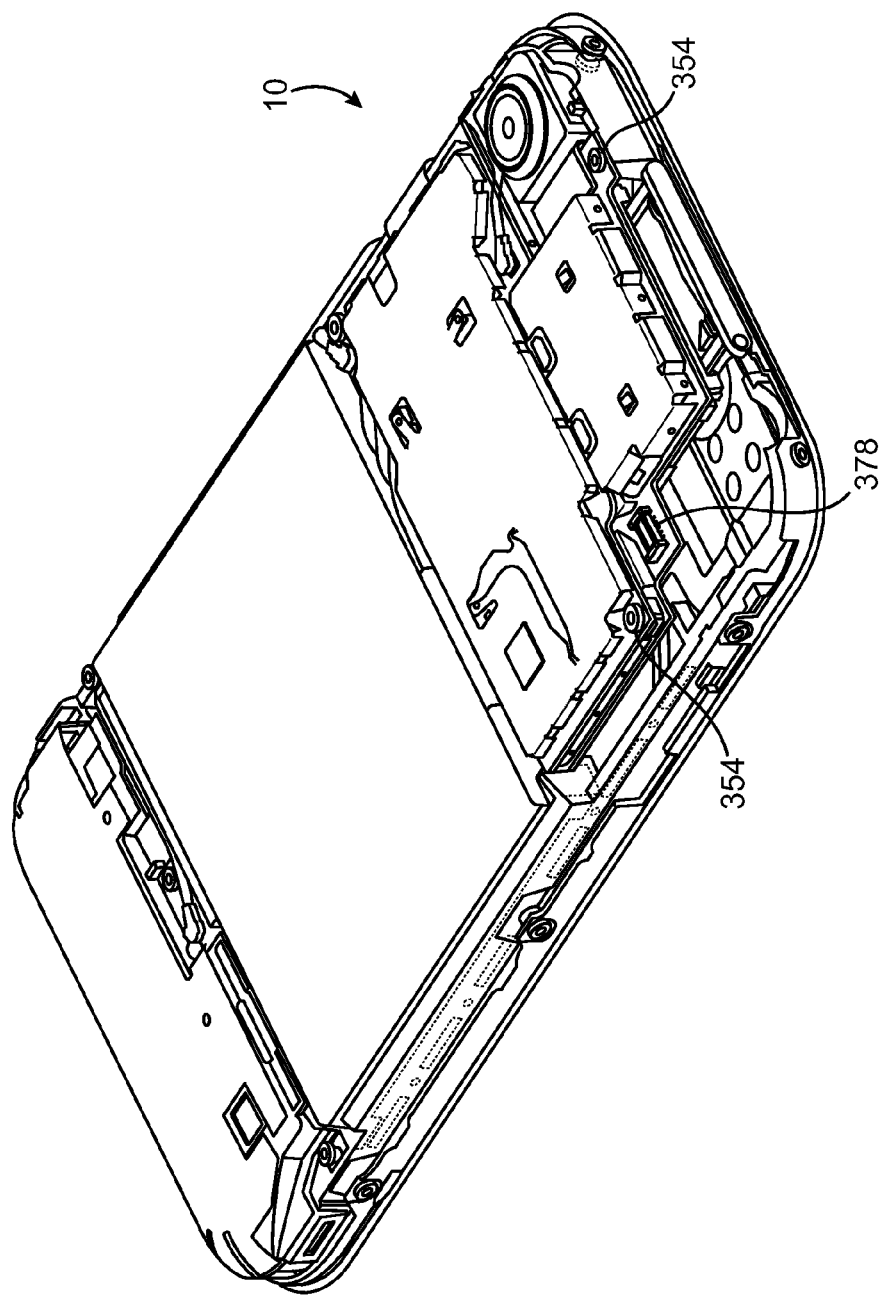

As shown in FIG. 29, device 10 may use a connector such as connector 378 to receive a flex circuit plug. The flex circuit plug and its associated flex circuit may be used to convey electrical signals to the circuitry of device 10 from components such as an audio jack, volume button, hold button, and ringer select button.

Figure 30:
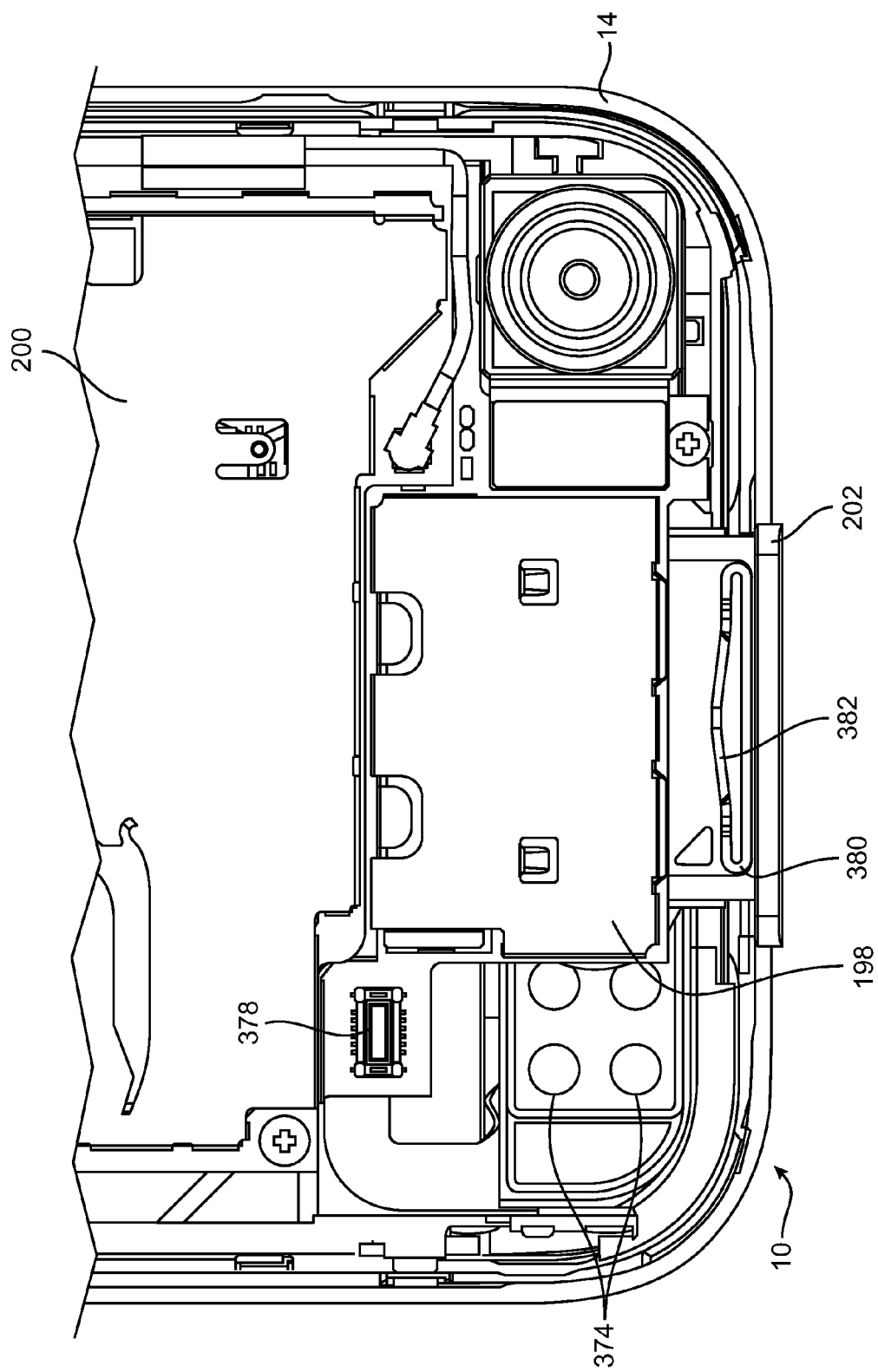
FIG. 30 is a rear view of an upper interior portion of an illustrative handheld electronic device in accordance with an embodiment of the present invention.

As shown in FIG. 30, SIM card tray 202 may have a spring 380. Spring 380 may have a bent portion 382. When compressed, bent portion 382 can press upwards (in the orientation of FIG. 30) against a SIM card to hold the SIM card in place in tray 202.

Figure 31:
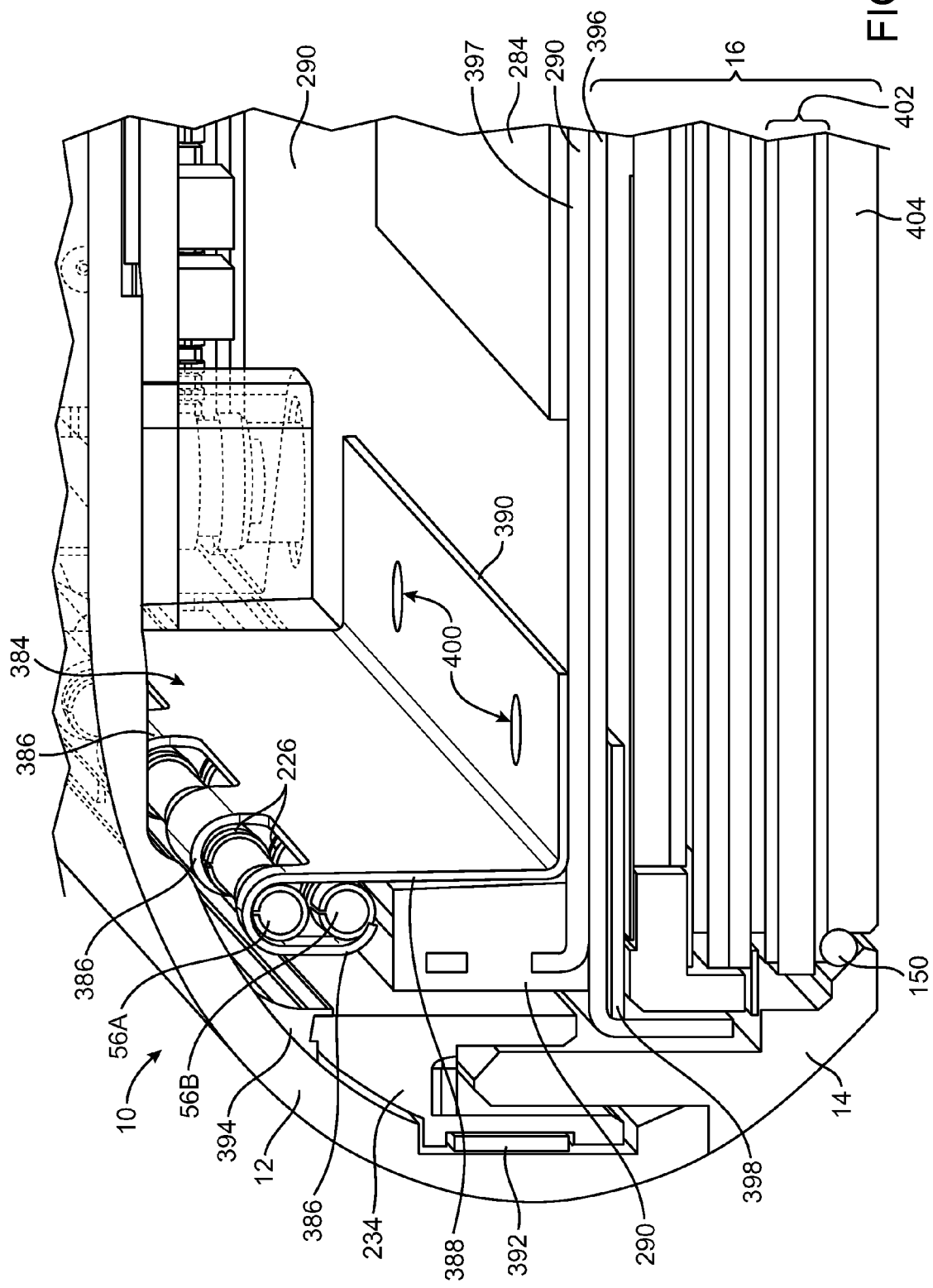
FIG. 31 is a cross-sectional view of an interior portion of an illustrative handheld electronic device showing how a spring may be used to help electrically connect a housing frame to a housing in accordance with an embodiment of the present invention.

A cross-sectional view of housing 12 is shown in FIG. 31. As shown in FIG. 31, a conductive member such as J-clip 384 may be used to secure coaxial cables 56A and 56B. J-clip 384 may be electrically connected to conductive portions of frame 290 (e.g., exposed metal portions), thereby shorting ferrules 226 (and thus the outer braid conductor of coaxial cables 56A and 56B) to frame 290 and the other portions of ground plane 54-2.

J-clip 384 may have a generally horizontal planar base member such as base member 390 and a generally vertical planar member such as vertical planar member 388. J-clip base 390 may be welded to the metal of frame 290 or may otherwise be electrically and mechanically connected to frame 290. Base 390 may have alignment holes 400. During assembly, an assembly tool with mating protrusions may engage holes 400 and hold J-clip 384 in place for welding.

J-clip 384 may have bendable extensions such as clip extensions 386. Extensions 386 may be manually crimped in place over coaxial cables 56A and 56B during assembly. If desired, extensions 386 may, at a later time, be bent backwards to release coaxial cables 56A and 56B. This releasable fastening arrangement allows for rework. For example, cables 56A and 56B can be replaced. The ability to remove cables 56A and 56B from device 10 may also be advantageous when disassembling device 10 (e.g., when recycling all or part of device 10). Extensions 386 may have any suitable shape. For example, extensions 386 may be provided in the form of relatively narrow fingers that are easy to crimp and uncrimp. Alternatively, extensions 386 may be provided in the form of relatively wider tabs. Wide tab shapes may make good electrical contact with ferrules 226, but may be harder to crimp and uncrimp than narrower extension structures.

Spring 392 may be formed from metal or other suitable springy conductive material. Spring 392 may be glued or otherwise mounted in a channel between the side wall of housing 12 and housing bracket 234. During assembly, fingers on bezel 14 engage holes on spring clip 392, thereby securing bezel 14 to housing 12.

Housing bracket 234 may be glued or otherwise affixed to housing 12. Allowable excess glue 394 is shown above bracket 234. The housing bracket that is shown in FIG. 31 is sometimes referred to as the left housing bracket of device 10. Device 10 may also have a corresponding right housing bracket.

Display 16 may be mounted to housing 12 using bezel 14 and gasket 150. Display 16 may have a planar glass element such as glass element 404 and a touch sensitive element such as touch sensitive element 402. Frame 290 may have a conductive element such as sheet metal plate 396. Sheet metal plate 396 may be electrically and mechanically connected to sheet metal plate 397 (e.g., by welding, by gluing, by using fasteners, etc.). Foam 398 may be used to help protect display 16 from shock (e.g., in the event that device 10 is dropped).

Figure 32:
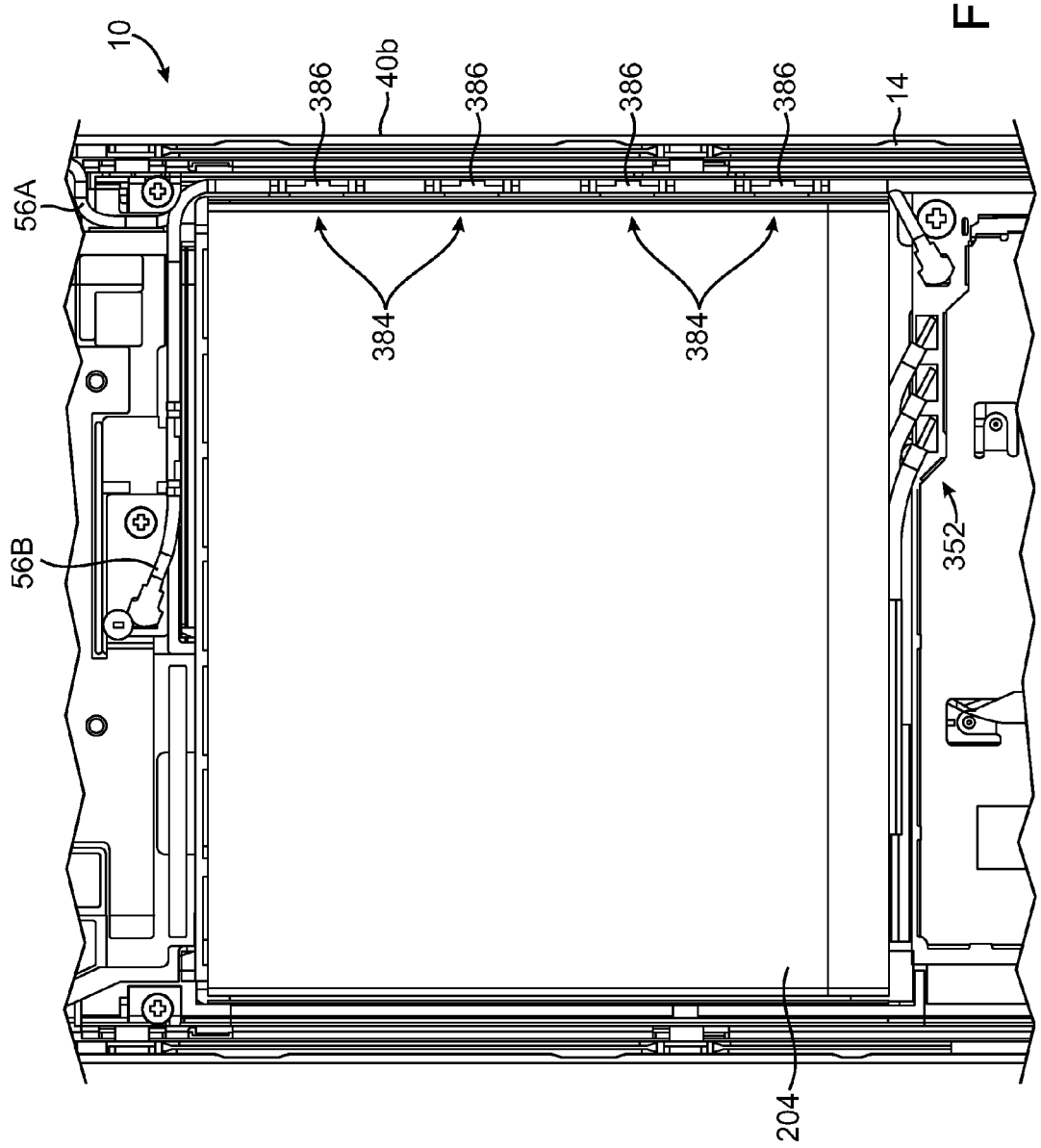
FIG. 32 is a rear view of a middle interior portion of an illustrative handheld electronic device in accordance with an embodiment of the present invention.

A top view of device 10 in the vicinity of J-clip 384 is shown in FIG. 32. As shown in the FIG. 32 example, extensions 386 may be used to crimp coaxial cables 56A and 56B at various segments along their lengths. In the example of FIG. 32, there are four sets of extensions 386 of substantially equal size that are spaced equally along edge 406 of device 12. If desired, the segments of cables that are electrically connected to extensions 386 may be of different sizes or there may be a different number of extensions 386. For example, there may be more than four extensions 386, there may be two larger extensions 386 and two smaller extensions 386, etc. There may also be only a single extension 386 along edge 406, although arrangements with more than one extension are generally easier to uncrimp when desired for rework or recycling and are therefore generally preferred.

Figure 33:
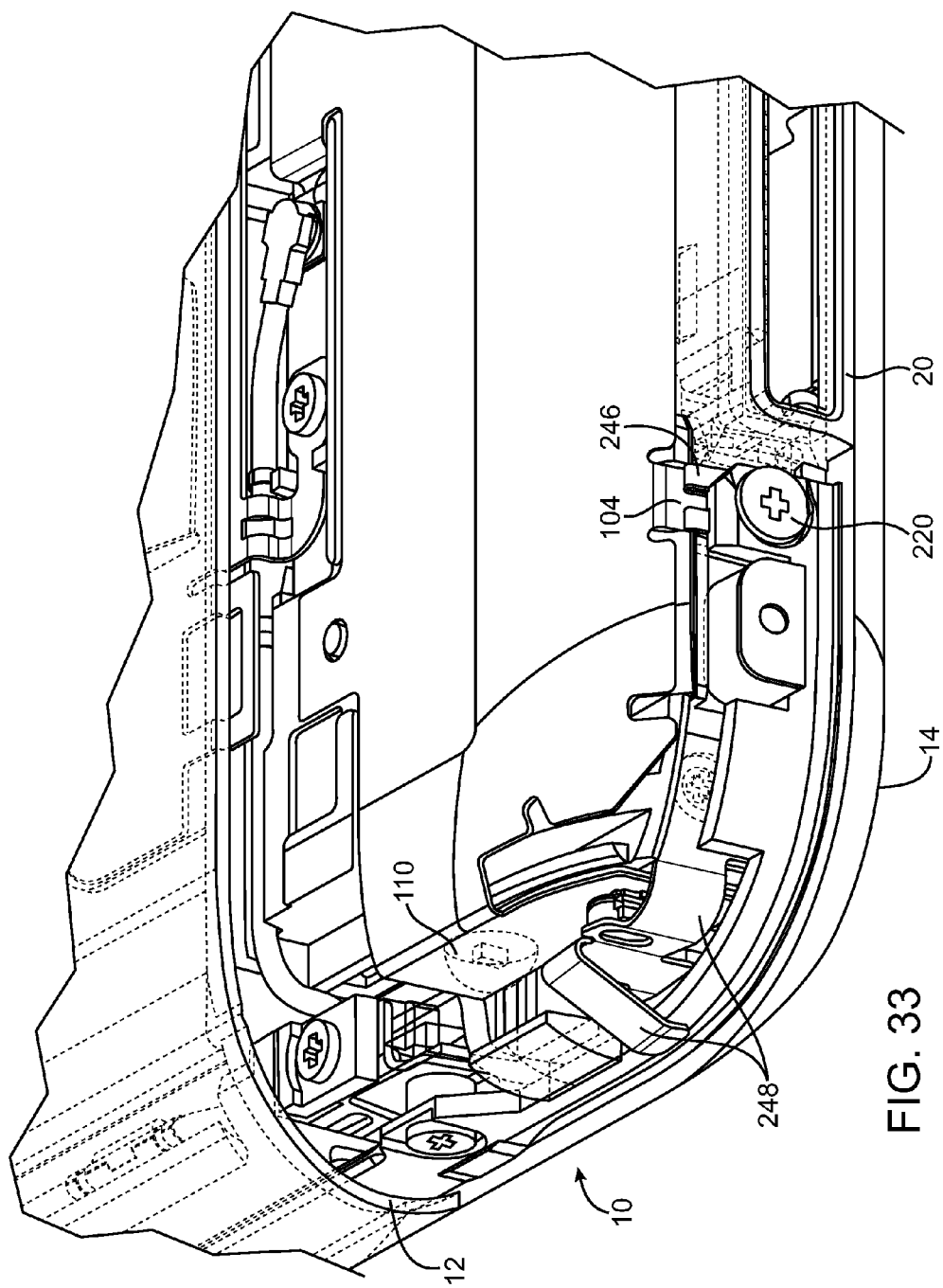
FIG. 33 is a perspective view of an end portion of an illustrative handheld electronic device in accordance with an embodiment of the present invention.

As shown in FIG. 33, grounding bracket 248 may be used to short the ground connector portion of coaxial cable connector 110 to bezel 14.

Figure 34:
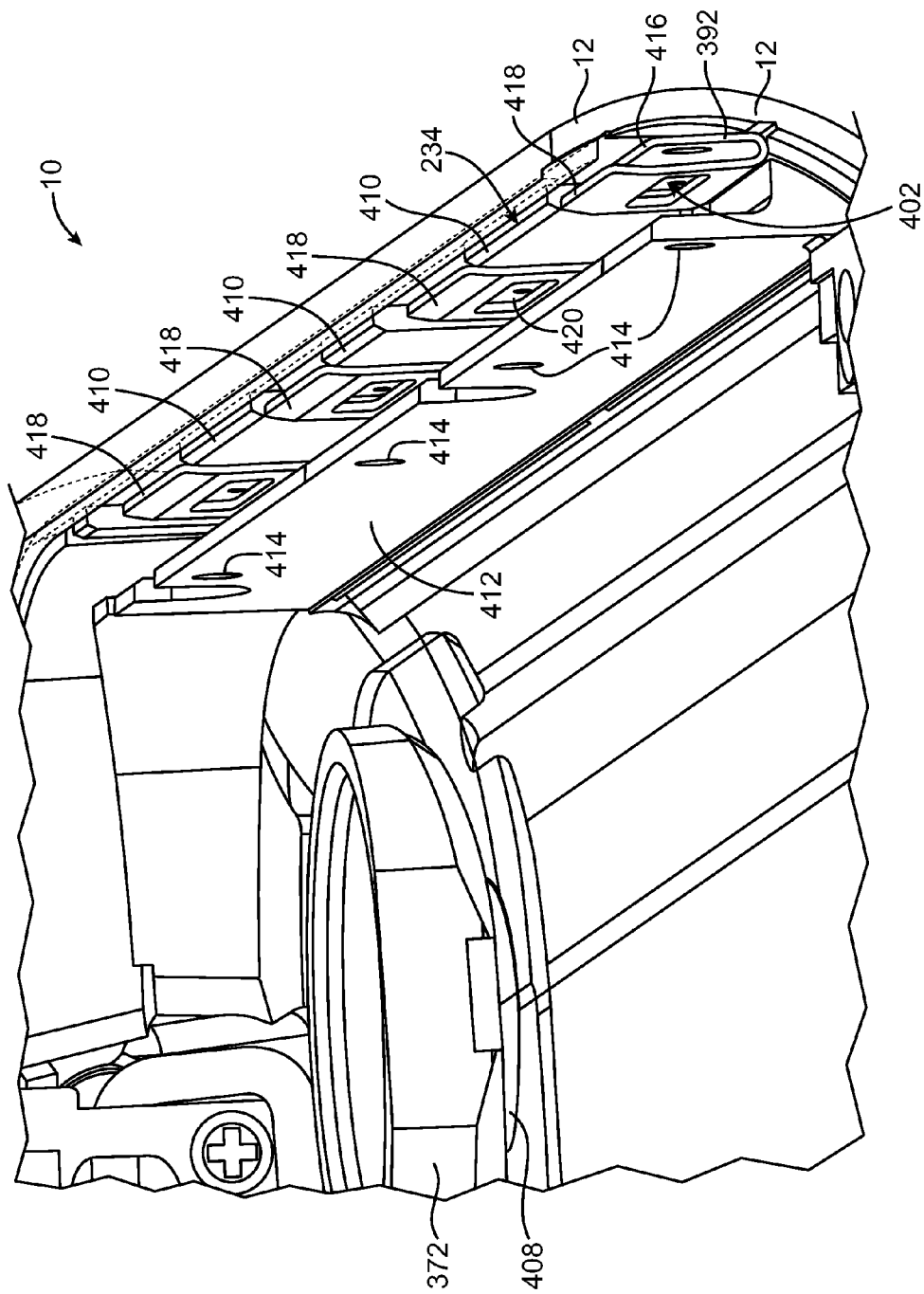
FIG. 34 is a cross-sectional view of an interior portion of an illustrative handheld electronic device in accordance with an embodiment of the present invention.

FIG. 34 shows a partially cross-sectional interior view of device 10. As shown in FIG. 34, bracket 234 may have a long, relatively uninterrupted rail portion such as rail 412 and, at intervals, may have extending fingers 410. Spring 392 may have a relatively uninterrupted rail portion 416 (mostly hidden from view in FIG. 34) and, at intervals, may have extending fingers 418. Fingers 410 of bracket 234 and fingers 418 of spring 392 may be interleaved as shown in FIG. 34. Bracket 234 may have holes 414 in rail 412. During manufacturing, an assembly tool may hold bracket 234 by engaging holes 414 with mating prongs. Spring 392 may have holes such as rectangular holes 420. Bezel 14 may have mating prongs. During assembly, the mating prongs from bezel 14 may slide into rectangular holes 420 to secure bezel 14 in place relative to housing 12 of device 10.

Figure 35:
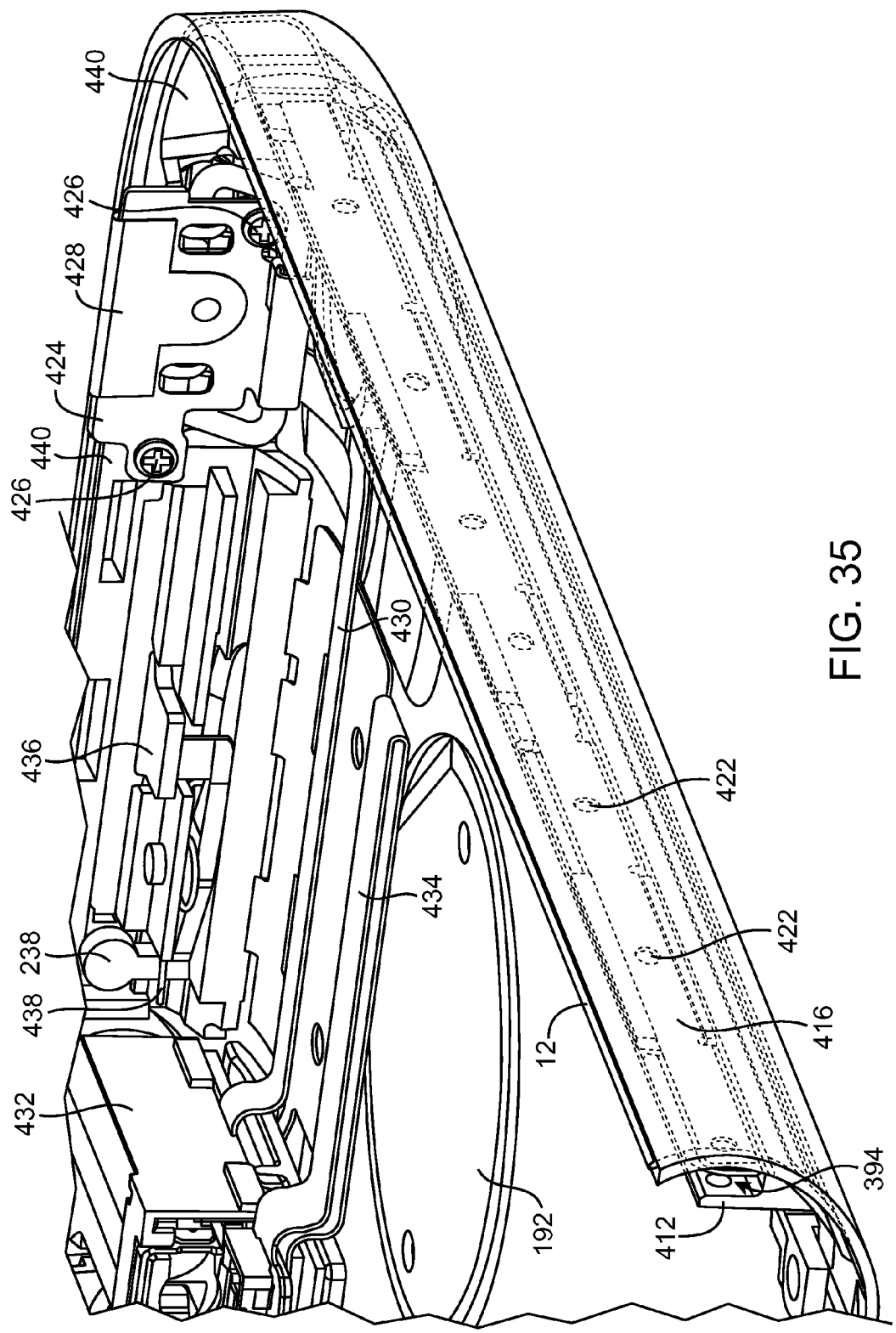
FIG. 35 is a partially cross-sectional perspective view of a middle interior portion of an illustrative handheld electronic device in accordance with an embodiment of the present invention.

As shown in FIG. 35, rail 416 of spring 394 may have alignment holes 422. During manufacturing, an assembly tool may hold spring 394 using prongs that mate with holes 422.

A bracket such as top bracket 440 (e.g., a bracket formed of a conductive material such as magnesium or aluminum) may be attached to housing 12 at the top of device 10 (e.g., using screws, glue, etc.). A bracket such as sheet metal bracket 424 may be attached to top bracket 440 using screws such as screws 426. A flex circuit for a hold button or other suitable button may be attached to bracket 424. A protective film such as polyester protective film 428 may cover the flex circuit to prevent damage. Flex circuit 436 may be used to route signals to circuitry 432 from a hold button mounted to bracket 428 (as an example). Circuitry 432 to which flex circuit 436 is routed may include jack 378 (FIG. 29).

SIM card ejector arm 436 may swing about pivot 238. Spring 438 may bias SIM card ejector arm 436, so that arm 436 may be used to eject a SIM card from device 10. Flex circuit 434 may make contact with overlapping printed circuit boards (not shown in FIG. 35).

Figure 36:
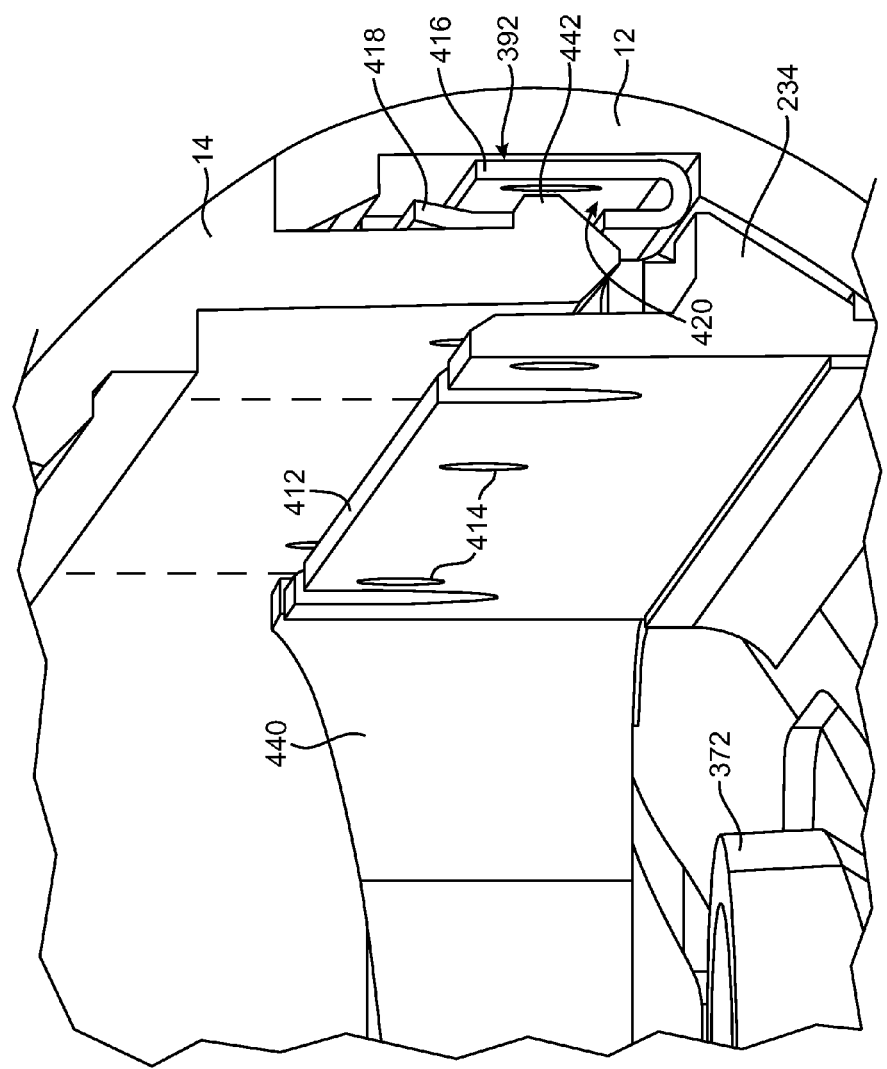
FIG. 36 is a cross-sectional view of a portion of a housing and a bezel in an illustrative handheld electronic device in accordance with an embodiment of the present invention.

A detailed cross-sectional view of bezel 14 in the vicinity of spring 392 is shown in FIG. 36. As shown in FIG. 36, bezel 14 may have extended members such as prongs 442 that mate with corresponding rectangular holes 420 in fingers 418 of spring 392. Spring 392 may be mounted between housing 12 and bracket 234, so when bezel prongs 442 protrude into spring 392, bezel 14 is held into place.

As described in connection with FIG. 14, a handheld electronic device with a conductive bezel may define a slot 70 that is roughly rectangular in shape (as an example). In a device such as the illustrative handheld electronic device described in connection with FIGS. 15-36, components that contain conductive elements may overlap with the rectangular slot that is formed by bezel 14 and the conductive portion of housing 12 and frame 290. These overlapping components may alter the shape of slot 70.

Figure 37:
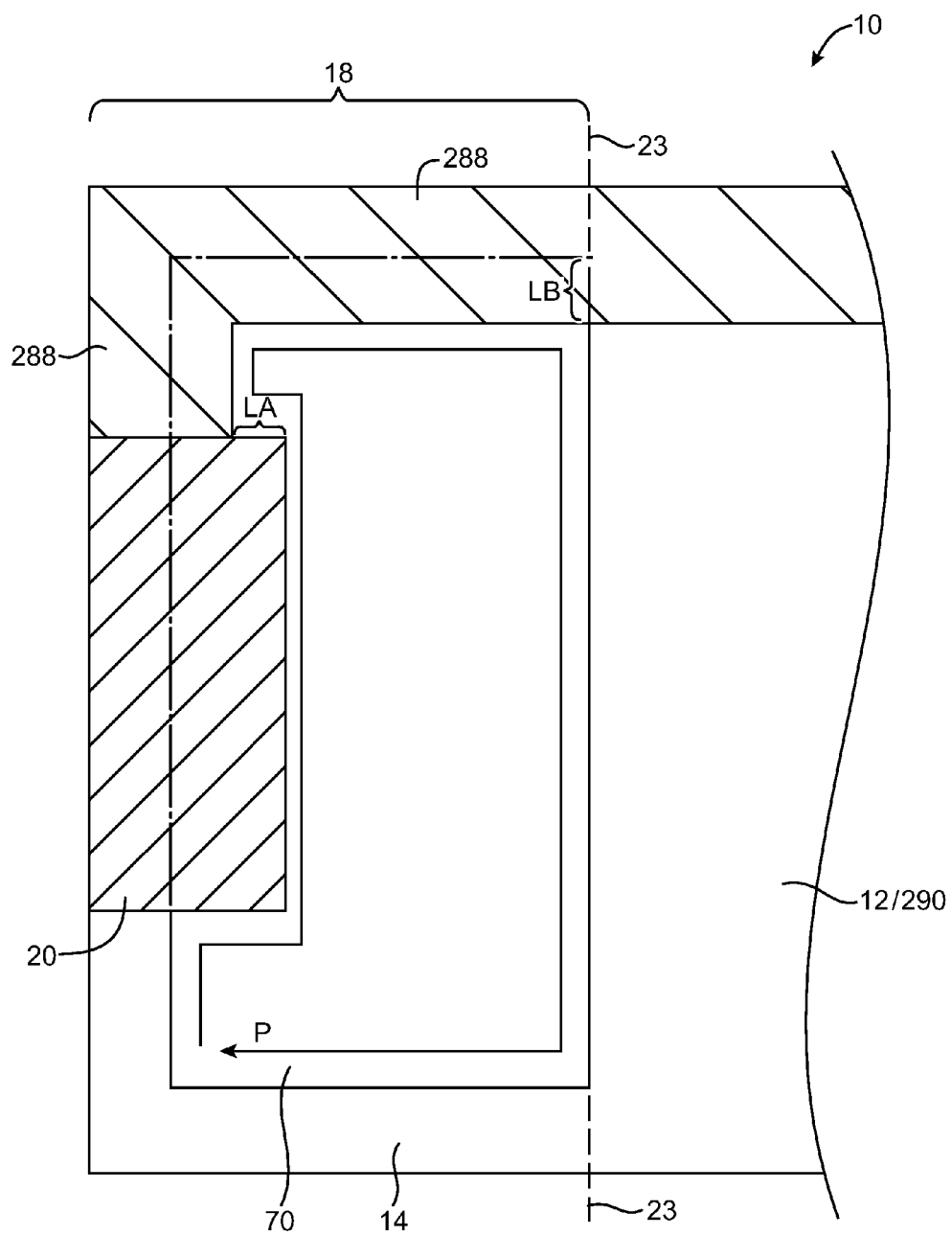
FIG. 37 is a top view of an antenna slot with overlapping electrical components in an illustrative handheld electronic device in accordance with an embodiment of the present invention.

As shown in FIG. 37, for example, in region 18 of device 10, slot 70 may have a roughly rectangular shape arising from the rectangular opening defined by bezel 14 (to the left of dotted line 23 in FIG. 37) and housing/frame 12/290 (to the right of dotted line 23). Dock connector 20, which may be formed of a conductive material such as metal (e.g., stainless steel), may be grounded to bezel 14. As a result, dock connector 20 may form part of the ground plane 54-2 for device 10. In the example of FIG. 37, dock connector 20 protrudes into the otherwise rectangular opening of slot 70, thereby altering its rectangular shape. In particular, dock connector 20 adds a length of 2LA to the interior perimeter of slot 70. Flex bus connector 288 also contains conductive elements (e.g., copper ground and signal traces). Flex connector 288 therefore also alters the shape of slot 70, resulting in a shortening of the length of perimeter P of 2LB.

As described in connection with dotted line 79 of FIG. 6, there may be a peak antenna resonance associated with slot 70. The position of the peak resonance may be determined by the length of perimeter P. In general, the peak resonance of the slot antenna portion of the antenna of device 10 is located where the radio-frequency signal wavelength is equal to the length of perimeter P. In device 10, the perimeter P of slot 70 may be determined by the size of the rectangular opening formed by bezel 14 and frame/housing 12/290 and by the modifications to this rectangular opening that arise from the presence of connector 20 and flex circuit 288. If desired, the locations and shapes of dock connector 20 and flex circuit 288 may be selected so that the perimeter length reduction (2LB) that arises from the presence of flex circuit 288 cancels out the perimeter length addition (2LA) that arises from the presence of dock connector 20 (i.e., lengths LA and LB may be substantially equal).

As shown in FIG. 25, components such as microphone 244, button 320, and speaker 316 may also overlap with slot 70. These components may be prevented from significantly altering the value of antenna slot perimeter P by using isolation circuitry. For example, inductors may be placed on the leads of microphone 244 (e.g., in circuitry 328). Similarly, inductors may be placed on the leads of speaker 316 (e.g., in circuitry 314). Inductors may also be placed on the leads of button 320 (see, e.g., components 330). At low frequencies, such as at frequencies in the kilohertz range and below, which includes the audio frequencies handled by microphone 328 and speaker 316, the inductors allow current to pass freely (i.e., the inductors act as short circuits). At radio frequencies (i.e., at 300 MHz or more, and particularly at frequencies of 850 MHz to 2.4 MHz or greater), the inductors have a large impedance and act as open circuits, thereby isolating microphone 244, speaker 316, and button 320. When microphone 244, speaker 316, and button 320 are isolated from the radio-frequency antenna signals, microphone 244, speaker 316, and button 320 do not affect the value of perimeter P for slot 70 and do not load the antenna resonating elements 54-1A and 54-1B.

The isolating inductors that are used to isolate electrical components such as microphone 244, speaker 316, and button 320 may be conventional wire-wrapped inductors or may be somewhat smaller inductors of the type that are sometimes referred to as ferrite chip inductors. An advantage of using ferrite chip inductors is that they have a small size. An advantage of using conventional wire-wrapped inductors is that they tend not to create the types of antenna losses that might arise when using ferrite chip inductors in close proximity to antenna resonating elements.

Figure 38:
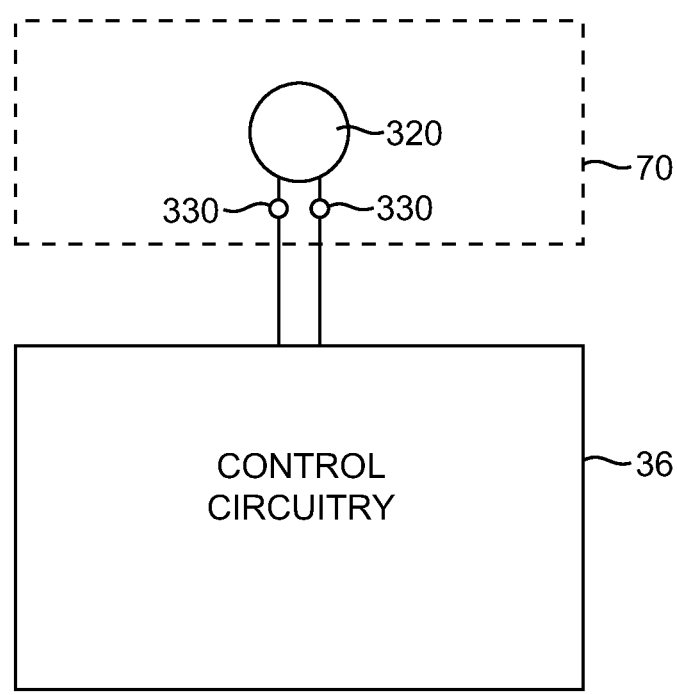
FIG. 38 is circuit diagram showing how isolation elements may be used to interconnect a menu button with control circuitry in an illustrative handheld electronic device in accordance with an embodiment of the present invention.

If desired, components such as microphone 244, speaker 316, and button 320 can be isolated using isolation elements other than inductors, such as resistors. As shown in FIG. 38, button 320 may, as an example, be isolated using isolation elements 330 (e.g., resistors). Resistors 330 may be placed on the leads of button 320 between button 320 and control circuitry 36 (e.g., where shown by components 330 in FIG. 25). In a fully assembled handheld electronic device, button 320 may overlap antenna resonating elements such as antenna resonating elements 54-1A and 54-1B (FIG. 19).

The close proximity of button 320 and the antenna resonating elements can create antenna losses. Moreover, the overlap between button 320 and antenna slot 70 can affect the shape of slot 70 and its perimeter P, potentially affecting the location of the resonant peak of the handheld device antenna. By selecting resistors 330 of sufficient size, the impact of button 320 on perimeter P can be eliminated or substantially reduced and the possibility of antenna losses due to the close proximity of button 320 and the antenna resonating elements can be eliminated or substantially reduced.

With one suitable arrangement, the values of resistors 330 may be about 3000 ohms. This value is sufficiently high to at least partially isolate button 320, while allowing direct current (DC) control signals (e.g., relatively low frequency button press signals in the kilohertz range or lower) to pass from button 320 to control circuitry 36. Although described primarily in the context of isolating menu button 320 from radio-frequency signals, resistors may be used to isolate any suitable type of electrical component that is potentially subject to radio-frequency interference (e.g., any other electrical component that overlaps slot 70 and/or antenna resonating elements such as antenna resonating elements 54-1A and 54-1B).

Figure 39:
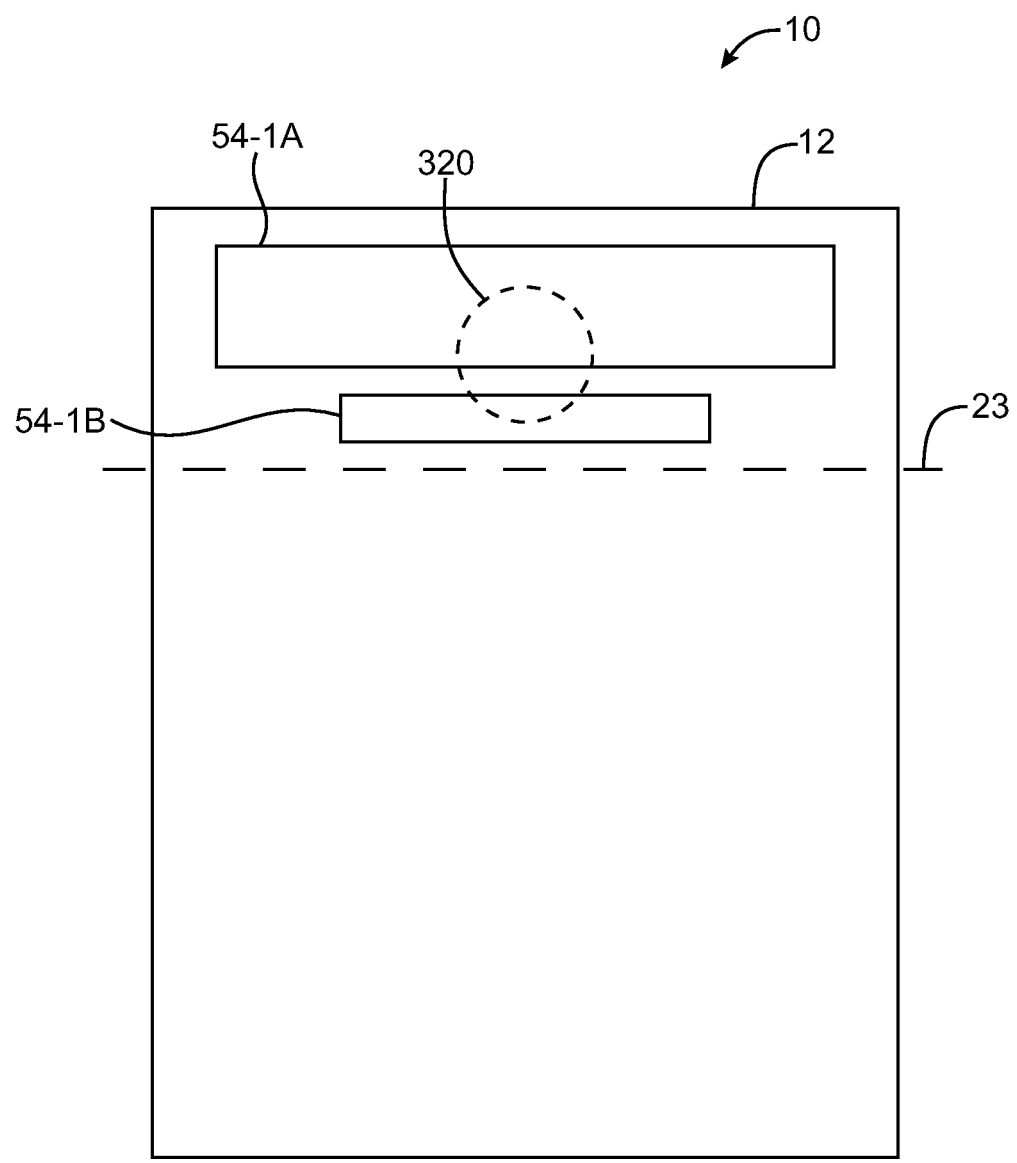
FIG. 39 is a top view of an illustrative handheld electronic device showing overlap between an electronic component and antenna resonating elements in accordance with an embodiment of the present invention.

FIG. 39 shows how an electronic component such as menu button 320 may overlap resonating elements 54-1A and 54-1B (i.e., in a top view from the front face or rear face of device 10).

Figure 40:
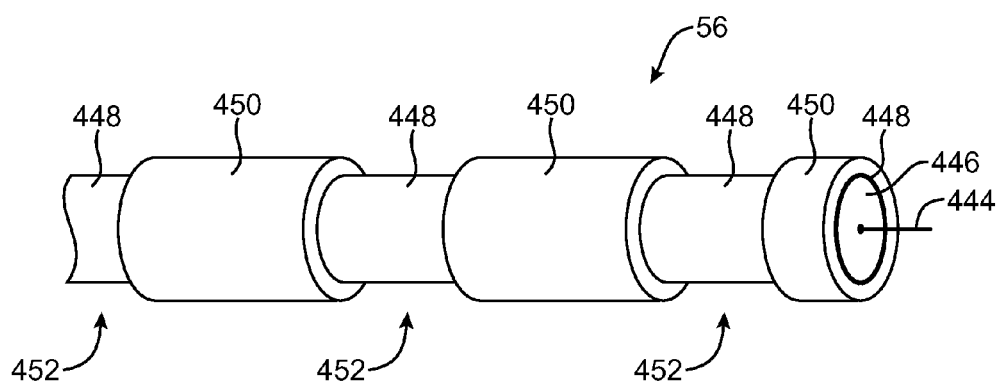
FIG. 40 is a perspective view of a section of coaxial cable with exposed segments and insulated segments in accordance with an embodiment of the present invention.

FIG. 40 shows an illustrative coaxial cable of the type that may be used for coaxial cables 56A and 56B in handheld electronic device 10. As shown in FIG. 40, cable 56 may have a center conductor 444. Dielectric layer 446 may surround center conductor 444. Ground conductor 448 may surround dielectric layer 446. Segments of insulator 450 may surround ground conductor 448 at one or more locations along the length of coaxial cable 56. Cable 56 may have one or more exposed (bare) segments of ground conductor 448 at one or more locations 452 along the length of cable 56. At least some of locations 452 may be spaced so that they are equidistant from each other. If desired, some of locations 452 may be spaced at locations that are not equidistant with respect to each other. There may be any suitable number of locations 452 (e.g., one, two, three, more than three, etc.). There may also be any suitable number of insulating segments 450 (e.g., no segments, one segment, two segments, three segments, more than three segments, etc.). Ferrules 226 or other suitable conductive fasteners may be crimped or otherwise mechanically and electrically attached to ground conductor 448 of cable 56 in locations 452. If desired, additional layers of material (e.g., insulating and conductive material) may be included in cable 56. The layers of insulator and conductor that are shown in FIG. 40 are merely illustrative.

Cables such as cable 56 of FIG. 40 with alternating exposed ground conductor and insulated segments may be formed using any suitable technique (e.g., by selectively covering a bare cable with insulating segments, by selectively stripping an insulated cable, or by using a combination of these techniques). Insulating materials that may be used in cable 56 include polytetrafluoroethylene, polyvinylchloride, etc. Conductive materials that may be used in cable 56 include copper, aluminum, metallized polyester tape, etc.

Figure 41:
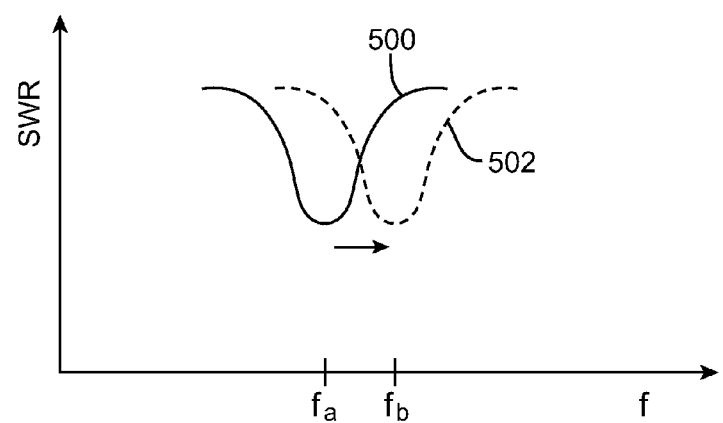
FIG. 41 is an antenna performance graph showing how the resonance peak of a handheld electronic device antenna having a ground plane with a slot can be adjusted by positioning electronic components to change the inner perimeter of the slot in accordance with an embodiment of the present invention.

An antenna performance graph showing how the resonant peak of a handheld electronic device antenna having a ground plane with a slot can be adjusted by positioning electronic components to change the inner perimeter of the slot is shown in FIG. 41. The resonant frequency peak of a communications band being handled by an antenna that contains a slot of a given inner perimeter may be $f_a$ (as an example). The inner perimeter of the slot is generally equal to about one wavelength of the radio-frequency signal. Proper operation of the antenna at frequency $f_a$ may be ensured by positioning components such as a dock connector, flex circuit, conductive housing, and conductive bezel relative to one another to achieve an inner perimeter of a desired length.

When designing an antenna to operate in another frequency band, the shape of the antenna slot and its inner perimeter can be changed accordingly. For example, if it is desired to design an antenna for operation at a frequency $f_b$ that is larger than frequency $f_a$, the inner perimeter P may be shortened. This will cause the resonant frequency of the antenna to shift from the frequency $f_a$ (solid line 500) to $f_b$ (dotted line 502), as shown in FIG. 41. One way to shorten the inner perimeter of an antenna slot in an antenna ground plane involves positioning a dock connector, flex circuit or other component(s) in device 10 so that an end of the slot is truncated (as an example). In general, any suitable adjustments may be made to the positions of the dock connector, flex circuit, bezel, conductive housing, or other conductive components in a handheld electronic device to achieve a desired slot shape and inner perimeter.

The foregoing is merely illustrative of the principles of this invention and various modifications can be made by those skilled in the art without departing from the scope and spirit of the invention.

What is claimed is:

1. A handheld electronic device, comprising:
   a radio-frequency transceiver;
   an antenna ground plane;
   an antenna resonating element that forms an antenna with the antenna ground plane;
   a coaxial cable connected between the radio-frequency transceiver and the antenna, wherein the coaxial cable has an outer ground conductor;
   a conductive fastener that is connected to the outer ground conductor;
   a metal housing that forms part of the antenna ground plane;
   a metal tab that is electrically connected to the metal housing; and
   a biasing member that presses the conductive fastener against the metal tab, wherein the biasing member comprises a spring.

2. The handheld electronic device of claim 1, wherein the biasing member comprises a resilient material.

3. The handheld electronic device of claim 2, wherein the resilient material comprises urethane.

4. The handheld electronic device of claim 1, wherein the conductive fastener comprises a ferule.

5. The handheld electronic device of claim 1, wherein the conductive fastener comprises a ferule that is crimped over the outer ground conductor.

6. The handheld electronic device of claim 1, further comprising a plurality of additional conductive fasteners that are crimped to the outer ground conductor.

7. The handheld electronic device of claim 6, further comprising:
   a conductive housing frame that forms a part of the antenna ground plane, wherein at least some of the plurality of conductive fasteners are electrically shorted to the conductive housing frame.

8. A handheld electronic device, comprising:
   a radio-frequency transceiver;
   an antenna ground plane;
   an antenna resonating element that forms an antenna with the antenna ground plane;
   a coaxial cable connected between the radio-frequency transceiver and the antenna, wherein the coaxial cable has an outer ground conductor;
   a first conductive fastener that is connected to the outer ground conductor;
   a plurality of second conductive fasteners that are connected to the outer ground conductor;
   a metal housing that forms part of the antenna ground plane;

a metal tab that is electrically connected to the metal housing;

a biasing member that presses the first conductive fastener against the metal tab; and a metal bracket that has a plurality of extensions each of which is crimped over a respective one of the second conductive fasteners.

9. The handheld electronic device defined in claim 8, wherein the conductive housing frame comprises a planar sheet of metal that is welded to the metal bracket.

10. A handheld electronic device, comprising:
a radio-frequency transceiver;
a conductive housing frame;
an antenna having an antenna ground plane formed at least partly from the conductive housing frame;
a coaxial cable coupled between the radio-frequency transceiver and the antenna, wherein the coaxial cable has an outer ground conductor;
first and second conductive fasteners connected to the outer ground conductor of the coaxial cable; and
a conductive member that mechanically and electrically connects the first conductive fastener to the conductive housing frame;
a metal tab that is electrically connected to the conductive housing frame; and
a biasing member that presses the second conductive fastener against the metal tab, wherein the biasing member comprises a spring.

11. The handheld electronic device defined in claim 10, wherein the conductive member is welded to the conductive housing frame.

12. The handheld electronic device defined in claim 10, wherein the conductive member is crimped to the conductive fastener.

13. The handheld electronic device defined in claim 10, wherein the coaxial cable has a first coaxial cable connector that is connected to the radio-frequency transceiver and a second coaxial cable connector that is connected to the antenna.

14. The handheld electronic device defined in claim 10, wherein the first conductive fastener comprises a ferrule that is crimped to the outer ground conductor.

15. The handheld electronic device defined in claim 10, further comprising a plurality of additional conductive fasteners connected to the outer ground conductor of the coaxial cable.

16. The handheld electronic device defined in claim 15, wherein the first conductive fastener and the plurality of additional conductive fasteners comprise ferrules that are crimped to the outer ground conductor.

17. The handheld electronic device defined in claim 16, wherein the conductive member comprises a metal bracket having fingers that are bent over the ferrules.

18. Apparatus, comprising:
a coaxial cable having a ground conductor;
a conductive electronic device housing structure;
a plurality of ferrules crimped over the coaxial cable that are electrically connected to the ground conductor; and
a metal member connected to the conductive electronic device housing structure and having integral extensions that are connected to the ferrules;
a conductive fastener that is connected to the outer ground conductor;
a metal tab that is electrically connected to the conductive electronic device housing structure; and
a biasing member that presses the conductive fastener against the metal tab, wherein the biasing member comprises a spring.

19. The apparatus defined in claim 18, wherein the metal member is welded to the electronic device housing structure.

20. The apparatus defined in claim 18, wherein the metal member has extensions that are crimped over the ferrules.

\* \* \* \* \*